United States Patent
Horii et al.

(10) Patent No.: US 8,871,559 B2
(45) Date of Patent: Oct. 28, 2014

(54) METHODS FOR FABRICATING PHASE CHANGE MEMORY DEVICES

(75) Inventors: Hideki Horii, Seoul (KR); Hyun-Suk Kwon, Seoul (KR); Hyeyoung Park, Seongnam-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 493 days.

(21) Appl. No.: 13/154,631

(22) Filed: Jun. 7, 2011

(65) Prior Publication Data
US 2011/0300685 A1 Dec. 8, 2011

(30) Foreign Application Priority Data

Jun. 6, 2010 (KR) .................... 10-2010-0055097

(51) Int. Cl.
*H01L 21/00* (2006.01)
*H01L 45/00* (2006.01)
*H01L 27/24* (2006.01)

(52) U.S. Cl.
CPC ........ *H01L 27/2409* (2013.01); *H01L 45/1691* (2013.01); *H01L 45/141* (2013.01); *H01L 45/1683* (2013.01); *H01L 45/124* (2013.01); *H01L 45/144* (2013.01); *H01L 45/126* (2013.01); *H01L 27/2463* (2013.01); *H01L 45/06* (2013.01); *H01L 45/1233* (2013.01)
USPC .............................. 438/95; 438/253; 438/396

(58) Field of Classification Search
CPC ... H01L 45/06; H01L 45/144; H01L 45/1233; H01L 45/126; H01L 27/2463; H01L 45/148; H01L 45/1683; H01L 27/2436; H01L 27/2409; H01L 45/1675; H01L 45/16; H01L 45/1691; H01L 45/143; H01L 45/124
USPC .......................................................... 438/95
See application file for complete search history.

(56) References Cited

U.S. PATENT DOCUMENTS

| 2009/0271758 | A1* | 10/2009 | Wells .............................. 716/19 |
| 2010/0127234 | A1* | 5/2010 | Park .................................. 257/4 |
| 2010/0200830 | A1* | 8/2010 | Liu et al. .......................... 257/4 |
| 2010/0252831 | A1* | 10/2010 | Park ................................ 257/49 |

FOREIGN PATENT DOCUMENTS

| KR | 1020070090816 A | 9/2007 |
| KR | 100782496 B1 | 11/2007 |
| KR | 1020080099521 A | 11/2008 |
| WO | WO03021693 A2 | 3/2003 |

* cited by examiner

*Primary Examiner* — H Tsai
(74) *Attorney, Agent, or Firm* — F. Chau & Associates, LLC

(57) ABSTRACT

Provided is a method for fabricating a phase change memory device. The method includes forming a plurality of bottom electrodes on a substrate, forming a first mold layer on the substrate to extend in a first direction where the bottom electrodes are exposed, forming a second mold layer on the substrate, the second mold layer extending in a second direction orthogonal to the first direction to expose parts of the bottom electrodes, forming a phase change material layer on the first and second mold layers to be connected to parts of the bottom electrodes dividing the phase change material layer as a plurality of phase change layers respectively connected to the parts of the bottom electrodes and forming a plurality of top electrodes on the phase change layers.

22 Claims, 65 Drawing Sheets

METHODS FOR FABRICATING PHASE CHANGE MEMORY DEVICES

CROSS-REFERENCE TO RELATED APPLICATIONS

This U.S. non-provisional patent application claims priority under 35 U.S.C. §119 to Korean Patent Application No. 10-2010-0055097, filed on Jun. 10, 2010, the disclosure of which is hereby incorporated by reference herein in it's entirety.

BACKGROUND

1. Technical Field

The present disclosure herein relates to methods for fabricating semiconductor memory devices and, more particularly, to methods for fabricating phase change memory devices.

2. Description of Related Art

With the recent trends toward higher integration of semiconductor devices, memory cells are increasing in number and decreasing in size. Accordingly, wordlines and bitlines connected to the memory cells are increasing in length and number, which may lead to an increase in wordline and bitline capacitances. As a result, semiconductor memory devices may encounter a limitation in achieving high speed and low power consumption.

As an approach to realize higher performance and lower power consumption, next-generation memory devices are being manufactured that do not have refresh operations, in contrast to semiconductor memory devices such as volatile, dynamic random access memory (DRAM). An example of such a next-generation memory device is a phase change random access memory (PRAM), which uses phase change material. Accordingly, there is a need for process development which makes it possible to fabricate phase change memory devices with beneficial electrical characteristics and increased process margin.

SUMMARY

Embodiments of the inventive concept provide methods for fabricating a phase change material layer.

According to an aspect of the inventive concept, the method may include forming a plurality of bottom electrodes on a substrate, forming a first mold layer on the substrate to extend in a first direction where the bottom electrodes are exposed, forming a second mold layer on the substrate, the second mold layer extending in a second direction orthogonal to the first direction to expose parts of the bottom electrodes, forming a phase change material layer on the first and second mold layers to be connected to parts of the bottom electrodes, dividing the phase change material layer into a plurality of phase change layers respectively connected to the parts of the bottom electrodes and forming a plurality of top electrodes on the phase change layers.

In one example embodiment, the forming of the first mold layer may include forming a first insulating material layer on the substrate and patterning the first insulating material layer to form a first trench extending in the first direction to expose the bottom electrode. The first trench may expose a plurality of bottom electrodes arranged in the first direction.

In one example embodiment, the foaming of the first insulating material layer may include depositing silicon oxide (SiOx), silicon nitride (SiN), silicon oxynitride (SiON), silicon carbon nitrogen (SiCN), silicon carbon (SiC), carbon (C), titanium oxide (TiO), zirconium oxide (ZrOx), magnesium oxide (MgOx), hafnium oxide (HfOx), aluminum oxide (AlO$_x$) or a combination thereof on the substrate.

In one example embodiment, the forming of the second mold layer may include forming a second insulating material layer on the substrate; and patterning the second insulating material layer to form a second trench extending in the second direction to expose parts of the bottom electrodes. The second trench may pass through the first mold layer and expose parts of a plurality of bottom electrodes arranged in the second direction.

In one example embodiment, the forming of the second insulating material layer may include depositing atomic layer deposition (ALD) SiO$_2$, TEOS (Tetra Ethyl Ortho Silicate) SiO$_2$, USG (Undoped Silicon Glass) SiO$_2$, PSG (P doped Silicon Glass) SiO$_2$, HDP (High Density Plasma) SiO$_2$, SOG (Silicon On Glass) SiO$_2$, PE (Plasma Enhanced) CVD SiO$_2$, PE (Plasma Enhanced) SiON, PE (Plasma Enhanced) SiN, FOx (Flowable oxide), PEOx (Polyethylene Oxide) or a combination thereof on the substrate where the first mold layer is formed.

In one example embodiment, the second mold layer may have a greater height than a height of the first mold layer.

In one example embodiment, the forming of the phase change material layer may include depositing a phase change material on the first and second mold layers to fill the first and second trenches with the phase change material. The phase change material layer may have a continuous shape on the first and second mold layer without separation.

In one example embodiment, the forming of the phase change material layers may include forming the phase change material layer having a continuous shape as a plurality of separated first phase change material patterns to respectively correspond to the bottom electrodes and partially removing the first phase change material patterns to form the phase change layers in a recessed shape in the first and second trenches.

In one example embodiment, the forming of the first phase change material patterns may include planarizing the phase change material layer and the second mold layer down to a top surface of the first mold layer to divide the phase change material layer into the first phase change material patterns.

In one example embodiment, the forming of the top electrodes may include depositing a conductive material layer on the first mold layer and the planarized second mold layer; and patterning the conductive material layer to form the top electrodes on the recessed phase change layers in a self-aligned fashion.

In one example embodiment, the forming of the phase change layers may include planarizing the phase change material layer having a continuous shape to form a plurality of first phase change material patterns which is separated in the first direction but has a shape of line continuously extending in the second direction; and partially removing the first phase change material patterns to be divided into a plurality of first phase change material patterns corresponding to the bottom electrodes in one-to-one correspondence and to foam a plurality of phase change layers recessed in the second trench.

In one example embodiment, the forming of the first phase change material patterns may include planarizing the phase change material down to a top surface of the second mold layer without exposure of the first mold layer to divide the phase change material layer into the second phase change material patterns.

In one example embodiment, the forming of the top electrodes may include depositing a conductive material layer on the first and second mold layers; and patterning the conductive material layer to form the top electrodes on the recessed phase change layers in a self-aligned fashion. The top electrodes may be formed in the shape of line connected to a plurality of phase change layers arranged in the second direction.

In one example embodiment, before forming the first mold layer, the method may further include forming an etch-stop layer on the substrate. When the second trench is formed, of the etch-stop layer, portions formed at lower portions of the first and second trenches are removed to expose the parts of the bottom electrodes through the first and second trenches.

In one example embodiment, the method may further include forming a spacer on an inner wall of at least one of the first and second trenches.

In one example embodiment, at least one of the first and second trenches may be formed to have a wide top and a narrow bottom surface.

According to another aspect of the inventive concept, the method may include forming a plurality of bottom electrodes on a substrate, forming an isolation mold layer on the substrate to extend in parallel with the bottom electrodes, forming a plurality of trenches to pass through the isolation mold layer and selectively expose parts of the bottom electrodes, forming a phase change material pattern to fill the trenches, the phase change material pattern extending in the first direction to be connected to the parts of the bottom electrodes, dividing the phase change material pattern to form a plurality of phase change layers corresponding to the bottom electrodes in one-to-one correspondence and forming a plurality of top electrodes on the phase change layers in a self-aligned fashion.

In one example embodiment, the forming of the trenches may include forming a phase change mold layer on the substrate to pass through the isolation mold layer and extend in a second direction orthogonal to the first direction and patterning the phase change mold layer to form the trenches extending in the second direction.

In one example embodiment, the forming of the phase change layers may include depositing a phase change material layer on the isolation mold layer and the phase change mold layer to fill the trench and planarizing the phase change material layer such that each of the phase change layers has a recessed shape to be lower than the mold layer.

In one example embodiment, the forming of the bottom electrodes may include planarizing the phase change material layer to form the phase change layers, recessing the phase change layers to form recessed regions at the trenches and forming the top electrodes at the recessed regions. The top electrodes may be formed in the shape of island corresponding to the phase change layers in one-to-one correspondence or in the shape of a plurality of lines extending in the second direction.

According to an aspect of the inventive concept, a method for fabricating a phase change memory device may include forming a first interlayer dielectric on a semiconductor substrate having a plurality of wordlines formed thereon, forming a plurality of through holes in the first interlayer dielectric exposing the word lines; forming diodes on each of the word lines and contact plugs on each of the diodes in each of the through holes of the first interlayer dielectric, forming a first insulating layer having a first opening on the first interlayer dielectric to expose the contact plugs, sequentially forming a conductive layer and a second insulating layer on the first insulating layer, patterning the conductive layer to form a spacer electrode having an L-shape or a step shape which contacts a portion of the contact plugs and performing a trim pattern process on a the spacer electrode to form a plurality of bottom electrodes having a linear plane defined on the diodes and an L-shape or a stepped shaped section connected to about half a top surface of the contact plugs and forming a plurality of openings between the bottom electrodes exposing the first insulating layer. The method further includes filling the openings between the bottom electrodes with an insulating material to form a third insulating layer between the plurality of bottom electrodes, forming an etch stop layer on the first, second and third insulating layers and the bottom electrodes, forming a first mold layer in between the bottom electrodes in the shape of a line and including a first trench formed therein and extending in a first direction, forming a second mold layer on the semiconductor substrate crossing the first mold layer and including a second trench formed therein which exposes the bottom electrodes and extending in a second direction orthogonal to the first direction, conformally forming phase change material layers along profiles of the first trench and the second trench, depositing a gap-fill insulating layer on the phase change material layers, planarizing the phase change material layers and the gap-fill insulating layer to form planarized a plurality of phase change material patterns, recessing the phase change material patterns to form phase change layers having a U-shape and recessed regions at the first and second trenches and forming top electrodes at the recessed regions in a self-aligned fashion with respect to the phase change layers having a U-Shape.

BRIEF DESCRIPTION OF THE DRAWINGS

Exemplary embodiments of the inventive concept will become more apparent in view of the attached drawings and accompanying detailed description. The embodiments depicted therein are provided by way of example, not by way of limitation, wherein like reference numerals refer to the same or similar elements.

FIGS. 2A to 11A are top plan views illustrating a method for fabricating a phase change memory device according to an embodiment of the inventive concept.

FIG. 2B to 11B are cross-sectional views taken along the lines X-X' in FIGS. 2A to 11A, respectively.

FIG. 2C to 11C are cross-sectional views taken along the lines Y-Y' in FIGS. 2A to 11A, respectively.

FIGS. 12A to 15A are top plan views illustrating a modified embodiment of a method for forming a bottom electrode in a method for fabricating a phase change memory device according to an embodiment of the inventive concept.

FIG. 12B to 15B are cross-sectional views taken along the lines X-X' in FIGS. 12A to 15A, respectively.

FIGS. 12C to 15C are cross-sectional views taken along the lines Y-Y' in FIGS. 12A to 15A, respectively.

FIGS. 16A to 18A are top plan views illustrating a modified embodiment of a method for forming a phase change layer in a method for fabricating a phase change memory device according to an embodiment of the inventive concept.

FIGS. 16B to 18B are cross-sectional views taken along the lines X-X' in FIGS. 16A to 18A, respectively.

FIGS. 16C to 18C are cross-sectional views taken along the lines Y-Y' in FIGS. 16A to 18A, respectively.

FIGS. 19A to 21A are top plan views illustrating another modified embodiment of a method for forming a phase change layer in a method for fabricating a phase change memory device according to an embodiment of the inventive concept.

FIGS. 19B to 21B are cross-sectional views taken along the lines X-X' in FIGS. 19A to 21A, respectively.

FIGS. 19C to 21C are cross-sectional views taken along the lines Y-Y' in FIGS. 19A to 21A, respectively.

FIGS. 22A to 25A are top plan views illustrating another modified embodiment of a method for forming a phase change layer in a method for fabricating a phase change memory device according to an embodiment of the inventive concept.

FIGS. 22B to 25B are cross-sectional views taken along the lines X-X' in FIGS. 22A to 25A, respectively.

FIGS. 22C to 25C are cross-sectional views taken along the lines Y-Y' in FIGS. 22A to 25A, respectively.

FIGS. 26A to 33A are top plan views illustrating a method for fabricating a phase change memory device according to an embodiment of the inventive concept.

FIGS. 26B to 33B are cross-sectional views taken along the lines X-X' in FIGS. 26A to 33A, respectively.

FIGS. 26C to 33C are cross-sectional views taken along the lines Y-Y' in FIGS. 26A to 33A, respectively.

DETAILED DESCRIPTION OF EXEMPLARY EMBODIMENTS

The inventive concept will now be described more fully hereinafter with reference to the accompanying drawings, in which preferred embodiments of the inventive concept are shown. However, exemplary embodiments of the inventive concept may be embodied in many different forms and should not be construed as limited to the embodiments set forth herein. It will also be understood that when a layer is referred to as being "on" another layer or substrate, it can be directly on the other layer or substrate, or intervening layers may also be present. Like numbers refer to like elements throughout.]

Figure 1A:
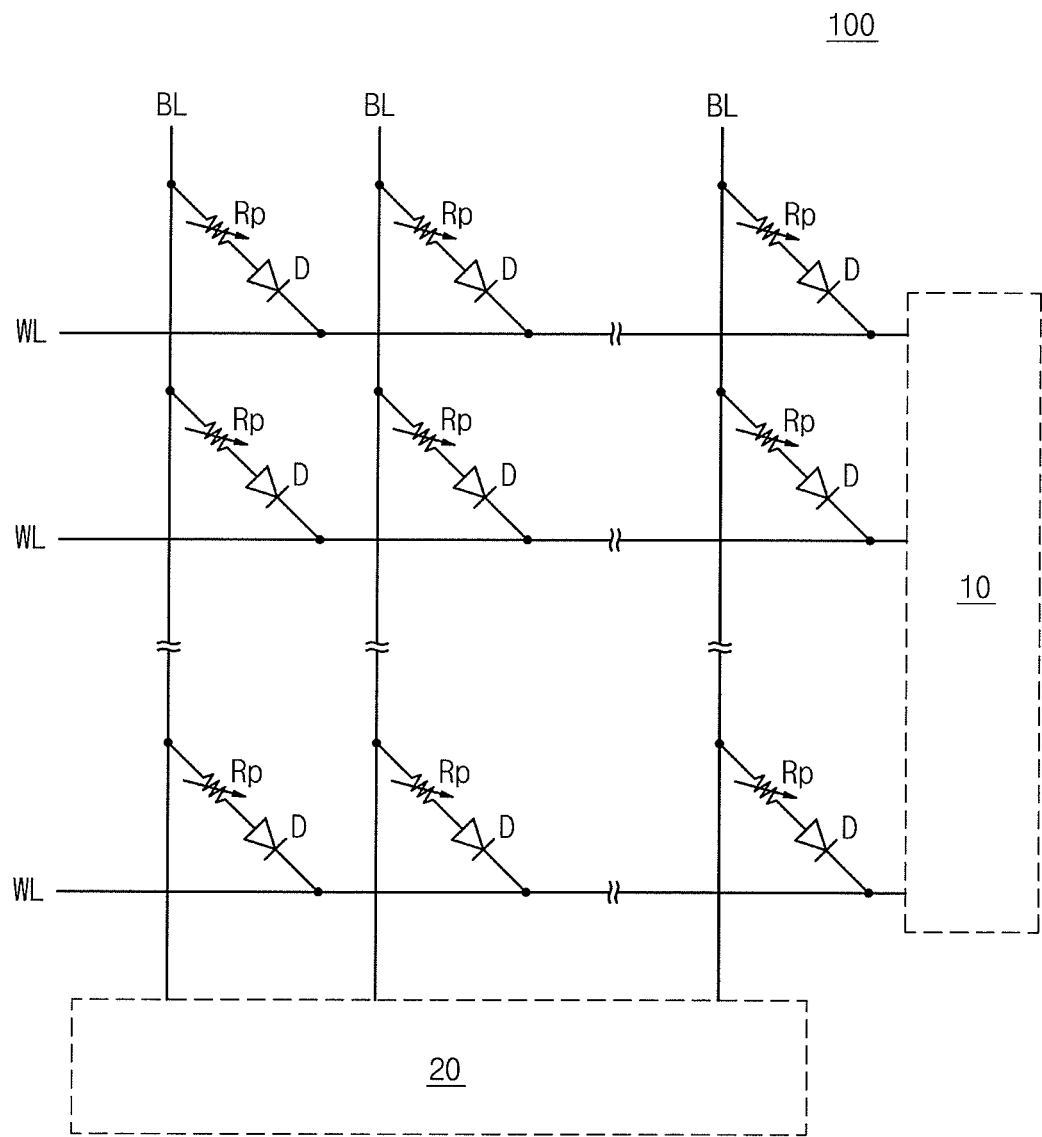
FIG. 1A is an equivalent circuit diagram of a memory cell array in a phase change memory device according to an embodiment of the inventive concept.
Figure 1B:
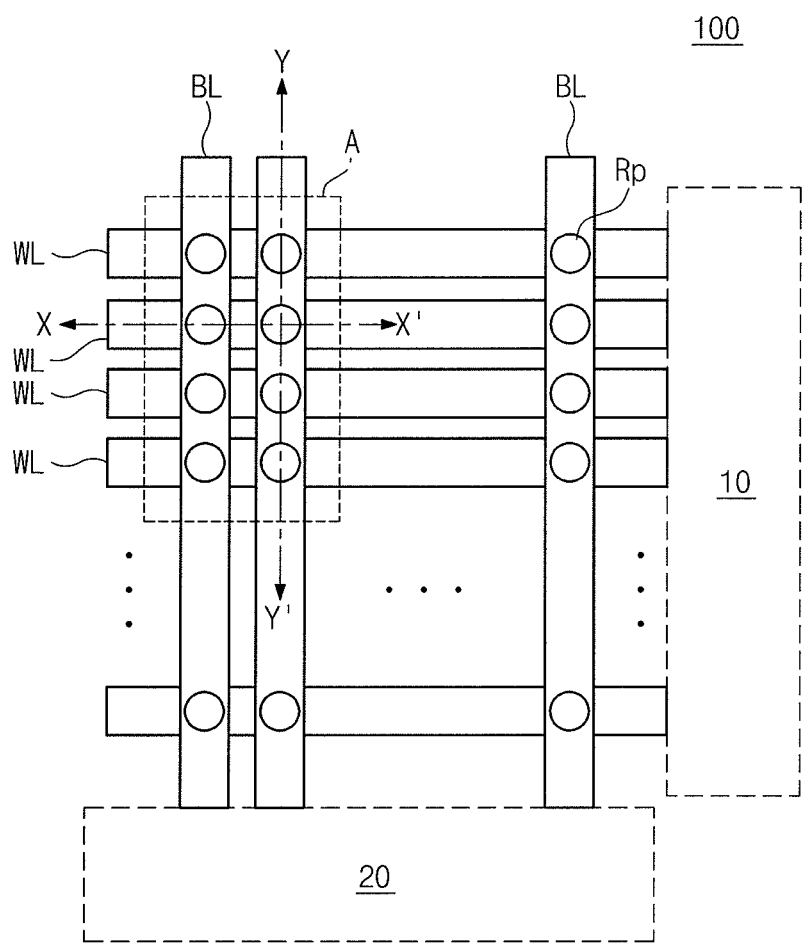
FIG. 1B is a top plan view of a memory cell array corresponding to the equivalent circuit diagram in FIG. 1A.

FIG. 1A is an equivalent circuit diagram of a memory cell array in a phase change memory device according to an embodiment of the inventive concept, and FIG. 1B is a top plan view of a memory cell array corresponding to the equivalent circuit diagram in FIG. 1A.

Referring to FIGS. 1A and 1B, a phase change memory device 100 may include a plurality of bitlines BL, a plurality of wordlines WL which are substantially perpendicular to the bitlines BL, and memory cells defined at the intersections of the bitlines BL and the wordlines WL. The memory cell may include a variable resistor Rp as a memory element. The variable resistor Rp may include a material whose crystalline state may be reversely changed by an applied signal, e.g., an electrical signal such as, for example, voltage or current, an optical signal or radiation.

The variable resistor Rp may include a phase change material that changes crystalline structure thereof depending on the provided heat. The phase change material may be, for example, a chalcogenide compound containing germanium (Ge), antimony (Sb), and tellurium (Te) (i.e., GST or Ge—Sb—Te). The phase change material is useful in semiconductor memory devices because the phase thereof may be rapidly changed to an amorphous state or a crystalline state by temperature. The phase change material has a high resistance in an amorphous state, and has a low resistance in a crystalline state, whereby the amorphous state of the phase change material is defined as a 'RESET' or logic '1' state, and the crystalline state is defined as a "SET" or logic '0' state. However, the states may be defined vice-versa when applied to semiconductor memory devices.

One end of the variable resistor Rp is connected to the bitline BL, and the other end thereof is connected to the wordline WL through a select device such as a diode or a transistor. That is, a diode or a transistor may be used as a select device to select the variable resistor Rp, although the select device is not limited to a diode or a transistor. According to an example embodiment of the inventive concept, a diode (D) may be adopted as the select device.

The phase change memory device 100 may include peripheral regions 10 and 20 where peripheral circuits are disposed. The peripheral circuit is electrically connected to a memory cell to take charge of input/output of an electrical signal required for an operation of the memory cell. For example, the peripheral regions 10 and 20 are disposed around the memory cell to provide an electrical signal in row and column direction crossing the memory cell. For example, the peripheral regions 10 and 20 may include a row decoder 10 provided with a peripheral circuit including a transistor disposed at a right side of the memory cell to provide an electrical signal to the wordline WL and a column decoder 20 provided with a peripheral circuit including a transistor disposed at a bottom side of the memory cell to provide an electrical signal to the bitline BL.

Figure 1C:
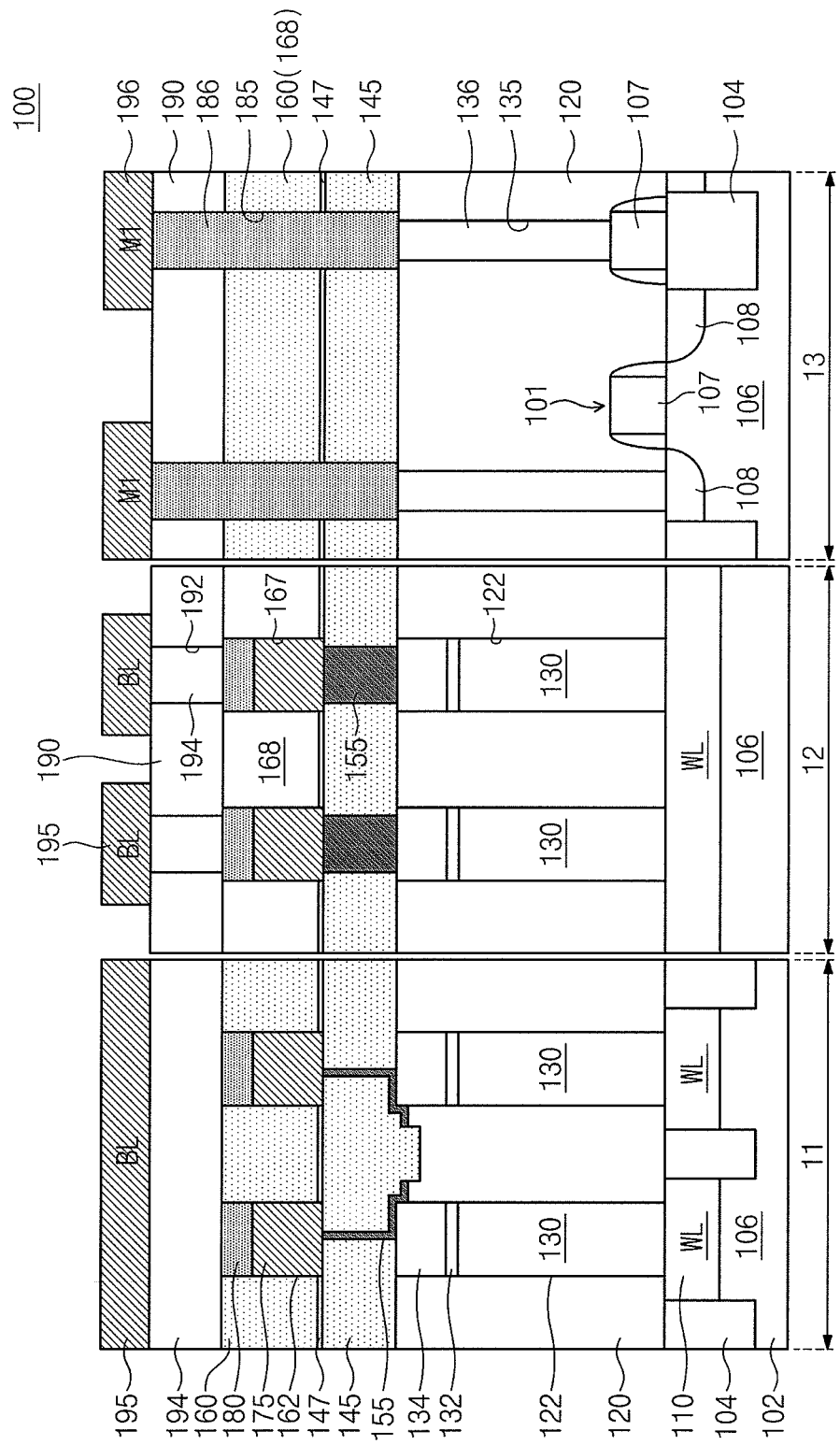
FIG. 1C is a cross-sectional view of a phase change memory device according to an embodiment of the inventive concept.

FIG. 1C is a cross-sectional view of a phase change memory device 100 according to an embodiment of the inventive concept. For example, FIG. 1C shows sections of a memory cell array and a peripheral region. For better understanding of the phase change memory 100, both a section of a wordline direction (direction of a line Y-Y' along which a wordline extends) and a section of a bitline direction (direction of a line X-X' along which a bitline extends) are shown at the memory cell array. In FIG. 1C, for example, a left portion 11 is a section taken along the line Y-Y' in FIG. 1B in a bitline (BL) direction, a center portion 12 is a section taken along the line X-X' in FIG. 1B in a wordline (WL) direction, and a right portion 13 is a section of a peripheral region corresponding to a decoder 10 and/or a column decoder 20.

Referring to FIG. 1C, in a memory cell corresponding to the left portion 11 and the center portion 12, a plurality of wordlines 110 may be provided at a semiconductor substrate 102. Adjacent wordlines 110 may be electrically insulated from each other by a device isolation layer. A plurality of bitlines 195 may be provided on the semiconductor substrate 110 to cross the wordlines 110. For example, the wordline 110 may be made of a semiconductor layer doped with impurity or a metallic thin film, and the bitline 195 may be made of a metallic thin film. A phase change layer 175 may be provided between the wordline 110 and the bitline 195 to function as a memory. The phase change layer 175 corresponds to a variable resistor Rp shown in FIG. 1A and FIG. 1B.

A bottom electrode 155 and a diode 130 may be provided between the wordline 110 and the phase change layer 175. A contact plug 134 may be further provided between the diode 130 and the bottom electrode 155. In addition, a silicide layer 132 may be further provided between the contact plug 134 and the diode 130 to reduce resistance.

A top electrode 180 may be provided between the phase change layer 175 and the bitline 195. The bottom electrode 155 may be electrically connected to the wordline 110 through the diode 130, and the top electrode 180 may be electrically connected to the bitline 195 through a top electrode contact 194. The bottom electrode 155 may be provided to correspond to the phase change layer 175. For example, a plurality of bottom electrodes 155 may be provided to correspond to a plurality of phase change layers 175, respectively.

The diode 130, the bottom electrode 155, the phase change layer 175, the top electrode 180, and the top electrode contact 194 may be formed within an insulating layer. As an example, a first interlayer dielectric 120 is formed on the semiconductor substrate 102, and a through-hole 122 may be formed to expose the wordline 110 through the first interlayer dielectric 120. The diode 130, the silicide layer 132, and the contact plug 134 may be formed in the through-hole 122. A second interlayer dielectric 145 may be formed on the first interlayer dielectric 120, and the bottom electrode 155 may be formed in the second interlayer dielectric 145. Mold layers 160 and 168 may be formed on the second interlayer dielectric 145, and a phase change layer 175 and a top layer 180 may be formed in the mold layers 160 and 168. A third interlayer dielectric 190 may be formed on the mold layers 160 and 168, and a via hole 192 may be formed to expose the top electrode 180 through the third interlayer dielectric 190. A top electrode contact 194 may be formed in the via hole 192. A bitline 195 may be formed on the third interlayer dielectric 190.

According to this embodiment, the mold layers 160 and 168 may be classified into a first mold layer 160 having a first trench 162 and a second mold layer 168 having a second trench 167. After forming the first mold layer 160 in the shape of line extending in a direction of the line X-X' (see FIG. 7A) and the second mold layer 168 in the shape of line extending in a direction of the line Y-Y' (see FIG. 8A), they may be isolated in an island shape (see FIG. 9A) by means of, for example, a planarization process. After the phase change layer 175 is continuously formed on the first and second mold layers 160 and 168 to have a non-isolated form, it may be node-isolated by means of, for example, a planarization process and defined within first and second trenches 162 and 167 to be recessed by a recess process. Thus, a misalignment with the bottom electrode 155 may be significantly reduced when the phase change layer 157 is formed. The top electrode 180 may be formed in the mold layers 160 and 168 in a self-aligned fashion with respect to the phase change layer 175, which will be clearly understood with reference to a fabricating method described in detail later.

The shape of the bottom electrode 155 and/or the phase change layer 175 may have a close relation to power consumption. For example, if a contact area between the bottom electrode 155 and the phase change layer 175 is reduced, the amount of current required to heat the phase change layer 175 may be reduced. For example, the bottom electrode 155 may be formed to have an L-shaped or step-shaped section, as shown at the left portion 11, and have a straight plane (see FIG. 11A). Alternatively, the bottom electrode 155 may be formed to have, for example, a straight plane a vertical pillar-shaped section (see FIG. 15C). As another example, the phase change layer 175c may be formed to taper down (see FIGS. 25B and 25C) and thus a contact area may be reduced.

A volume of the phase change layer 175 may have a close relation to power consumption and/or endurance characteristics. For example, if the volume of the phase change layer 175 is reduced, the power consumption may be reduced and the endurance characteristics may be improved. According to this embodiment, the volume of the phase change layer 175 may be reduced by decreasing the width of at least one of the first and second trenches 162 and 167. As an example, as shown in FIG. 18B, a phase change layer 175a with reduced volume may be formed by forming a spacer 169 on an inner wall of the second trench 167. As another example, as shown in FIG. 16C, the volume of the phase change layer 175a may be further reduced by further forming a second spacer 166 on the inner wall of the first trench 162. As yet another example, as shown in FIGS. 21B and 21C, a U-shaped phase change layer 175b may be formed of which volume is more reduced than a bulk-shaped phase change layer.

An element for driving a memory cell, e.g., a driving transistor 101 may be provided on an active region 106 defined by the device isolation layer 104 in a peripheral region corresponding to the right portion 13. The driving transistor 101 may provide an electrical signal to the wordline 110 and/or the bitline 195. A metal interconnection 196 corresponding to the bitline 195 may be provided at the driving transistor 101. The metal interconnection 196 may be electrically connected to a gate 107 or a junction region 108. Electrical connection between the metal interconnection 196 and the driving transistor 101 may be done through a first contact 136 and a second contact 186. The driving transistor 101 and the first contact 136 may be formed in a first interlayer dielectric 120, and the second contact 186 may be formed through the second interlayer dielectric 145, the first mold layer 160, and the third interlayer dielectric 190.

The peripheral region may be formed, for example, simultaneously with the formation of a memory cell. A series of processes for forming a peripheral region will now be described below in detail. Fabrication of a memory cell will be described in detail later.

A driving transistor 101 may be formed on a semiconductor substrate 102 after or before foaming a wordline 110. As an example, a gate 107 may be formed by depositing and patterning a polysilicon or metallic thin film and a junction region 108 may be formed by implanting impurities into an active region 106 to fabricate the driving transistor 101.

After forming a first interlayer dielectric 120 on the semiconductor substrate 102 to cover the driving transistor 101, a first contact hole 135 may be formed to expose the junction region 108 and/or the gate 107. A first contact 136 may be formed by filling the first contact hole 135 with, for example, a conductive material (e.g., copper (Cu), tungsten (W)). The first contact hole 135 may be formed, for example, simultaneously with formation of a through hole 122, and the first contact 136 may be formed simultaneously with formation of a contact plug 134.

A second contact hole 185 may be formed to expose the first contact 136 through the second interlayer dielectric 145, the first mold layer 160, and the third interlayer dielectric 190 which are sequentially stacked on the first interlayer dielectric 120. Instead of the first mold layer 160, the second mold layer 168 may be formed on the second interlayer dielectric 120. A second contact 186 may be formed by filling the second contact hole 185 with, for example, a conductive material (e.g., W, Cu) to be in contact with the first contact 136. For example, the second contact hole 185 may be formed simultaneously with formation of a via hole 192, and the second contact 186 may be formed simultaneously with formation of a top electrode contact 194.

A metal interconnection 196 may be formed on the third interlayer dielectric 190. The metal interconnection 196 may be electrically connected to the driving transistor 101 through the first and second contacts 136 and 138. The metal interconnection 196 may be formed simultaneously with formation of a bitline 195.

Figure 1D:
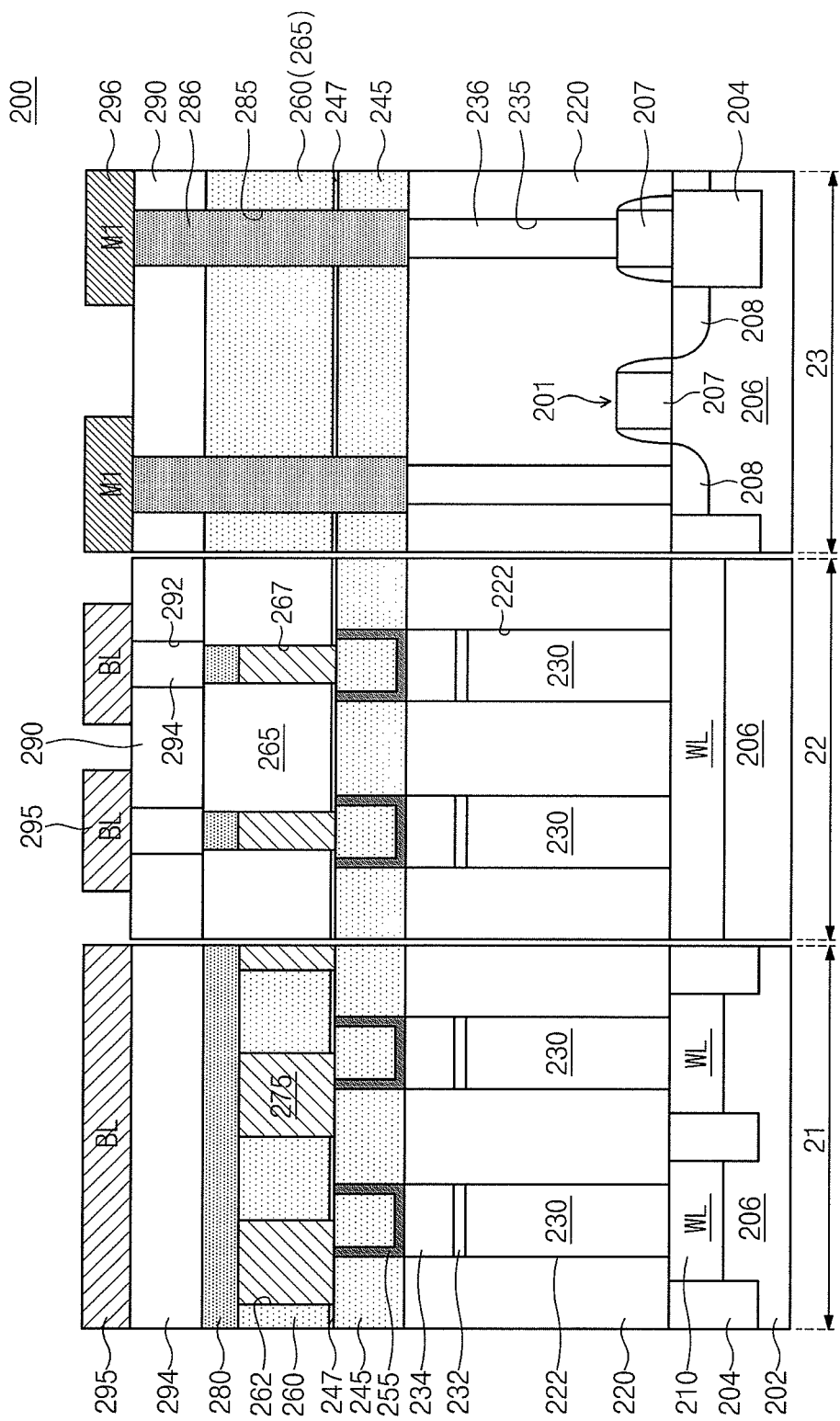
FIG. 1D is a cross-sectional view of a phase change memory device according to an embodiment of the inventive concept.

FIG. 1D is a cross-sectional view of a phase change memory device 200 according to another embodiment of the inventive concept. In FIG. 1D, a left portion 21 is a section taken along the line Y-Y' in FIG. 1B in a bitline (BL) direction; a center portion 22 is a section taken along the line X-X' in FIG. 1B in a wordline (WL) direction; and a right portion 23 is a section of a peripheral region corresponding to a decoder 10 and/or a column decoder 20.

Referring to FIG. 1D, the phase change memory device 200 may include a memory cell corresponding to the left portion 21 and the center portion 22 and a peripheral region corresponding to the right portion 23. At the left portion 21 and the center portion, a plurality of wordlines 210 and a plurality of bitlines 295 may be provided on a semiconductor substrate 202 to intersect each other. Adjacent wordlines 210 may be electrically insulated from each other by a device isolation layer 204. A phase change layer 275 may be provided between the wordline 210 and the bitline 295 to function as a memory. A bottom electrode 255 and a diode 230 may be provided between the phase change layer 275 and the bitline 295, and a top electrode 280 may be provided between the phase change layer 275 and the bitline 295. A contact plug 234 and a silicide layer 232 may be further provided between the diode 230 and the bottom electrode 255. The bottom electrode 255 may be electrically connected to the wordline 210 through the diode 230, and the top electrode 280 may be electrically connected to the bitline 295 through a top electrode contact 294.

A first interlayer dielectric 220 may be formed on the semiconductor substrate 202, and a through-hole 222 may be formed to expose the wordline 210 through the first interlayer dielectric 220. The diode 230, the silicide layer 232, and the contact plug 234 may be formed in the through-hole 222. A second interlayer dielectric 245 may be formed on the first interlayer dielectric 220, and the bottom electrode 255 may be formed in the second interlayer dielectric 245. Mold layers 260 and 265 may be formed on the second interlayer dielectric 245, and the phase change layer 275 and the top electrode 280 may be formed in the mold layers 260 and 265. A third interlayer dielectric 290 may be formed on the mold layers 260 and 265, and a via hole 292 may be formed to expose the top electrode 280 through the interlayer dielectric 290. The top electrode contact 294 may be formed in the via hole 292. A bitline 295 may be formed on the third interlayer dielectric 290.

According to this embodiment, the mold layers 260 and 265 may be classified into a first mold layer 260 having a first trench 262 and a second mold layer 265 having a second trench 267. The first mold layer 260 may be formed, for example, in the shape of line extending in a direction of the line X-X' (see FIG. 29A), and the second mold layer 265 may be formed, for example, in the shape of line extending in a direction of the line Y-Y' (see FIG. 30A). After the phase change layer 275 is continuously formed on the first and second mold layers 260 and 265 to have a non-isolated form, it may be isolated by a recess process to be defined within first and second trenches 262 and 267. The top electrode 280 may be formed to continuous on the first mold layer 260 in a bitline direction (direction of the X-X' line) but isolated in the second mold layer 265 in a wordline direction (direction of the Y-Y' line), which will be clearly understood with reference to a fabricating method described in detail later.

Figure 30A:
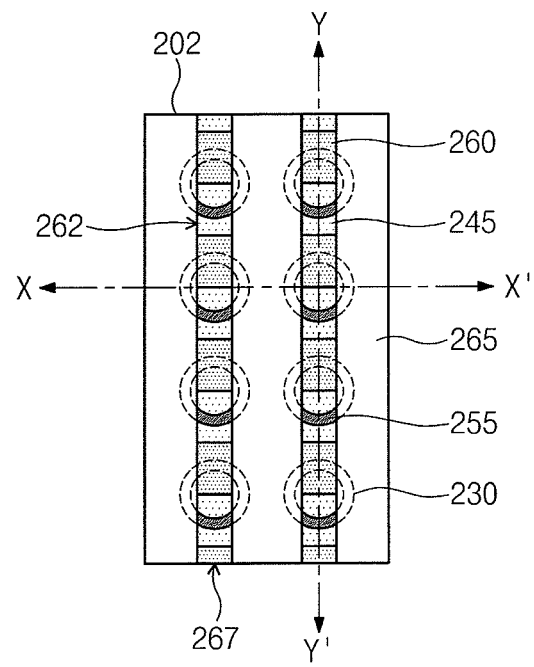

For example, as shown at the left portion 21 and the center portion 22, the bottom electrode 255 may be formed to have a U-shaped section, and the first trench 262 may be formed to pass through a portion of the bottom electrode 255. Thus, as shown in FIG. 30A, a portion exposed through the first trench 262 may have the shape of an arc through which the bottom electrode 255 is in contact with the phase change layer 275.

A peripheral region corresponding to the right portion may be formed with the same or similar structure as the right portion 13 shown in FIG. 1C. For example, on the active region 206 defined by the device isolation layer 204, an electrical signal is applied to the wordline 210 and/or the bitline 295 to provide a driving transistor 201 for driving a memory cell. The metal interconnection 296 may be electrically connected to the gate 207 or the junction region 208 of the driving transistor 201 through the first contact 236 and the second contact 286. The driving transistor 201 and the first contact 236 are formed in the first interlayer dielectric 220, and the second contact 286 may be formed through the second interlayer dielectric 245, the first mold layer 260, and the third interlayer dielectric 290.

The driving transistor 201 may be formed, for example, as follows: after or before forming a wordline 210, a polysilicon or metallic thin film is deposited and patterned to form a gate 207 and a junction region 208 is formed by implanting impurities into the active region 206. After forming a first interlayer dielectric 220 on the semiconductor substrate 202 to cover the driving transistor 201, a first contact hole 235 may be formed to expose the junction region 208 and/or the gate 207 and a first contact 236 may be formed by filling the first contact hole 235 with, for example, a conductive material (e.g., Cu, W). The first contact hole 235 may be formed, for example, simultaneously with the formation of a through-hole 222, and the first contact 236 may be formed, for example, simultaneously with the formation of the contact plug 234.

A second contact hole 285 may be formed to expose the first contact 236 through the second interlayer dielectric 245, the first mold layer 260, and the third interlayer dielectric 290 which are sequentially stacked on the first interlayer dielectric 220. Instead of the first mold layer 260, a second mold layer 265 may be formed on the first interlayer dielectric 220. A second contact 286 may be formed by filling the second contact hole 285 with, for example, a conductive material (e.g., W, Cu) to be in contact with the first contact 236. The second contact hole 285 may be formed, for example, simultaneously with formation of a via hole 292, and the second contact 286 may be formed, for example, simultaneously with formation of a top electrode contact 24.

A metal interconnection 296 may be formed on the third interlayer dielectric 290. The metal interconnection 296 may be electrically connected to the driving transistor 201 through the first and second contacts 236 and 286.

FIGS. 2A to 11A are top plan views illustrating a method for fabricating a phase change memory device according to an embodiment of the inventive concept.

Specifically, FIGS. 2A to 11A are enlarged views of a portion 'A', respectively. FIGS. 2B to 11B are cross-sectional views taken along the lines X-X' in FIGS. 2A to 11A, respectively. FIG. 2C to 11C are cross-sectional views taken along the lines Y-Y' in FIGS. 2A to 11A, respectively.

Figure 2A:
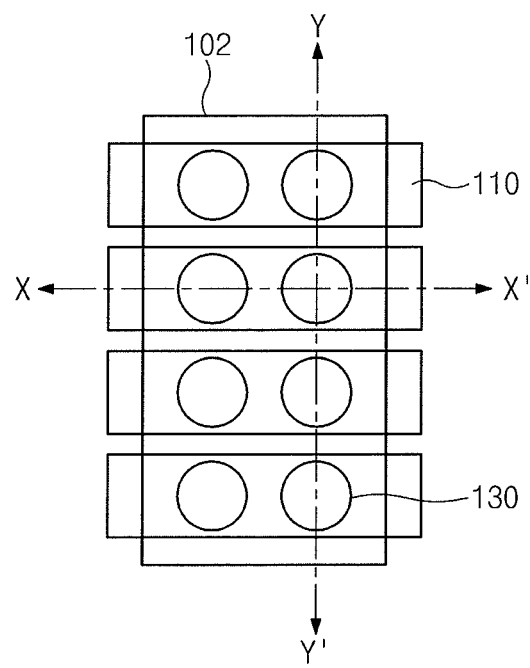
Figure 2B:
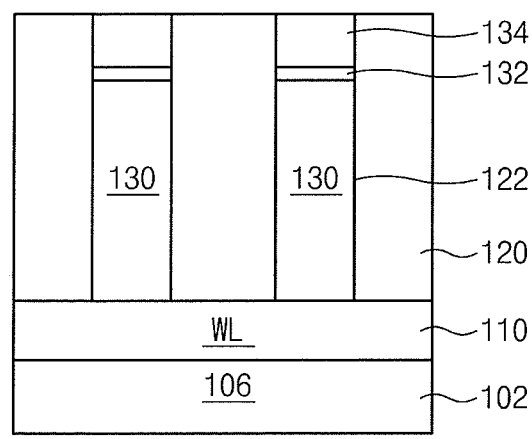
Figure 2C:
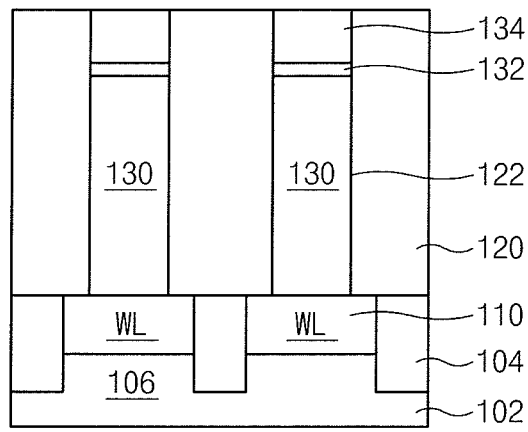

Referring to FIGS. 2A, 2B, and 2C, a plurality of diodes 130 may be formed on a semiconductor substrate 102 to be electrically connected to a plurality of wordlines 110. A plurality of contact plug 134 may be further formed to be connected to the diodes 130. A silicide layer 132 may be further formed between the diode 130 and the contact plug 134. The wordline 110 may extend on the semiconductor substrate 102 in an extension direction of a line X-X' (hereinafter referred to as "X direction"). As an example, the semiconductor substrate 102 may include a silicon epitaxial layer supported by a semiconductor structure such as silicon, silicon on insulator (SOI), silicon germanium (SiGe), germanium (Ge), gallium arsenide (GaAs), silicon carbide (SiC), nitride germanium ($Ge_xN_y$), and doped or undoped silicon. According to example embodiments of the inventive concept, the semiconductor substrate 102 may be, for example, a P-type silicon substrate doped with P-type impurities.

A device isolation layer 104 may be formed to define an active region 106 on the semiconductor substrate 102, and a wordline 110 may be formed at the active region 106. The device isolation layer 104 may be formed by means of, for example, a shallow trench isolation (STI) process. The wordline 110 may be formed by implanting impurities into the active region 106. For example, when the semiconductor substrate 102 is a P-type silicon substrate, the wordline 110 may be formed by means of various manners. For example, the wordline 110 may be formed by forming a plurality of epitaxial semiconductor layers on the semiconductor substrate 102 to be parallel with each other and doping impurities by ion implantation or simultaneously with formation of an epitaxial semiconductor layer. Alternatively, the wordline 110 may be formed of, for example, a metallic thin film.

A first interlayer dielectric 120 may be formed on the semiconductor substrate 102, and a diode 130 and a contact plug 134 may be formed to be electrically connected to the wordline 110 through the first interlayer dielectric 120. As an example, the first interlayer dielectric 120 may be formed by depositing an insulating material (e.g., silicon oxide ($SiO_2$), silicon nitride (SiN), silicon nitride ($Si_3N_4$), and silicon oxynitride (SiON), the diode 130 may be formed by epitaxially growing P-type and N-type semiconductor layers in this order or in the reverse order, and the contact plug 134 may be formed by depositing a conductive material (e.g., W, Cu). The diode 130 may be formed by, for example, epitaxially growing a P-type or N-type semiconductor layer or implanting impurities. The diode 130 may be formed by, for example, forming a through-hole 122 to expose the wordline 110 through the first interlayer dielectric 120 and performing an selective epitaxial growth (SEG) process using the wordline 110 as a seed or a solid-phase epitaxial growth process in which an amorphous or polycrystalline semiconductor layers is crystallized after being formed in the through-hole 122. The silicide layer 132 may be formed of, for example, metal silicide (e.g., cobalt silicide (CoSix), nickel silicide (NiSix), titanium silicide (TiSix)) to reduce a resistance between the contact plug 134 and the diode 130.

Figure 3A:
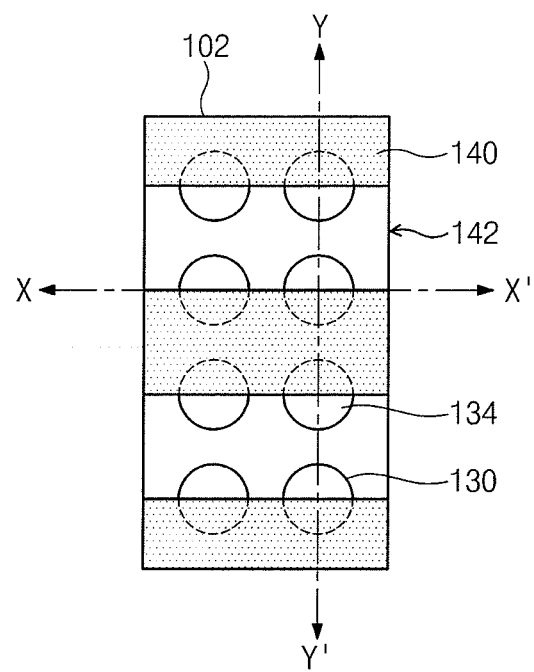
Figure 3B:
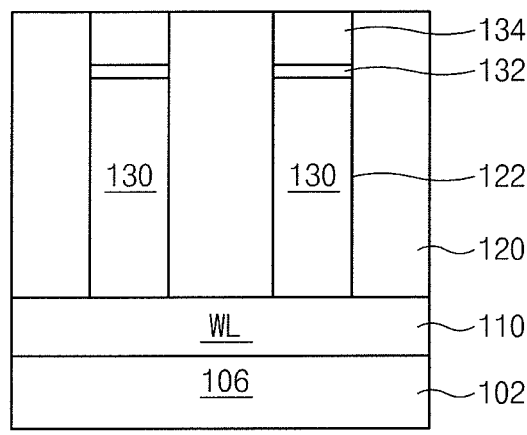
Figure 3C:
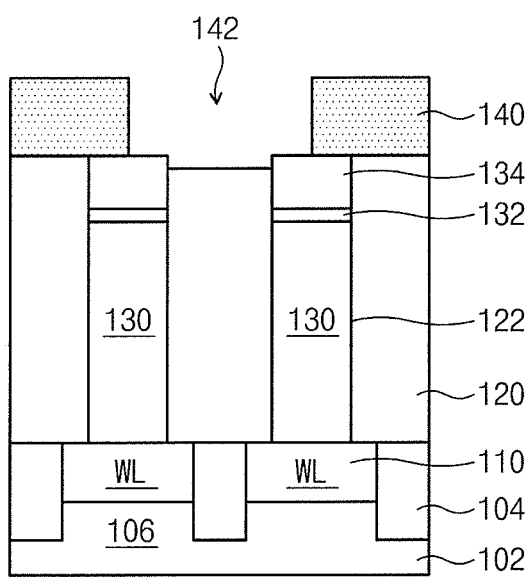

Referring to FIGS. 3A, 3B, and 3C, a first insulating layer 140 may be formed which has a first opening 142 to expose the contact plug 134. The first opening 142 may have, for example, the shape of line extending in the X direction to expose parts (e.g., half) of two contact plugs 134 which are adjacent in an extension direction of a line Y-Y' (hereinafter referred to as "Y direction"). As an example, a first insulating layer 140 having a first opening 142 may be formed by depositing an insulating material on the first interlayer dielectric 120 and etching the deposited insulating material. According to this embodiment, the first insulating layer 140 may be formed of silicon nitride (e.g., SiN, $Si_3N_4$). A portion of the first interlayer dielectric 120 exposed by the first opening 142 may be overetched during an etching process for &liming the first opening 142. The wordline 110 is not shown for the brevity of the figures, which is identical to the figures hereinbelow.

Figure 4A:
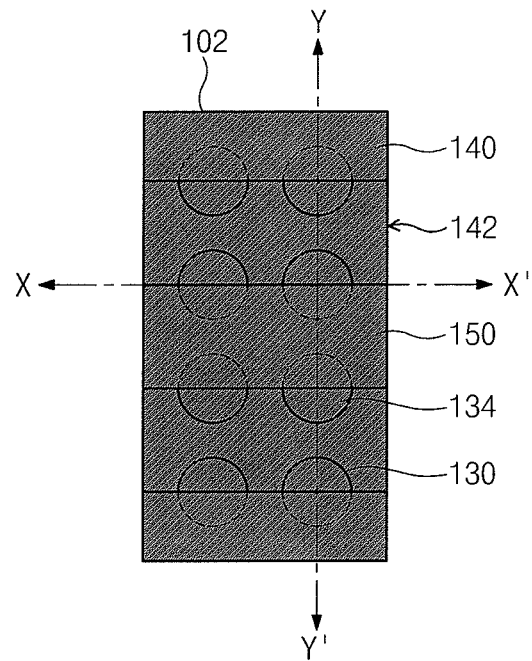
Figure 4B:
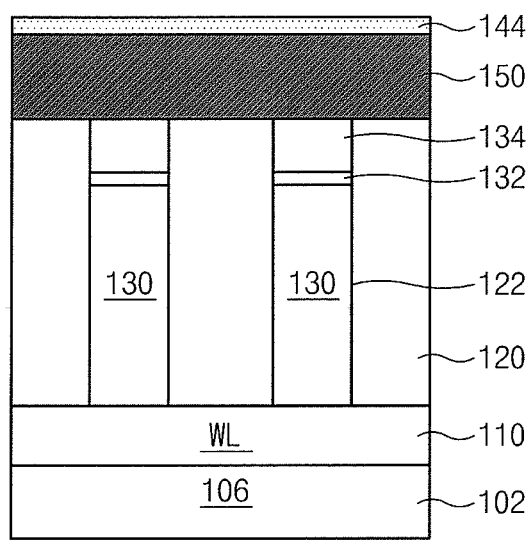
Figure 4C:
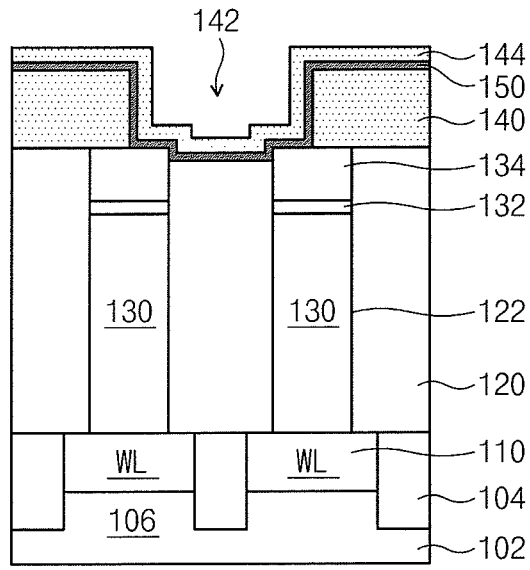

Referring to FIGS. 4A, 4B, and 4C, a conductive layer 150 and a second insulating layer 144 to cover the conductive layer 150 may be formed. The conductive layer 150 may be formed by, for example, depositing or plating a metal which does not react to a phase change material layer, which will be described in detail later, such as refractory metals or their nitrides. Also the conductive layer 150 may be formed of a material to generate heat which is enough to change a phase of the phase change layer. For example, the conductive layer 150 may be formed of one of refractory metals or their nitrides such as titanium nitride (TiN), titanium silicon nitride (TiSiN), titanium aluminum nitride (TiAlN), tantalum silicon nitride (TaSiN), tantalum aluminum nitride (TaAlN), tantalum nitride (TaN), tungsten silicide (WSi), tungsten nitride (WN), titanium tungsten (TiW), molybdenum nitride (MoN), niobium nitride (NbN), titanium boron nitride (TiBN), zirconium silicon nitride (ZrSiN), tungsten silicon nitride (WSiN)_, tungsten boron nitride (WBN), zirconium aluminum nitride (ZrAlN), molybdenum aluminum nitride (MoAlN), titanium aluminum (TiAl), titanium oxynitride (TiON), titanium aluminum oxynitride (TiAlON), tungsten oxynitride (WON), tantalum oxynitride (TaON) or a combination thereof. As an example, the conductive layer 150 may be formed to a thickness of about 1 to about 20 nanometers. According to this embodiment, the conductive layer 150 may be formed of, for example, TiSiN or TiN by means of physical vapor deposition (PVD) or chemical vapor deposition (CVD). The second insulating layer 144 may be formed, for example, in the shape of a spacer by depositing the same or similar material as the first insulating layer 140, e.g., silicon nitride (e.g., SiN, Si3N4). As an example, the second insulating layer 144 may be formed to a thickness of about 2 to about 50 nanometers.

Figure 5A:
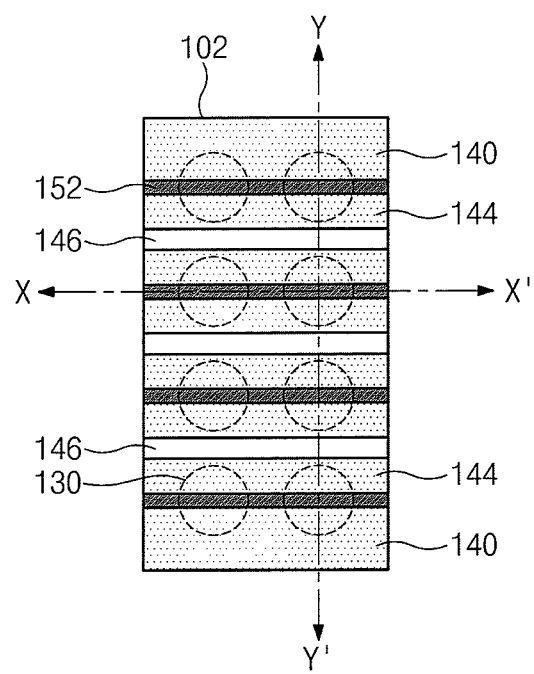
Figure 5B:
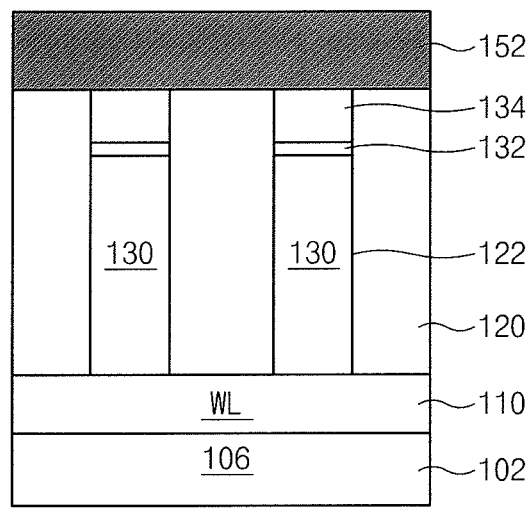
Figure 5C:
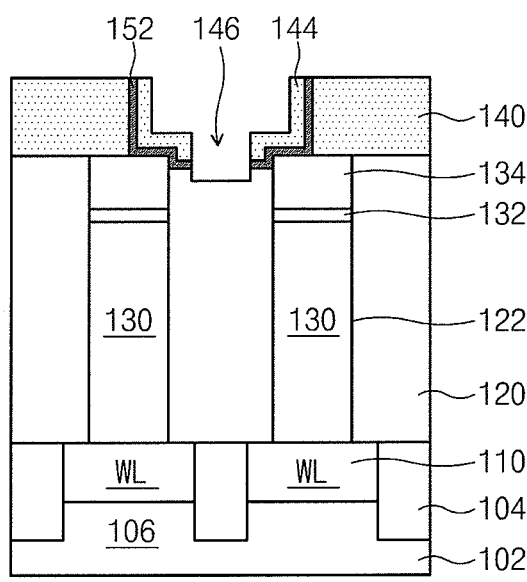

Referring to FIGS. 5A, 5B, and 5C, a spacer electrode 152 may be formed by patterning the conductive layer 150. The spacer electrode 152 may be in form of, for example, Y-node separation. That is, the spacer electrode 152 may have the shape of, for example, a spacer continuously extending in the X direction while separating in the Y direction. As an example, an isolation pattern 146 extending in the X direction may be formed by means of, for example, a spacer etching process for portions of the second insulating layer 144 and the conductive layer 150 formed in the first opening (142 in FIG. 4C). The Y-node separation caused by the isolation pattern 146 may allow the conductive layer 150 to be formed as a spacer electrode 152. A portion of the interlayer dielectric 120 between diodes 130 adjacent in the Y direction may be overetched during an etching process for forming the isolation pattern 146. According to this embodiment, the spacer electrode 152 may be formed in, for example, an L shape or a step shape, e.g., continuously extend in the X direction and be in contact with about half top surface of the contact plug 134.

Figure 6A:
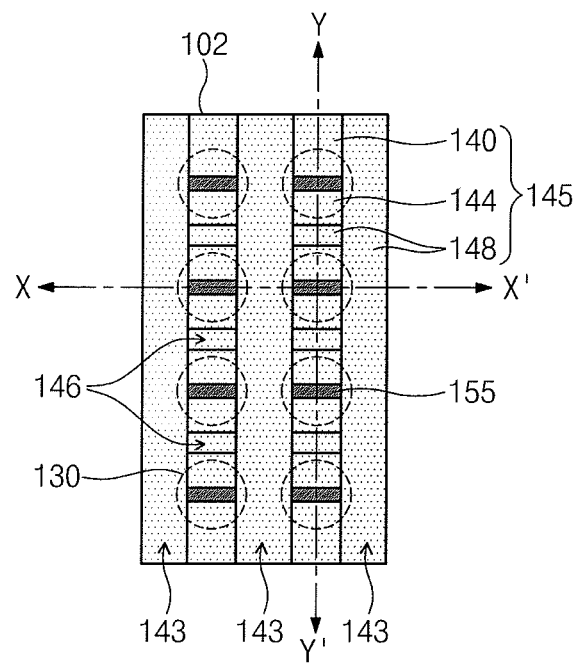
Figure 6B:
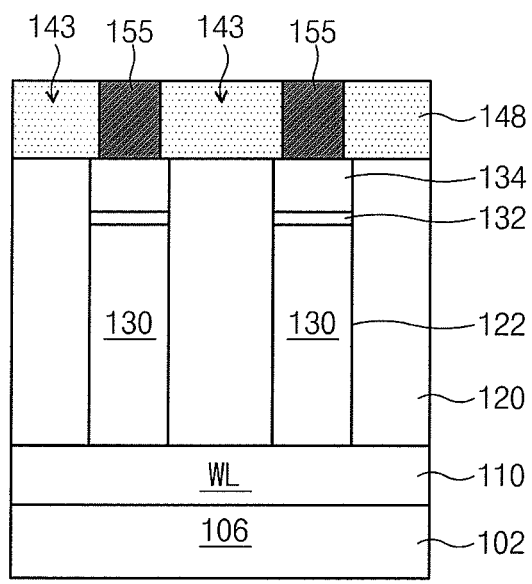
Figure 6C:
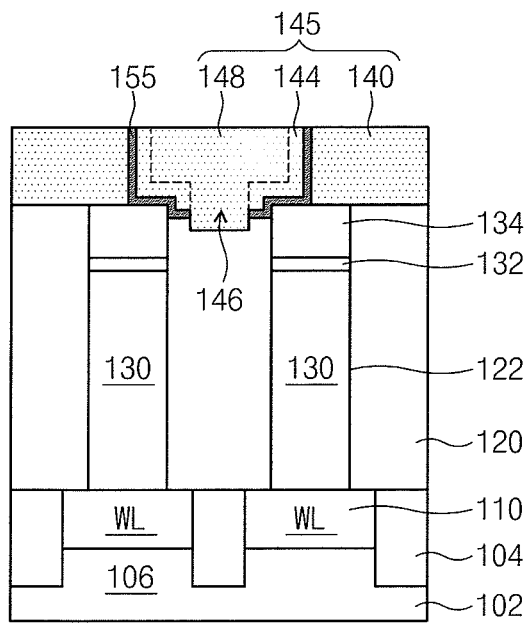

Referring to FIGS. 6A, 6B, and 6C, a bottom electrode 155 may be formed by means of, for example, a trim patterning process for the spacer electrode 152. The bottom electrode 155 may be in form of, for example, X-node separation of the Y-node-separated spacer electrode 152, e.g., have the shape extending in the X direction. As an example, a spacer electrode 152 having the shape extending in the X direction (see FIG. 5A) may be etched to form a bottom electrode 155 having a linear plane defined on the diode 130 (see FIG. 6A) and an L-shaped or step-shaped section connected to about half the top surface of the contact plug 134 (see FIG. 6C). The bottom electrode 155 may have a thickness (height) ranging from, for example, about 10 to about 100 nanometers.

Due to the trim patterning process, a second opening 143 may be formed between the bottom electrodes 155 to expose the first interlayer dielectric 120. A third insulating layer 148 may be formed by, for example, depositing an insulating material on the semiconductor substrate 102 and planarizing (e.g., CMP) the deposited insulating material. The third insulating layer 148 may fill the isolation pattern 146 as well as the second opening 143. The third insulating layer 148 may be formed of, for example, the same or similar material as the first insulating layer 140, e.g., silicon nitride (e.g., SiN, $Si_3N_4$). The first to third insulating layers 140, 144, and 148 may constitute a second interlayer dielectric 145 to insulate a plurality of bottom electrodes 155 from each other.

Figure 7A:
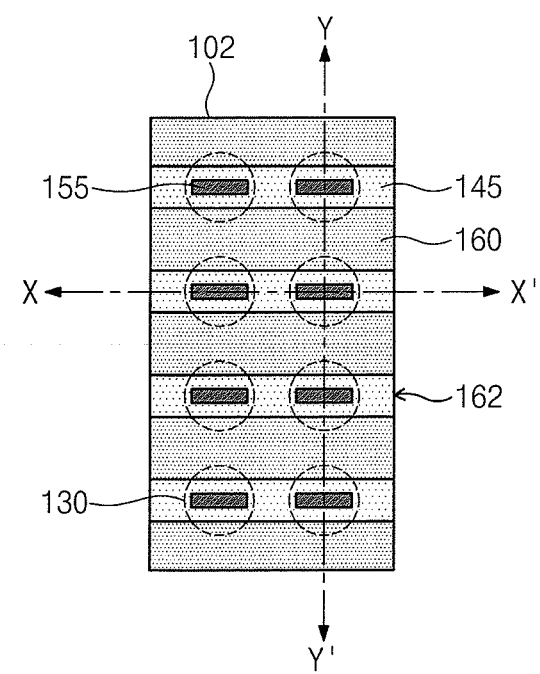
Figure 7B:
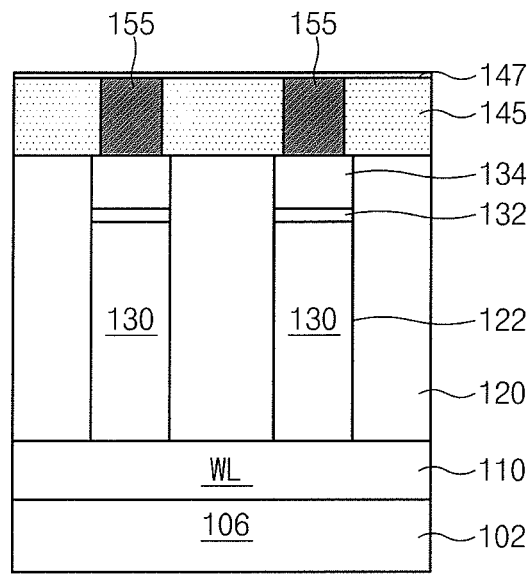
Figure 7C:
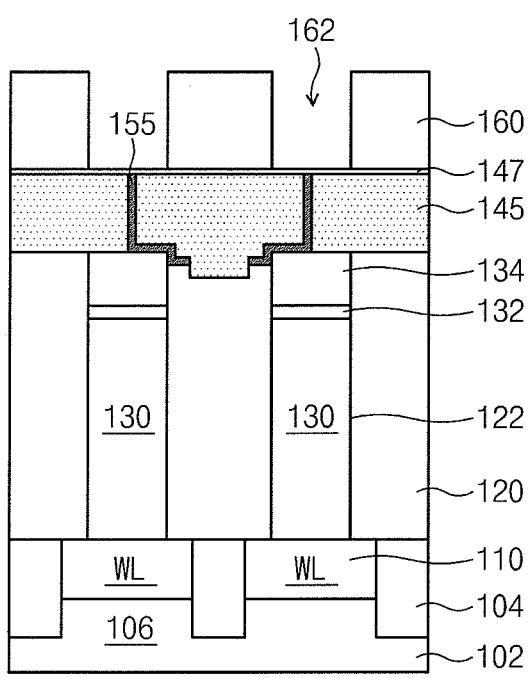

Referring to FIGS. 7A, 7B, and 7C, an etch-stop layer 147 may be formed on the second interlayer dielectric 145 and a first mold layer 160 may be formed on the etch-stop layer 147. The etch-stop layer 147 may be formed by depositing an insulating material such as, for example, silicon oxide (SiOx), silicon nitride (SixNy), silicon oxynitride (SiON), silicon carbon nitride (SiCN), silicon carbide (SiC), carbon (C), titanium oxide (TiO), zirconium oxide (ZrOx), magnesium oxide (MgOx), hafnium oxide (HfOx), and aluminum oxide (AlOx). According to this embodiment, the etch-stop layer 147 may be formed by depositing SiON. The first mold layer 160 may be formed between the bottom electrodes in the shape of line extending in the X direction 155 by depositing and patterning an insulating material. For example, the first mold layer 160 may be formed in the shape of line by depositing an insulating material such as SiOx, SixNy, SiON, SiCN, SiC, C, TiO, ZrOx, MgOx, HfOx, AlOx or a combination thereof and etching the insulating material to have a first trench 162 extending in the X direction. The first mold layer 160 may be formed to a thickness of, for example, 10 to 150 nanometers. The first trench 162 may be formed to cross over the bottom electrodes 155 arranged in the X direction. According to this embodiment, the first mold layer 160 may be formed of SiN. The first mold layer 160 electrically insulates phase change layers (described later) deposited in the shape of line such that the phase change layers correspond to the diodes 130, respectively. In this specification, the first mold layer 160 will be interchangeable with the term "isolation mold layer".

Figure 8A:
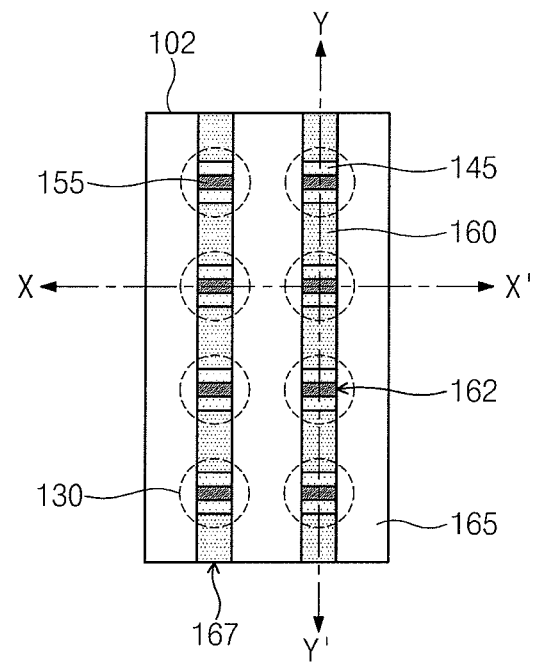
Figure 8B:
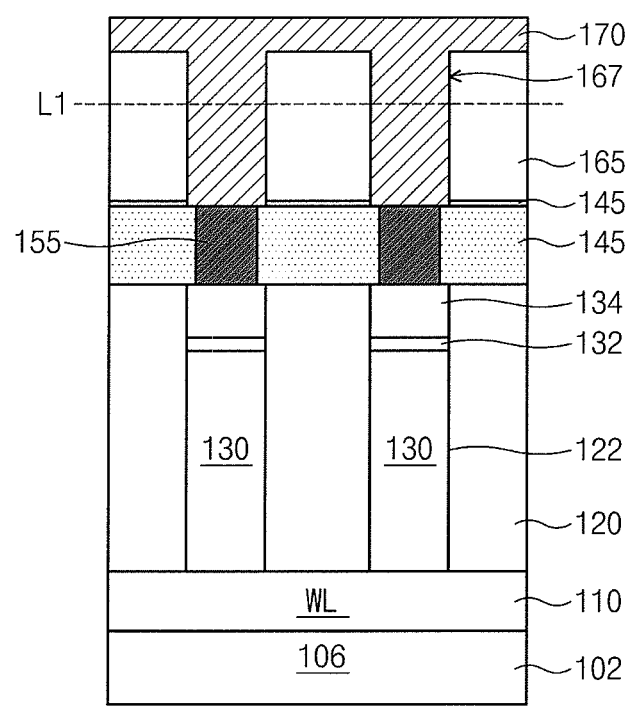
Figure 8C:
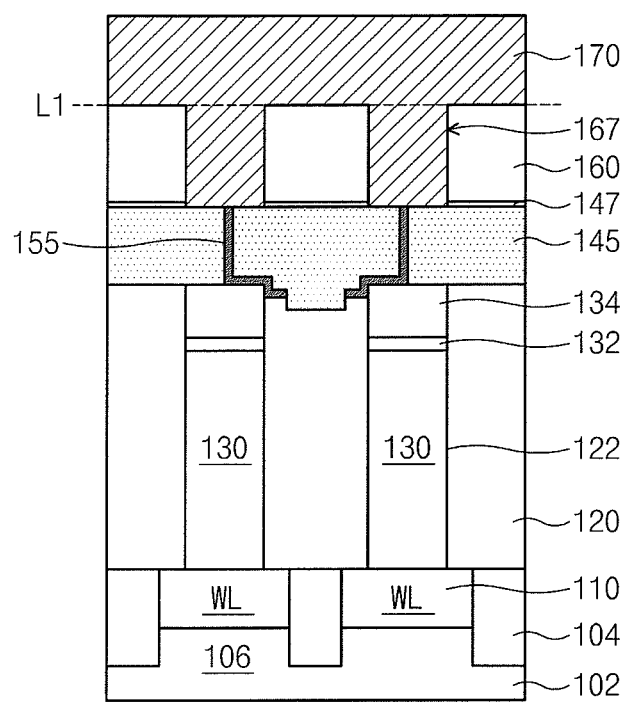

Referring to FIGS. 8A, 8B, and 8C, a second mold layer 165 may be foamed on a semiconductor substrate 102 where the isolation mold layer 160 is formed. A second mold layer 165 may be formed to cross the isolation mold layer 160 and have a second trench 167 extending in the Y direction to expose the bottom electrodes 155 and. For example, after depositing an insulating material on the entire surface of the semiconductor substrate 102, the insulating material may be selectively etched to form a second mold layer 165 crossing the isolation mold layer 160 and extending in the Y direction to expose the bottom electrodes 155. The second mold layer 165 may be formed to a thickness of, for example, about 50 to about 200 nanometers. During an etching process for forming the second trench 167, a portion of the etch-stop layer 174 may be removed and a portion exposed by the first trench 162 may be also removed. Accordingly, the bottom electrode 155 may be exposed through the first trench 162 and the second trench 167.

The second mold layer 165 may be formed of an insulating material with relatively superior step coverage, e.g., atomic layer deposition (ALD) $SiO_2$, TEOS (Tetra Ethyl Ortho Silicate) $SiO_2$, USG (Undoped Silicon Glass) $SiO_2$, PSG (P doped Silicon Glass) $SiO_2$, HDP (High Density Plasma) $SiO_2$, SOG (Silicon On Glass) $SiO_2$, PE (Plasma Enhanced) CVD $SiO_2$, PE (Plasma Enhanced) SiON, PE (Plasma Enhanced) SiN, FOx (Flowable oxide), PEOx (Polyethylene Oxide) or a combination thereof. According to this embodiment, the second mold layer 165 may be formed of HDP $SiO_2$. The second mold layer 165 may be formed to a greater thickness than the isolation mold layer 160. The second mold layer 165 may be provided for depositing a phase change layer in the shape of line. In this specification, the second mold layer 165 will be interchangeable with the term "GST mold layer".

A second trench 167 is filled by depositing a phase change material layer 170 to cover the GST mold layer 165. At this point, the first trench 162 may also be filled with the phase change material layer 170. The phase change material layer 170 may include, for example, a chalcogenide such as, for example, germanium (Ge), antimony (Sb), tellurium (Te). For example, the phase change material layer 170 may be formed by depositing a material which turns to an amorphous phase having low resistivity and a crystalline phase having high resistivity depending on heating temperature and time. A phase changeable material may include, for example, at least one selected from the group consisting of tellurium (Te), selenium (Se), germanium (Ge), antimony (Sb), bismuth (Bi), lead (Pb), tin (Sn), indium (In), silver (Ag), arsenic (As), gallium (Ga), sulfur (S), silicon (Si), phosphorus (P), oxygen (O), and a combination thereof. For example, the phase change material layer 170 may be formed of chalcogenide such as germanium-antimony-tellurium (GeSbTe), germanium-tellurium-arsenic (GeTeAs), germanium bismuth tellurium (GeBiTe), germanium-tellurium arsenide (GeTeTi), germanium-tellurium-selenium (GeTeSe), arsenic-antimony-tellurium (AsSbTe), arsenic-germanium-antimony-tellurium (AsGeSbTe), tin-antimony-tellurium (SnSbTe), selenium-tellurium-tin (SeTeSn), tin-antimony-bismuth (SnSbBi), gallium-tellurium-selenium (GaTeSe), indium-antimony-tellurium (InSbTe), germanium-tellurium (GeTe), antimony-tellurium (SbTe), indium-tin-antimony-tellurium (InSnSbTe), and silver-indium-antimony-tellurium (AgInSbTe) or the chalcogenide doped with impurity. The impurity doping the chalcogenide may include, for example, nitrogen (N), oxygen (O), silicon (Si), carbon (C), boron (B), and dysprosium (Dy). The phase change material layer 170 may be continuous on the first and second mold layers 160 and 165 without separation. The phase change material layer 170 and the GST mold layer 165 may be planarized by means of, for example, chemical mechanical polishing (CMP), dry etching or a combination thereof. The planarization process may be performed to a height L1 at which the isolation mold layer 160 is exposed.

Figure 9A:
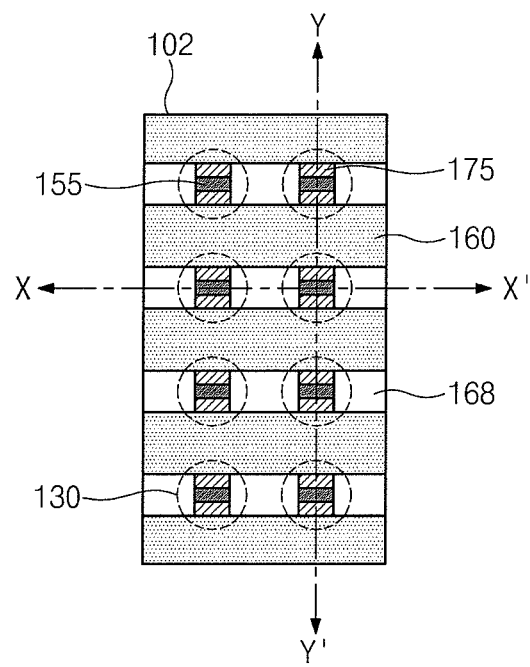
Figure 9B:
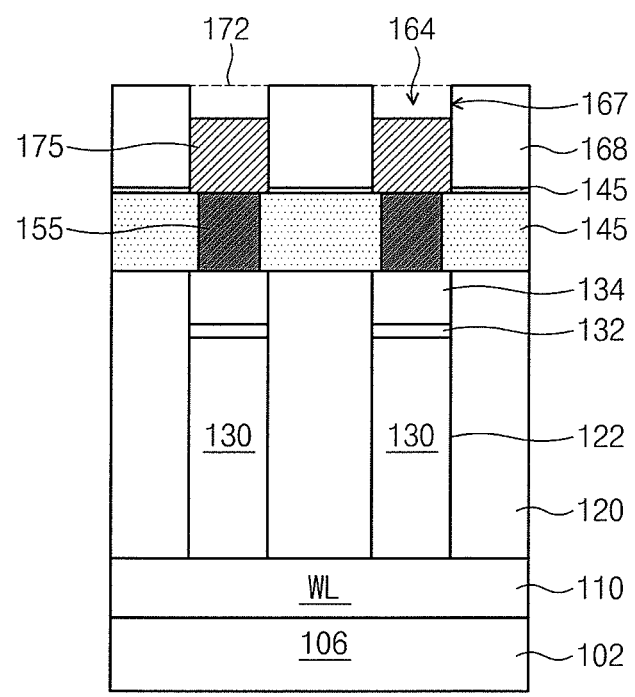
Figure 9C:
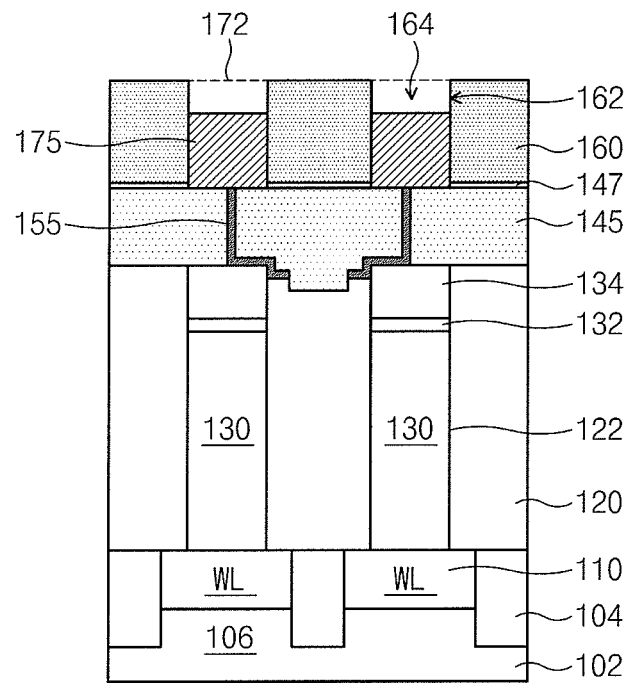

Referring to FIGS. 9A, 9B, and 9C, according to the planarization process, a phase change material pattern 172 may be formed to be separated in the Y and Y directions. A phase change layer 175 may be formed by, for example, recessing the phase change material pattern 172. For example, in the recessing process, the phase change layer 175 having a thickness of about 10 to about 150 nanometers may be formed by removing the phase change material pattern 172 by a thickness of about 5 to about 50 nanometers. The phase change layer 175 may be defined in the first and second trenches 162 and 167 to be electrically connected to the bottom electrode 155 and/or the diode 130 in one-to-one correspondence. According to the recessing process, a recessed region 164 defined by the first and second trenches 162 and 167 may remain.

According to the planarization process, an upper portion of the GST mold layer 165 may, for example, be partially removed to form a planarized GST mold layer 168 having the same or similar height as the isolation mold layer 160. Thus, the GST mold layer 168 may be formed to have, for example, an island shape in the X direction. According to this embodiment, the bottom electrode 155 has a linear plane to minimize a contact area with the phase change layer 175. Thus, the amount of current applied to the bottom electrode 155 to change a crystalline state of the phase change layer 175 may be minimized. Additionally, since the bottom electrode 155, the isolation mold layer 160, and the GST mold layer 168 may be patterned in the shape of line, a misalignment margin may increase as compared to when they are patterned in the shape of plug or contact. Moreover, since the phase change layer 175 is formed by the isolation mold layer 160 and the GST mold layer 168 which are patterned in the shape of line, misalignment with the bottom electrode 155 may be significantly reduced.

Figure 34A:
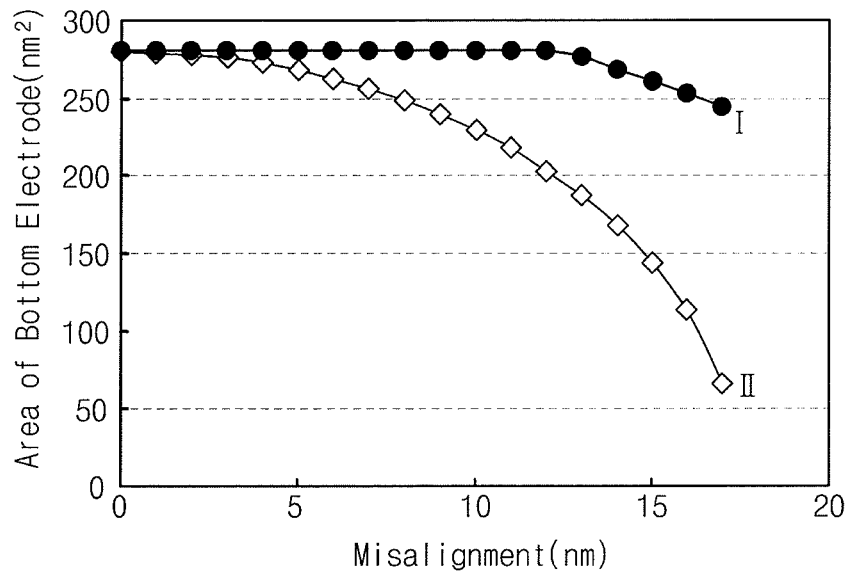
FIG. 34A is a graphic diagram showing that an area of a bottom electrode is reduced when misalignment occurs, in a methods for fabricating a phase change memory device according to an embodiment of the inventive concept and a typical method for fabricating a phase change memory device.

FIG. 34A is a graphic diagram showing that an area of the bottom electrode 155 is reduced when misalignment occurs between the phase change layer 175 and the bottom electrode 155. In the graph, a vertical axis represents a misalignment value and a horizontal axis represents an area of the bottom electrode 155.

Referring to FIG. 34A, two cases are illustrated in the graph. One is a case "I" where a phase change layer 175 is formed of line-shaped mold layers 160 and 168, and the other is a case "II" where a phase change layer 175 is formed in the shape of plug. That is, the case "I" is similar to this embodiment but the case "II" is not. In the case "I", for example, although a phase change layer 175 is misaligned with a bottom electrode 155 within about 15 nanometers when the phase change layer 175 is formed to have a length of about 30 to 35 nanometers and a bottom electrode 155 is formed to have a length of about 60 nanometers, an area reduction rate of the bottom electrode 155 may be less than about 10 percent. In the case "II", when misalignment of about 15 nanometers occurs, an area of the bottom electrode 155 may be reduced about by half. As can be understood from the graph, according to this embodiment, an area reduction of the bottom electrode 155 may be minimized in spite of misalignment between the phase change layer 175 and the bottom electrode 155. As a result, dispersion of operating current may be made small.

Figure 34B:
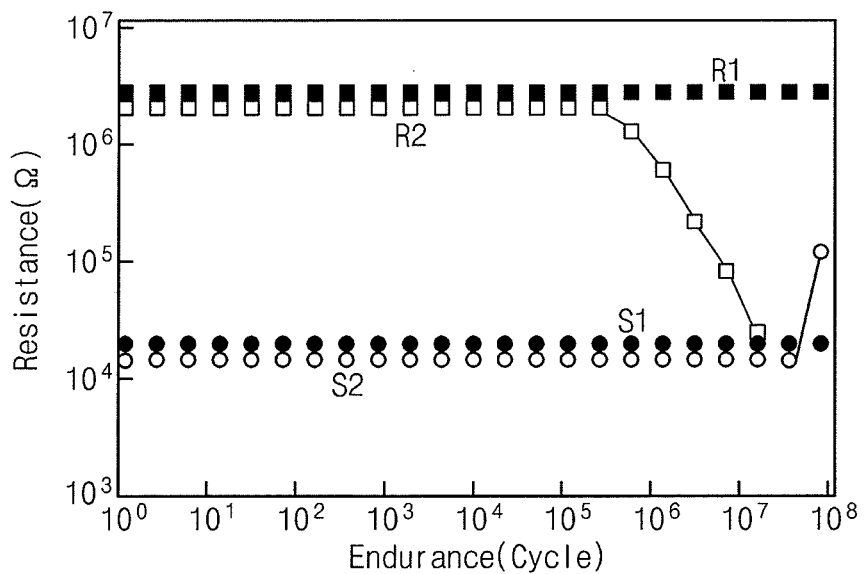
FIG. 34B is a graphic diagram showing endurance characteristics of a phase change memory device according to an embodiment and a typical phase change memory device.

According to this embodiment, the volume of the phase change layer 175 may be minimized by adjusting width of at least one of the first and second trenches 162 and 167. Due to the minimization of the volume of the phase change layer 175, composition variation with electromigration (EM) may be minimized to improve endurance characteristics, as shown in FIG. 34B. In addition, due to the minimization of the volume of the phase change layer 175, heat of the bottom electrode 155 may decrease and the heating amount of the phase change layer 175 may increase. Thus, power consumption may be minimized.

FIG. 34B is a graphic diagram showing endurance characteristics depending on volume reduction of a phase change layer 175 in a method for fabricating a phase change memory device according to an embodiment and a typical phase change memory device. In the graph, a horizontal axis represents a cycle and a vertical axis represents resistance ($\Omega$).

Referring to FIG. 34B, it is to be understood that in case of the inventive concept, a reset characteristic R1 denoted by black squares and/or a set characteristic S1 denoted by black circles is not deteriorated at a cycle of about $1.0 \times 10^8$. Unlike embodiments of the inventive concept, it is to be understood that in case of a plug-shaped phase change layer, a reset characteristic R2 denoted by white squares and/or a set characteristic S2 denoted by white circles is deteriorated in endurance characteristic due to electromigration (EM). As an example, it is to be understood that reset resistance decreases at a cycle of about $1.0 \times 10^7$ (reset failure <500 k$\Omega$) and set resistance increases at a cycle of about $5.0 \times 10^7$ to cause a set failure.

Figure 10A:
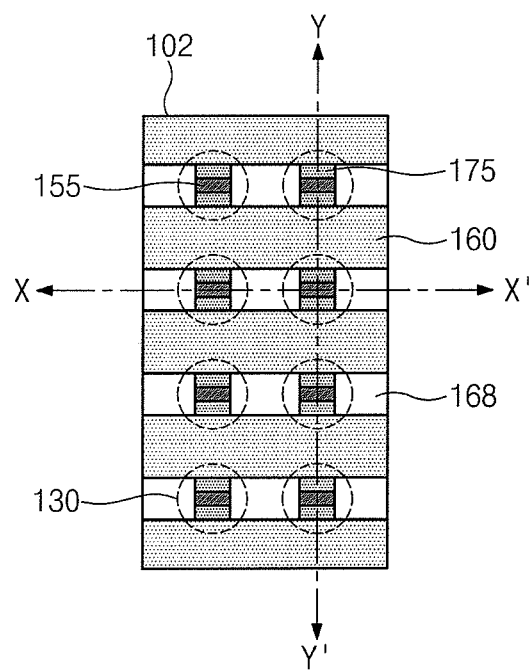
Figure 10B:
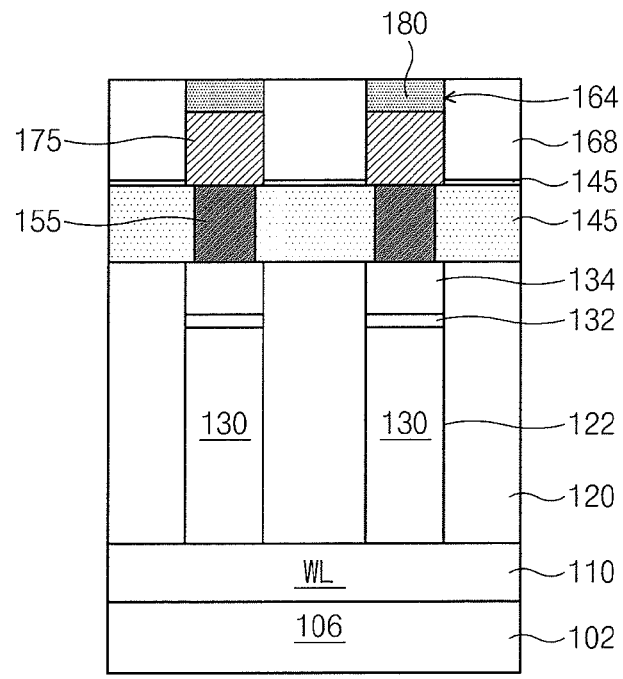
Figure 10C:
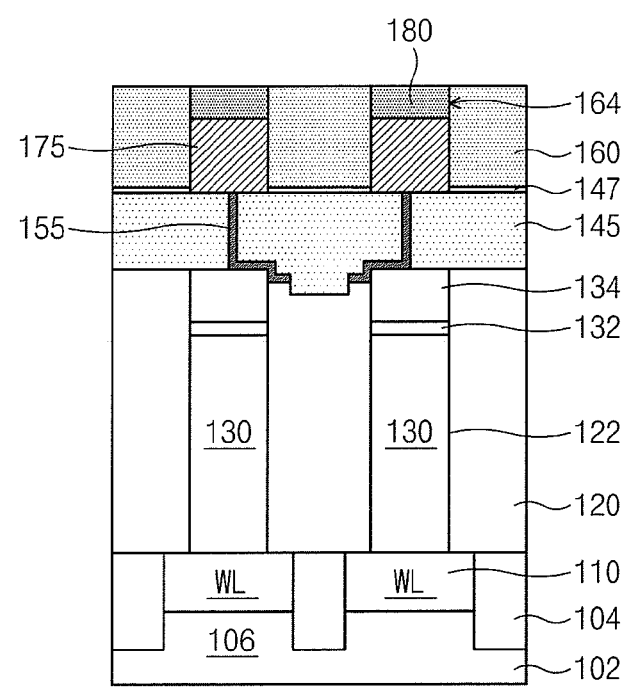

Referring to FIGS. 10A, 10B, and 10C, a top electrode 180 may be formed at a recessed region 164. The top electrode 180 may be formed by, for example, depositing a conductive material on the mold layers 160 and 168 and performing a planarization process. The top electrode 180 may be formed to have, for example, an island shape corresponding to a plurality of phase change layers 175 in one-to-one correspondence. The top electrode 180 may be formed of the same or similar material as the bottom electrode 155. As an example, the top electrode 180 may be formed of TiN. According to this embodiment, since the top electrode 180 is formed as if a damascene process is carried out, it may be self-aligned with the phase change layer 175.

Figure 11A:
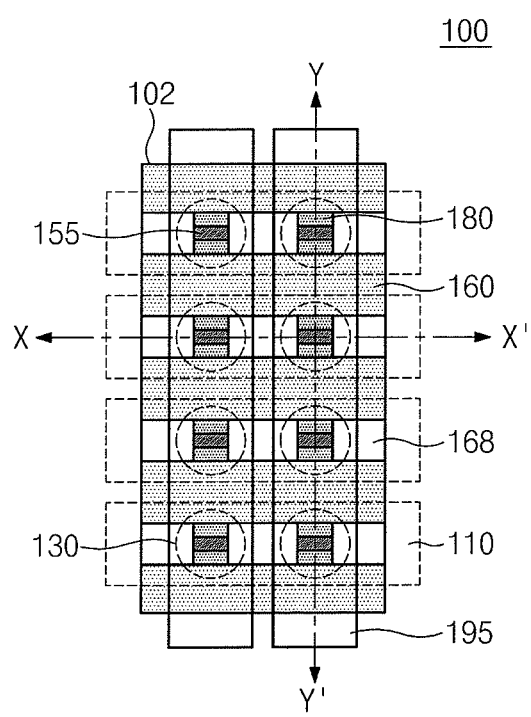
Figure 11B:
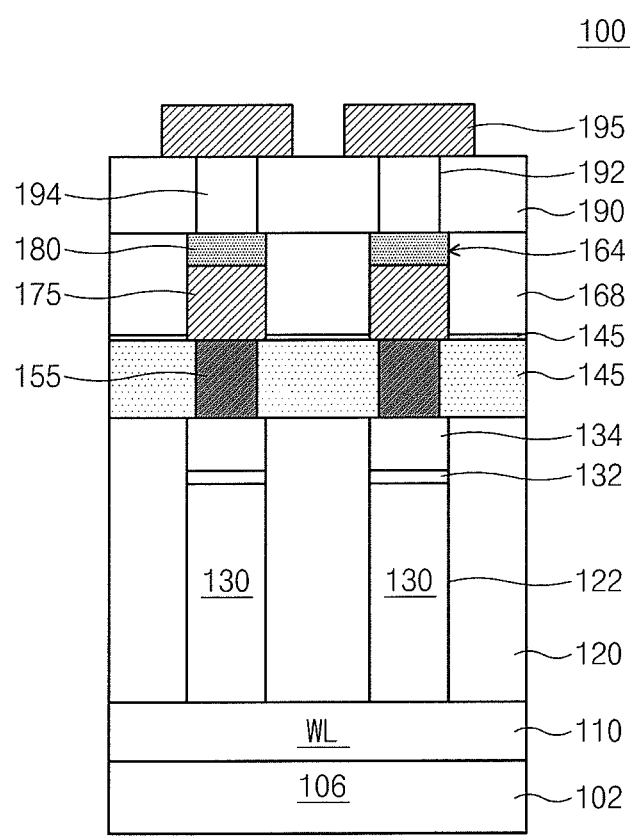
Figure 11C:
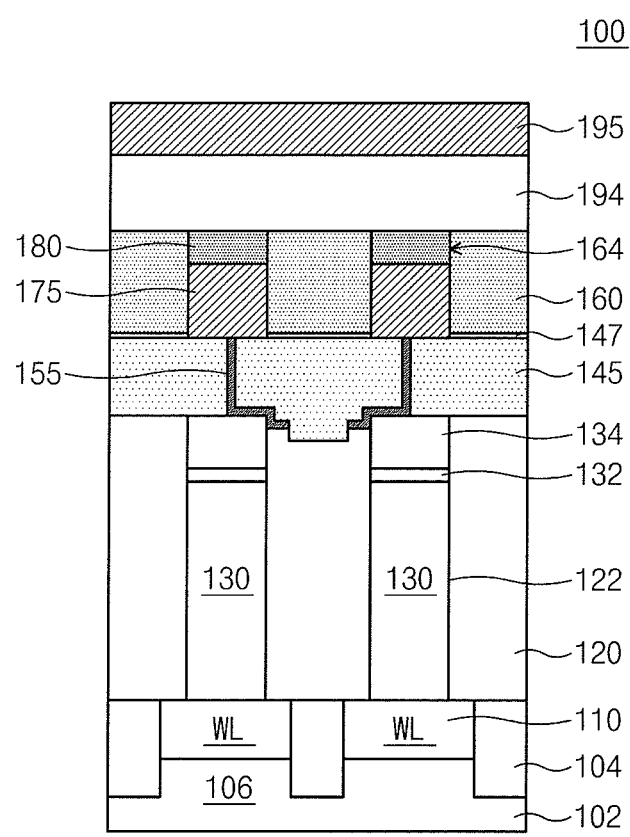

Referring to FIGS. 11A, 11B, and 11C, a bitline 195 may be formed at the cell structure formed through the series of processes to be electrically connected to the top electrode 180. Thus, a phase change memory device 100 may be formed. For example, after a third interlayer dielectric 190 may be formed by depositing an insulating material (e.g., SiO$_2$) on the mold layers 160 and 168, a via hole 192 may be formed to expose the top electrode 180 through the third interlayer dielectric 190. The via hole 192 may be formed, for example, in the shape of line. A top electrode contact 194 may be formed, for example, by filling the via hole 192 with a conductive material (e.g., W, Cu). A bitline 195 may be formed by depositing a conductive material such as, for example, titanium (Ti), tungsten (W), silicon (Si), copper (Cu), tantalum (Ta), molybdenum (Mo), ruthenium (Ru), aluminum (Al), gold (Au), platinum (Pt), silver (Ag) or an alloy including at least one thereof on the third interlayer dielectric 190 and patterning the deposited conductive material. The bitline 195 is connected to the top electrode contact 194. According to this embodiment, since the second interlayer dielectric 145 surrounding the bottom electrode 155 and/or the mold layers 160 and 168 surrounding the phase change layer 175 include SiN having relatively superior thermal conductivity, disturbance between cells may be reduced.

FIGS. 12A to 15A are top plan views illustrating a modified embodiment of a method for forming a bottom electrode in a method for fabricating a phase change memory device according to an embodiment of the inventive concept. FIG. 12B to 15B are cross-sectional views taken along the lines X-X' in FIGS. 12A to 15A, respectively. FIGS. 12C to 15C are cross-sectional views taken along the lines Y-Y' in FIGS. 12A to 15A, respectively.

Figure 12A:
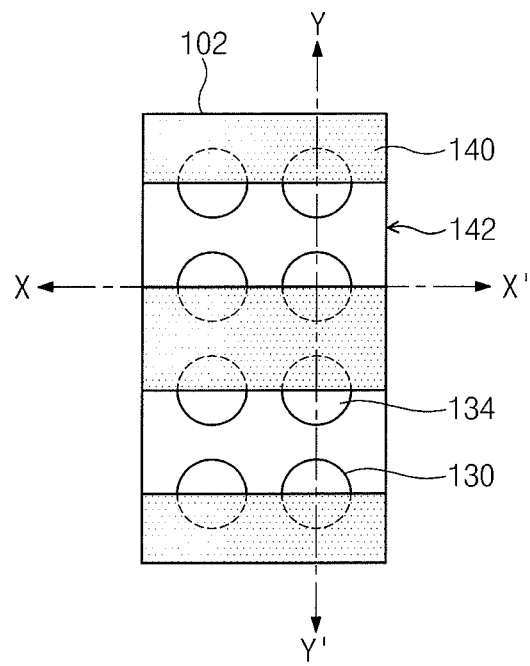
Figure 12B:
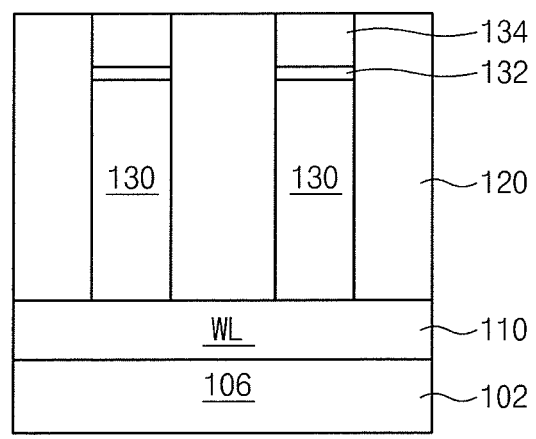
Figure 12C:
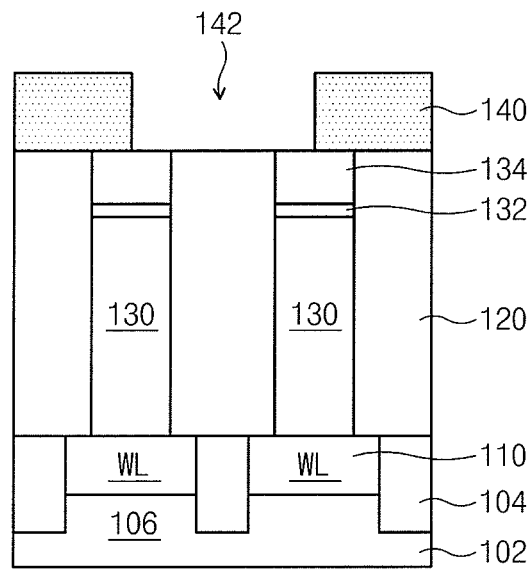

Referring to FIGS. 12A, 12B, and 12C, a first insulating layer 140 having a first opening 142 extending in the X direction may be formed by depositing, for example, an insulating material (e.g., SiN) on the first interlayer dielectric 120 and patterning the deposited insulating material. The first opening 142 may be formed to expose about half of two contact plugs 134 adjacent to each other in the Y direction. During an etching process for forming the first opening 142, a first interlayer dielectric 120 between diodes adjacent to each other in the Y direction may be overetched.

Figure 13A:
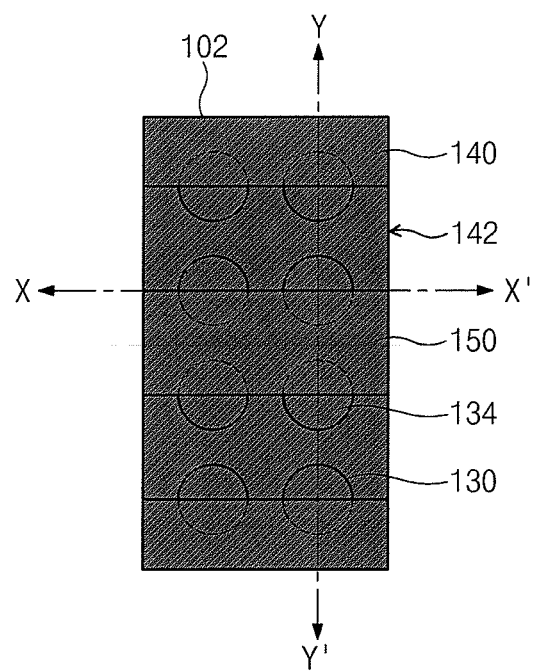
Figure 13B:
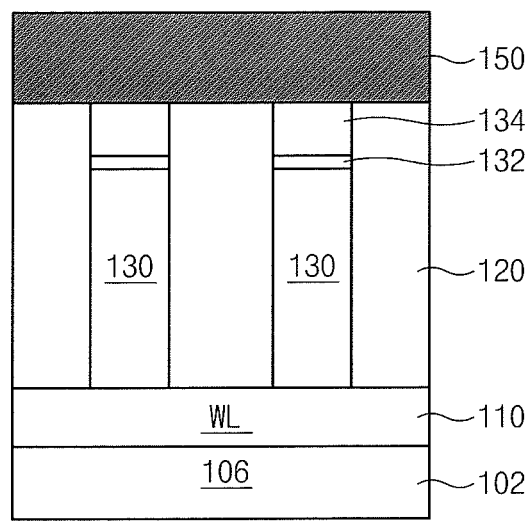
Figure 13C:
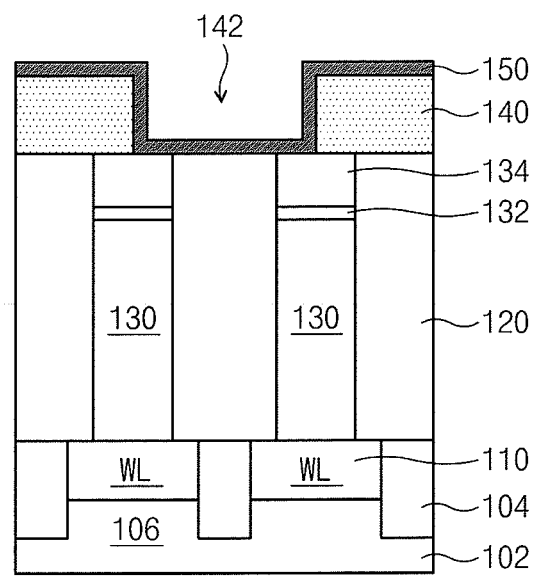

Referring to FIGS. 13A, 13B, and 13C, a conductive layer 150 may be formed by conformally depositing a conductive material on the first insulating layer 140. The conductive layer 150 may be formed by depositing, for example, TiSiN or TiN using physical vapor deposition (PVD) or chemical vapor deposition (CVD). The conductive layer 150 may be deposited to a thickness such that the first opening 142 is not filled up.

Figure 14A:
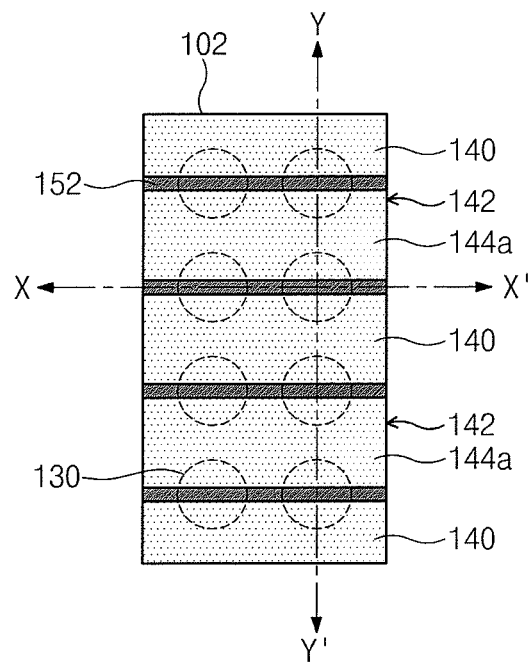
Figure 14B:
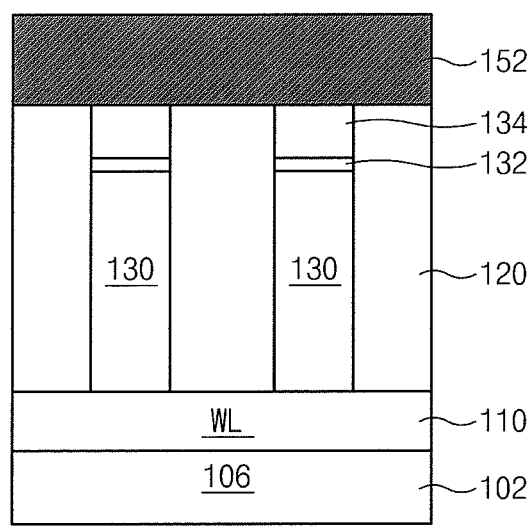

Referring to FIGS. 14A, 14B, and 14C, Y-node separation of the conductive layer 150 may be done to form a spacer electrode 152 which is, for example, continuously extended in the X direction but is separated in the Y direction. As an example, the conductive layer 150 may be etched back to form a spacer-shaped spacer electrode 152 on the sidewall of the first opening 142. Thereafter, the first opening 142 where the spacer electrode 152 is formed may be filled with a second insulating layer 144a by, for example depositing and planarizing, for example, SiN. According to this embodiment, the spacer electrode 152 may be formed in the shape of, for example, a pillar which extends on the sidewall of the first opening 142 in the X direction and is perpendicular from a top surface of a contact plug 134.

Figure 15A:
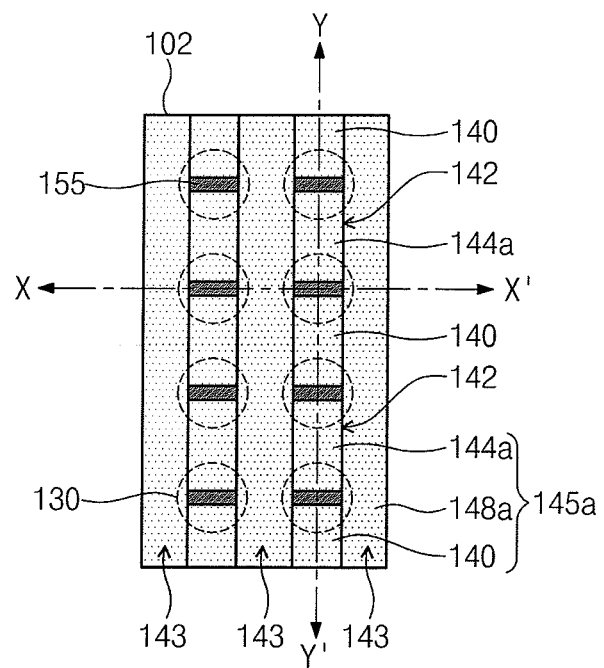
Figure 15C:
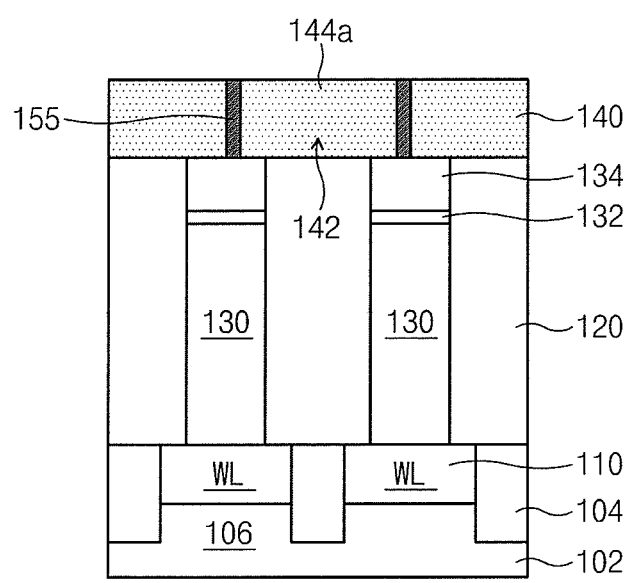

Referring to FIGS. 15A, 15B, and 15C, X-node separation of the spacer electrode 152 may be done to form a bottom electrode 155 in the shape of line viewed from the top. As an example, a spacer electrode 152 may be separated in the X direction by forming a second opening 143, extending in the Y direction, between diodes 130 adjacent in the X direction. The second opening 143 may be filled with a third insulating layer 148a by, for example, depositing and planarizing SiN or the like, which allows bottom electrodes 155 to be electrically insulated from each other. The first to third insulating layers 140, 144a, and 148a may constitute a second interlayer dielectric 145a surrounding the bottom electrode 155.

FIGS. 16A to 18A are top plan views illustrating a modified embodiment of a method for forming a phase change layer in a method for fabricating a phase change memory device according to an embodiment of the inventive concept. FIGS. 16B to 18B are cross-sectional views taken along the lines X-X' in FIGS. 16A to 18A, respectively. FIGS. 16C to 18C are cross-sectional views taken along the lines Y-Y' in FIGS. 16A to 18A, respectively.

Figure 16A:
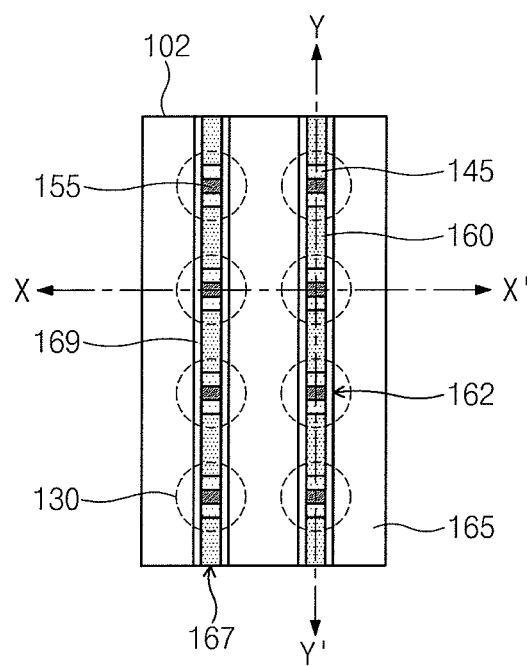
Figure 16B:
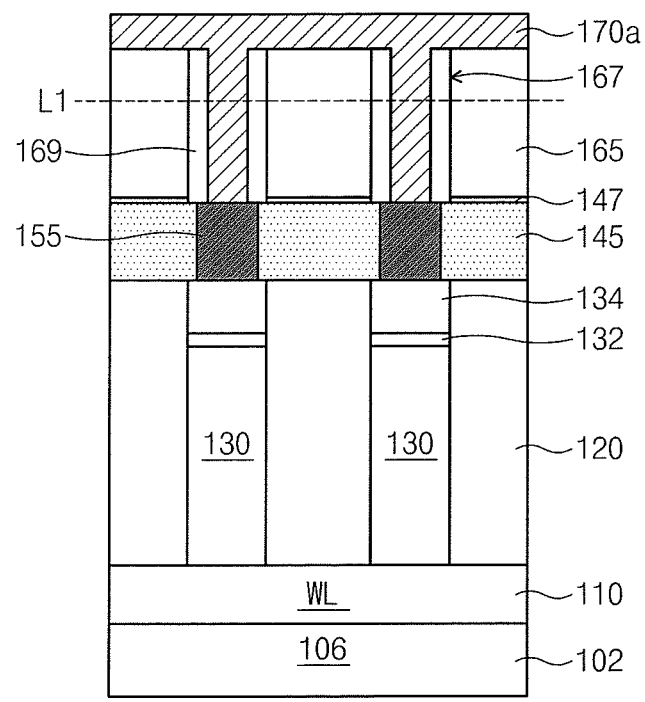
Figure 16C:
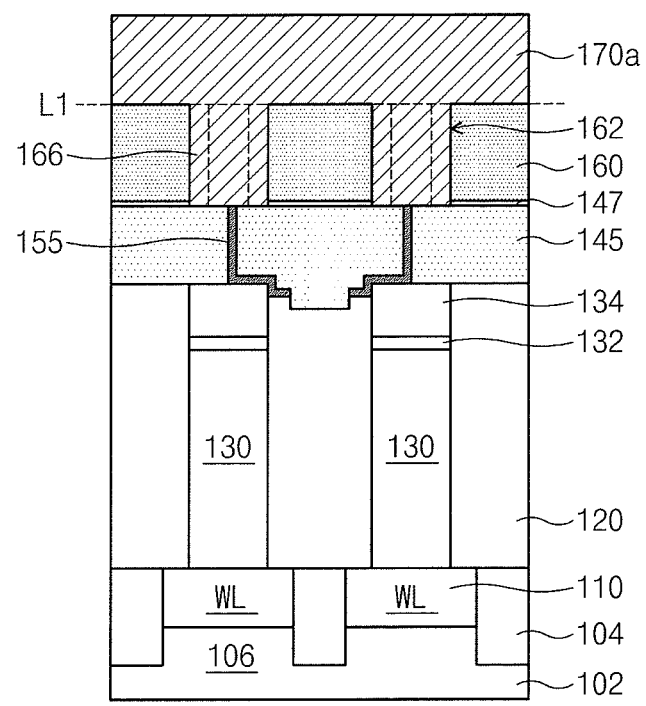

Referring to FIGS. 16A, 16B, and 16C, a spacer 169 may be formed on an inner wall of a second trench 167 of a GST mold layer 165. The spacer 169 may be formed of an insulating material such as, for example, SixNy, SiOx, SiON, TiOx, ZrOx, MgOx, HfOx or a combination thereof. The spacer 169 may allow the width of the second trench 167 to be reduced below a limit of a photolithography process. A phase change material layer 170a may be deposited on the mold layers 160 and 165. The width of the phase change material layer 170a filling the second trench 167 may be also reduced below the limit of the photolithography process. The phase change material layer 170a and the GST mold layer 165 may be planarized to a height L1 at which the isolation mold layer 160 is exposed. As another example, a second spacer 166 may be further formed on an inner wall of the first trench 162. Since the width of the first trench 162 is reduced due to the second spacer 166, the width of the phase change material layer 170a may be reduced. As a result, the volume of a phase change layer 175a described later may be reduced.

Figure 17A:
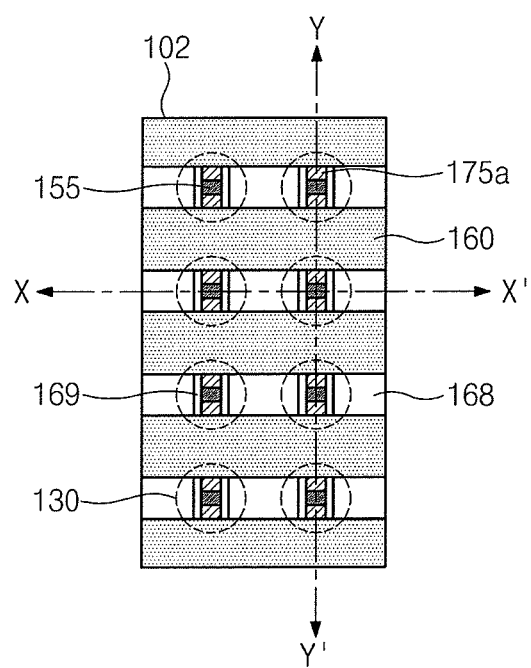
Figure 17B:
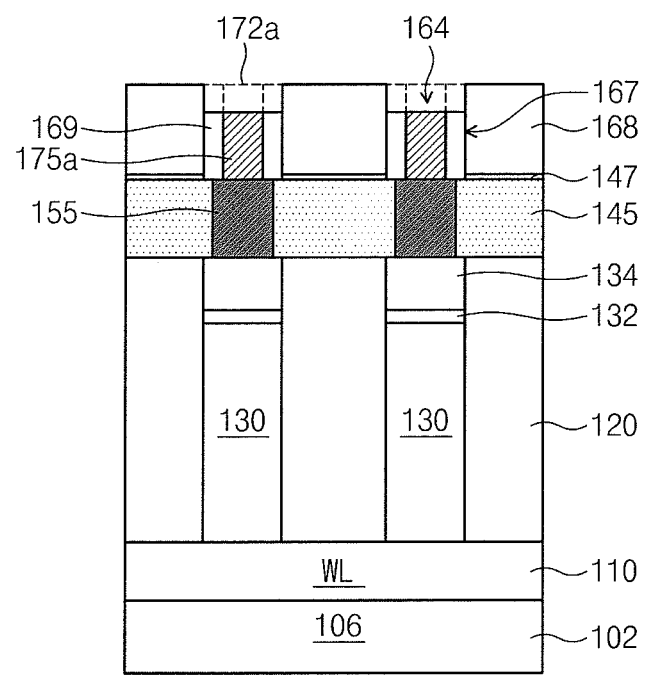
Figure 17C:
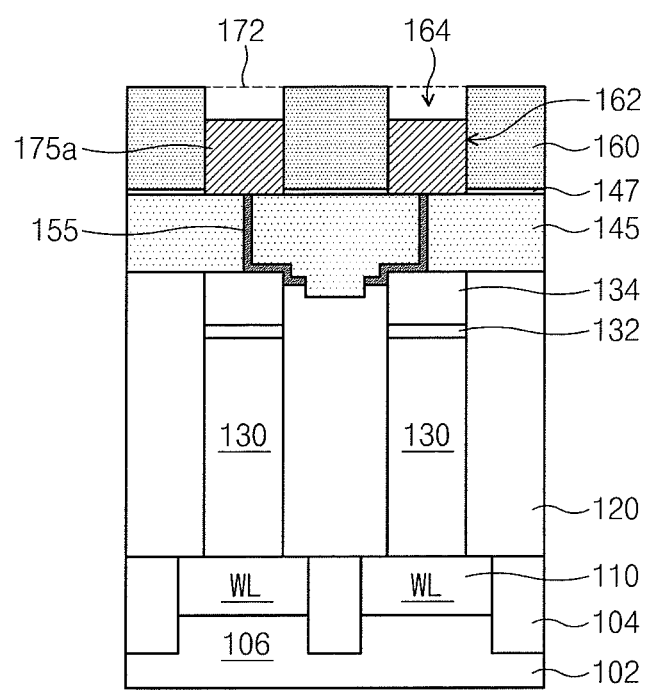

Referring to FIGS. 17A, 17B, and 17C, a planarized phase change material pattern 172a may be formed by, for example, the planarization process to be isolated in the X and Y directions. According to the planarization process, an upper portion of the GST mold layer 165 may, for example, be partially removed to form a planarized GST mold layer 168 having the same or similar height as the isolation mold layer 160. Afterwards, a phase change layer 175a may be formed by, for example, recessing the phase change material pattern 172a. The spacer 169 may be also recessed during the recessing process. Thus, a recessed region 164 defined by the first and second trenches 162 and 167 may remain.

Figure 18A:
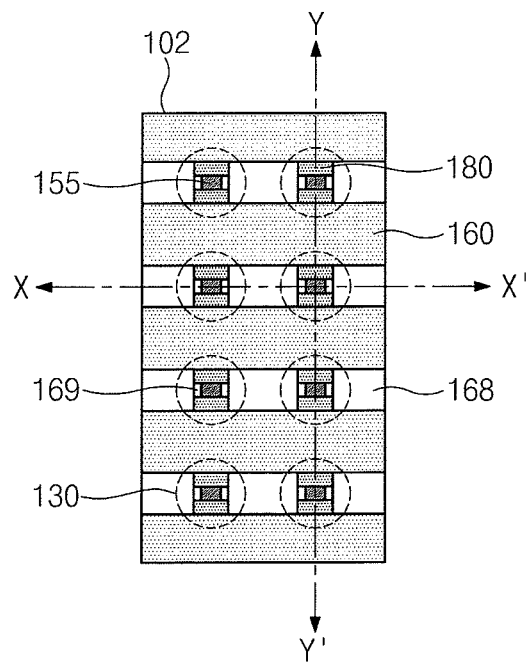
Figure 18B:
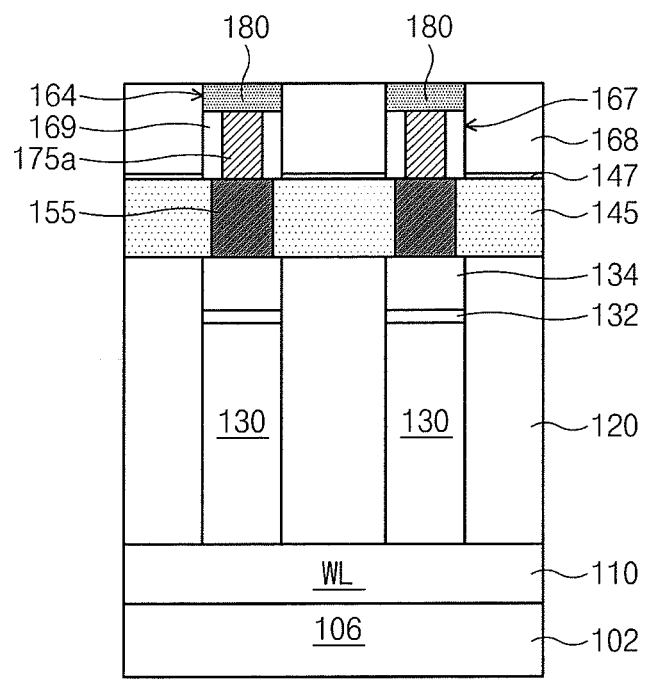
Figure 18C:
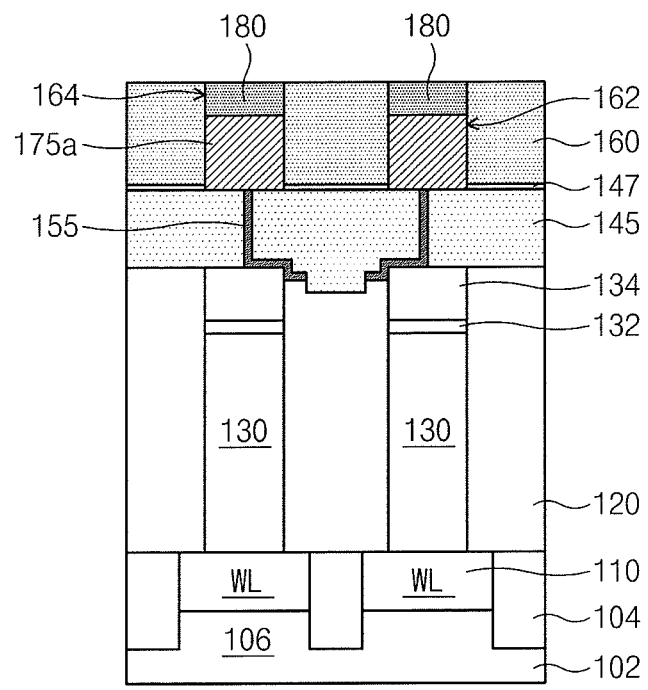

Referring to FIGS. 18A, 18B, and 18C, a top electrode 180 may be formed at the recessed region 164 by, for example, depositing and planarizing a conductive material. The top electrode 180 may be formed in a self-aligned fashion with respect to the phase change layer 175a. According to this modified embodiment, the width of the second trench 167 may be reduced due to the spacer 169 to further minimize the volume of the phase change layer 175a. As illustrated in FIG. 16C, if the width of the first trench 162 is reduced due to the second spacer 166, the volume of the phase change layer 175 may be further reduced.

FIGS. 19A to 21A are top plan views illustrating another modified embodiment of a method for forming a phase change layer in a method for fabricating a phase change memory device according to an embodiment of the inventive concept. FIGS. 19B to 21B are cross-sectional views taken along the lines X-X' in FIGS. 19A to 21A, respectively. FIGS. 19C to 21C are cross-sectional views taken along the lines Y-Y' in FIGS. 19A to 21A, respectively.

Figure 19A:
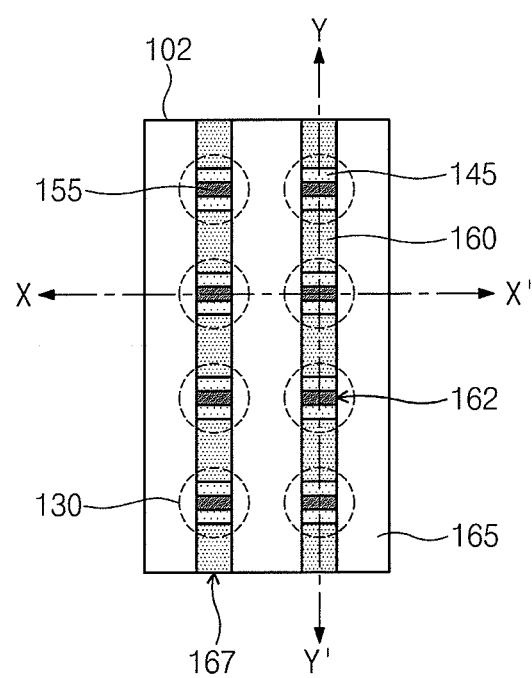
Figure 19B:
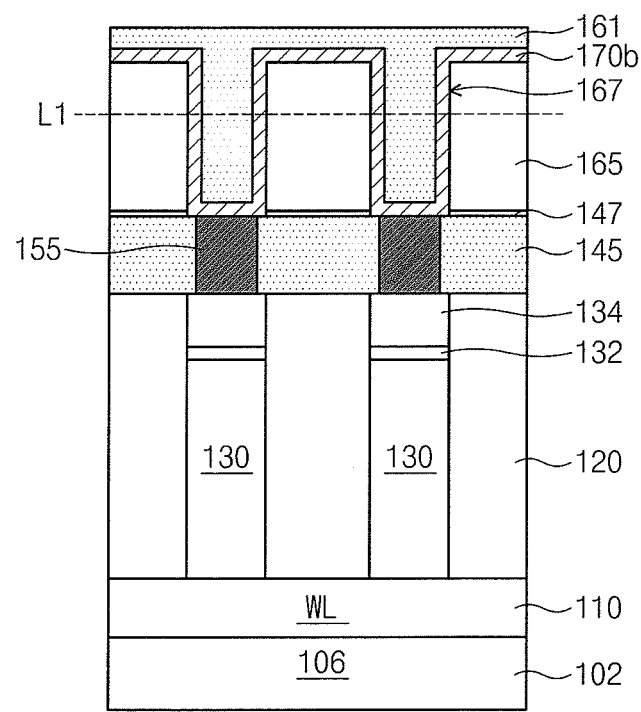
Figure 19C:
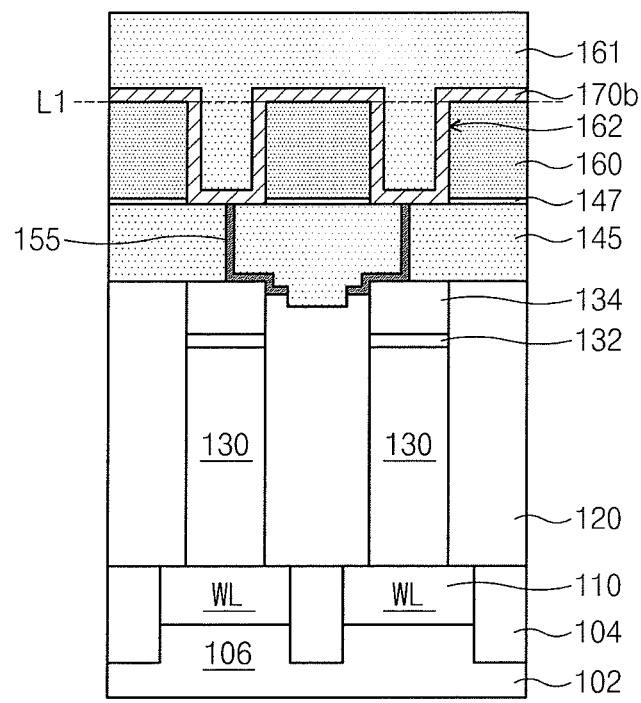

Referring to FIGS. 19A, 19B, and 19C, a phase change layer 170b may be formed on mold layers 160 and 165. According to this modified embodiment, the phase change material layer 170b may be conformally formed along profiles of a first trench 162 and a second trench 167 by means of, for example, atomic layer deposition (ALD) or chemical vapor deposition (CVD). Afterwards, a gap-fill insulating layer 161 may be deposited on the phase change material layer 170b. The gap-fill insulating layer 161 may be formed by, for example, depositing an insulating material (e.g., $SiO_2$, SiON, SiN, and $Si_3N_4$). The gap-fill insulating layer 161, the phase change material layer 170b, and a GST mold layer 165 may be planarized to a height L1 at which an isolation mold layer 160 is exposed.

Figure 20A:
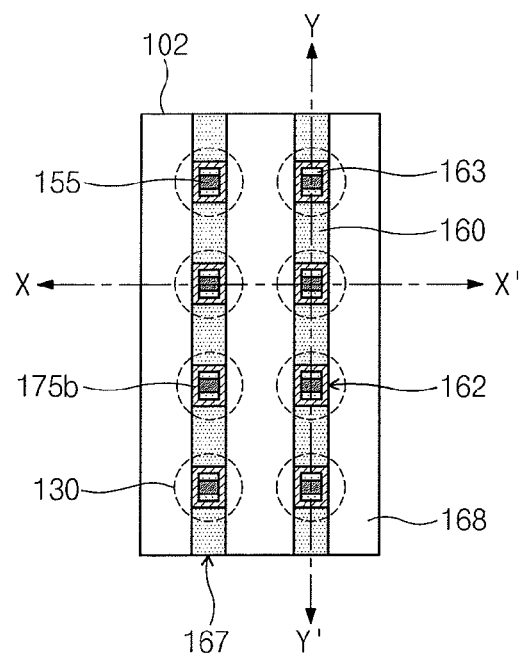
Figure 20B:
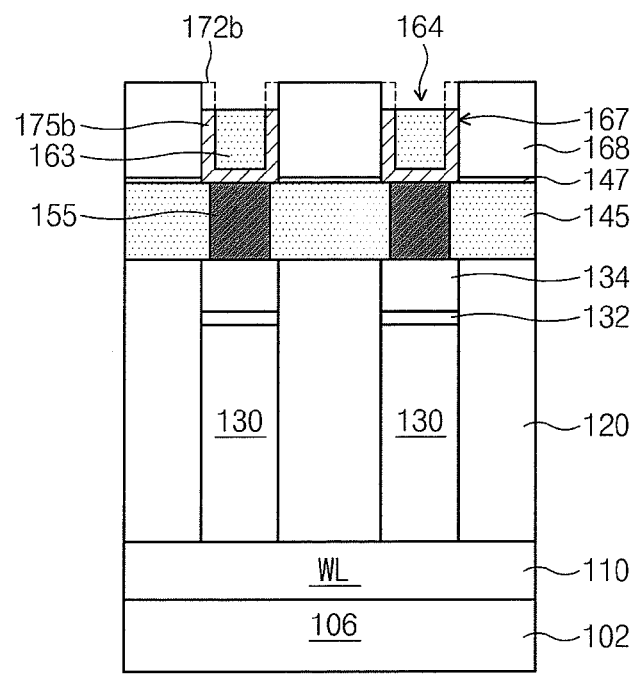
Figure 20C:
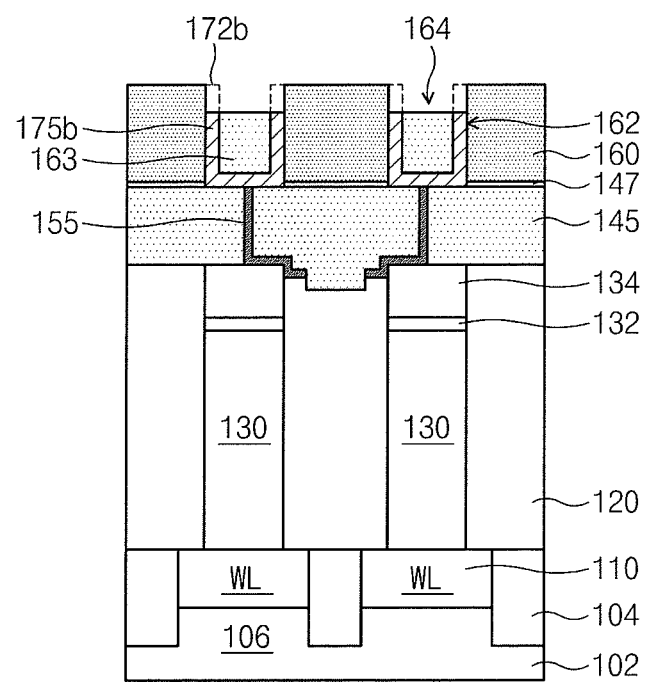

Referring to FIGS. 20A, 20B, and 20C, a planarized phase change material pattern 172b may be formed to be separated in the X and Y directions by means of, for example, the planarization process. Afterwards, a phase change layer 175b may be formed by, for example, recessing the phase change material pattern 172b. According this modified embodiment, the phase change layer 175b may be formed in, for example, a U-shape and thus its volume may be more reduced than in a bulk shape. As a result, endurance may be enhanced and power consumption may be reduced.

Figure 21A:
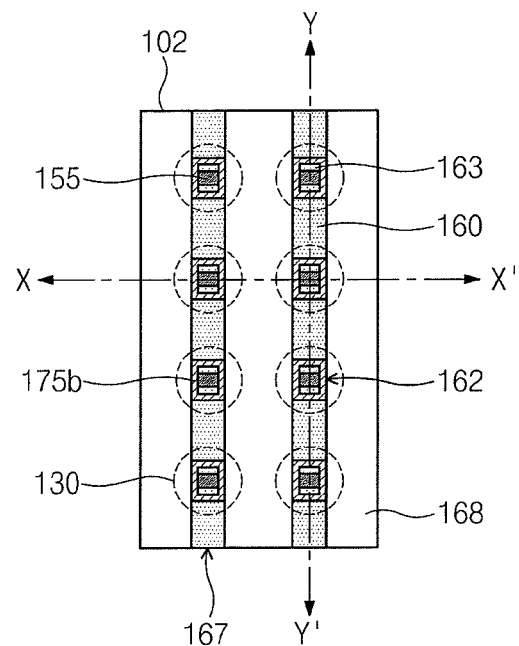
Figure 21B:
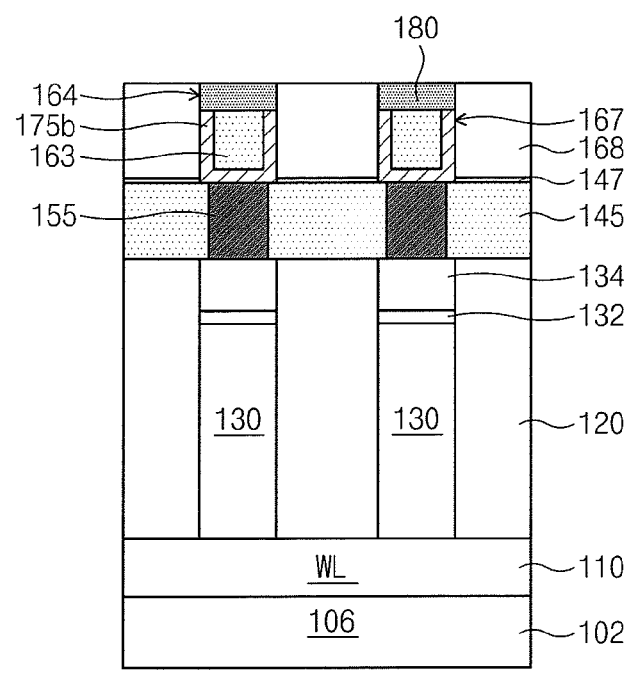
Figure 21C:
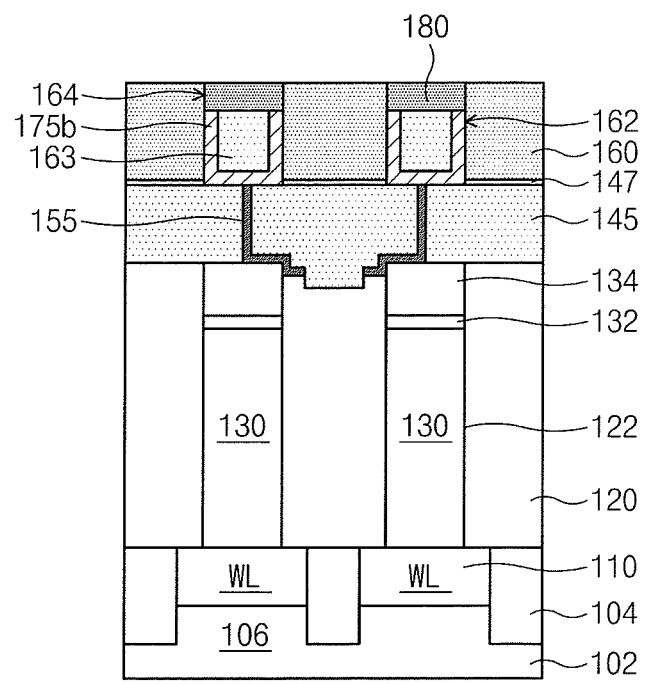

Referring to FIGS. 21A, 21B, and 21C, a top electrode 180 may be formed at a recessed region 164 by, for example, depositing and planarizing a conductive material in a self-aligned fashion with respect to the phase change layer 175b. Thus, a cell including a phase change layer 175b having reduced volume may be formed.

FIGS. 22A to 25A are top plan views illustrating another modified embodiment of a method for forming a phase change layer in a method for fabricating a phase change memory device according to an embodiment of the inventive concept.

FIGS. 22B to 25B are cross-sectional views taken along the lines X-X' in FIGS. 22A to 25A, respectively. FIGS. 22C to 25C are cross-sectional views taken along the lines Y-Y' in FIGS. 22A to 25A, respectively. FIGS. 26A to 33A are top plan views illustrating a method for fabricating a phase change memory device according to another embodiment of the inventive concept.

Figure 22A:
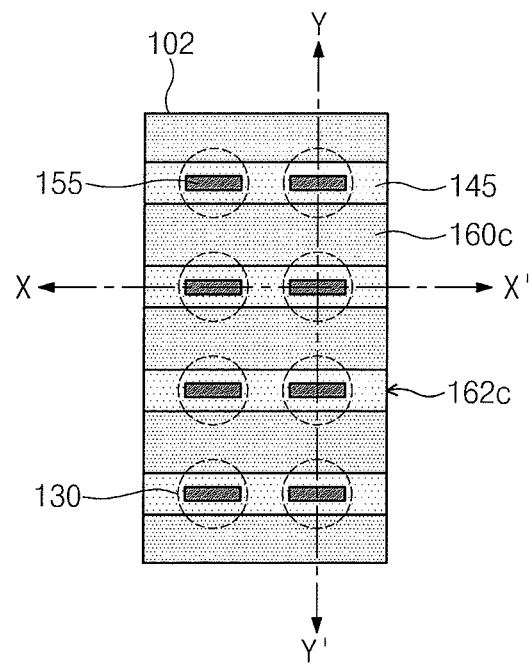
Figure 22B:
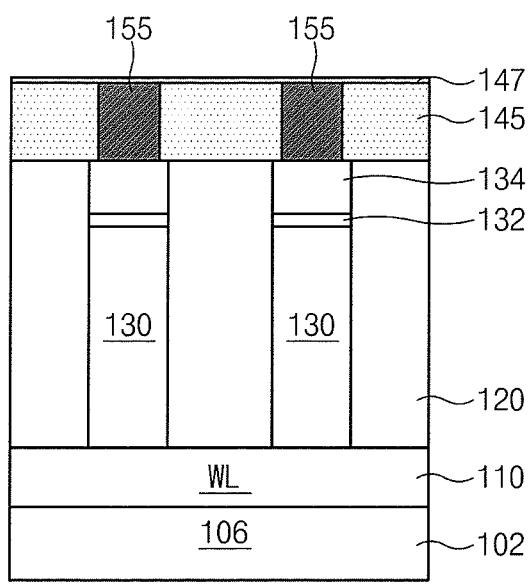
Figure 22C:
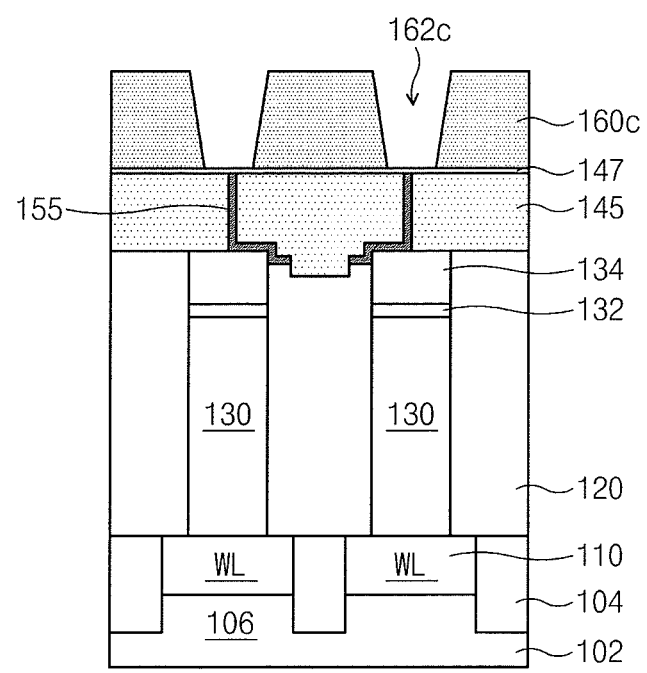

Referring to FIGS. 22A, 22B, and 22C, an isolation mold layer 160c including a trench 162c having an inclined inner wall may be formed. For example, a first trench 162c extending in an X direction may be formed by depositing and patterning an insulating material such as SiN. The first trench 162c may be formed to have a wide top and a narrow bottom surface, as shown in FIG. 22C. Alternatively the first trench 162c may be foamed to have a top and a bottom surface whose widths are nearly equal to each other.

Figure 23A:
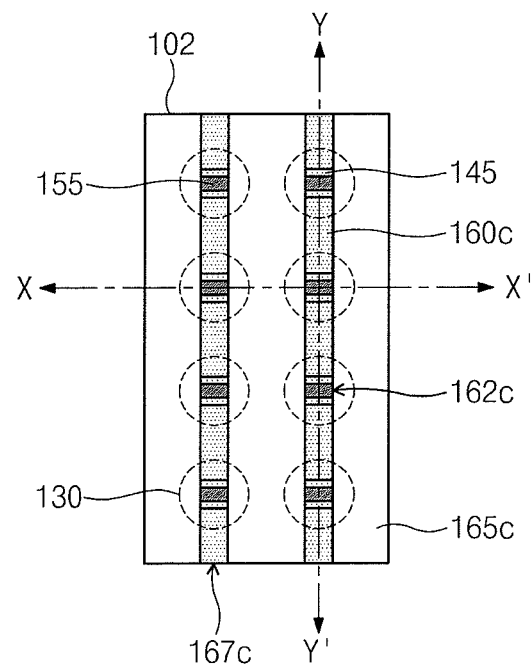
Figure 23B:
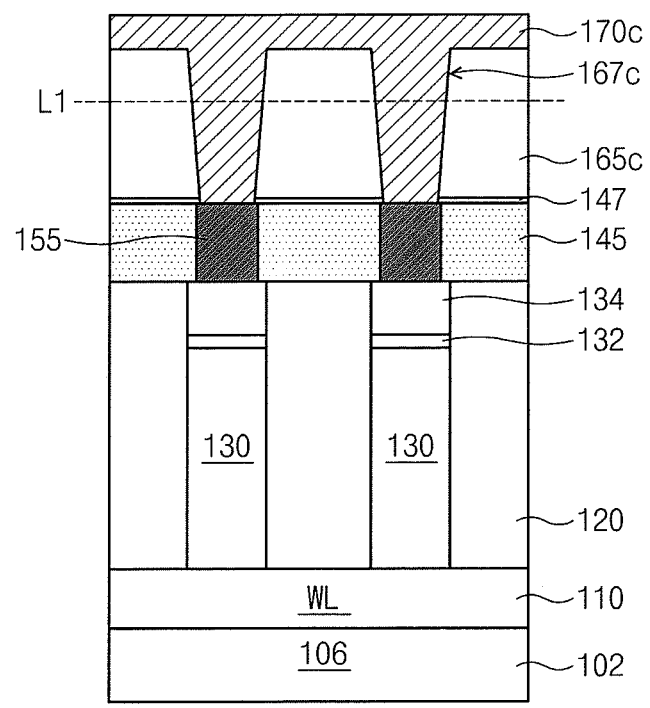
Figure 23C:
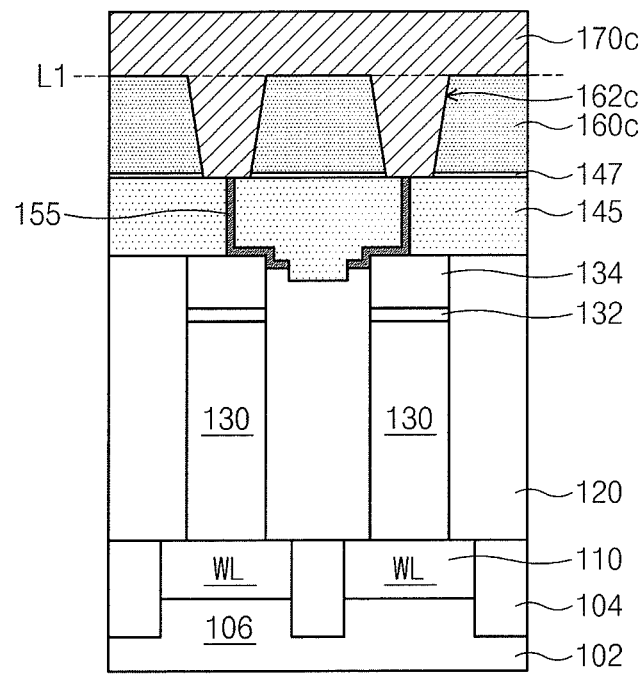

Referring to FIGS. 23A, 23B, and 23C, a GST mold layer 165c may be formed. The GST mold layer 165c may be formed, for example, in the shape of line by depositing and patterning, for example, HDP $SiO_2$ and have a second trench 167c which crosses the isolation mold layer 160c and extends in a Y direction where bottom electrodes 155 are exposed. Portions of an etch-stop layer 147, e.g., portions formed on bottom surfaces of the first and second trenches 162c and 167c may be removed during an etching process for forming the second trench 167c. Thus, the bottom electrode 155 may be exposed through the first and second trenches 162c and 167c. As shown in FIG. 23B, the second trench 167c may be formed to have a wide top and a narrow bottom surface. Accordingly, an area of the bottom electrode 155 exposed through the second trench 167c may be reduced.

A phase change material layer 170c may be deposited on mold layers 160c and 165c. The phase change material layer 170c may be deposited to have a thickness enough to fill up the first and second trenches 162c and 167c. The phase change material layer 170c and the GST mold layer 165c may be planarized to a height at which the isolation mold layer 160 is exposed.

Figure 24A:
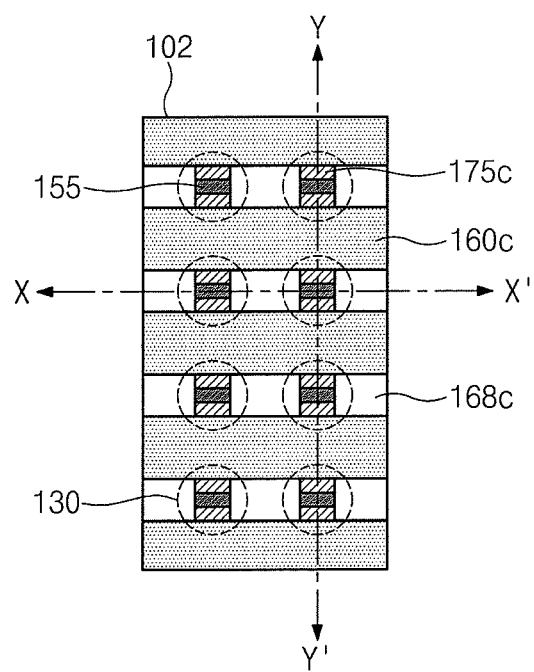
Figure 24B:
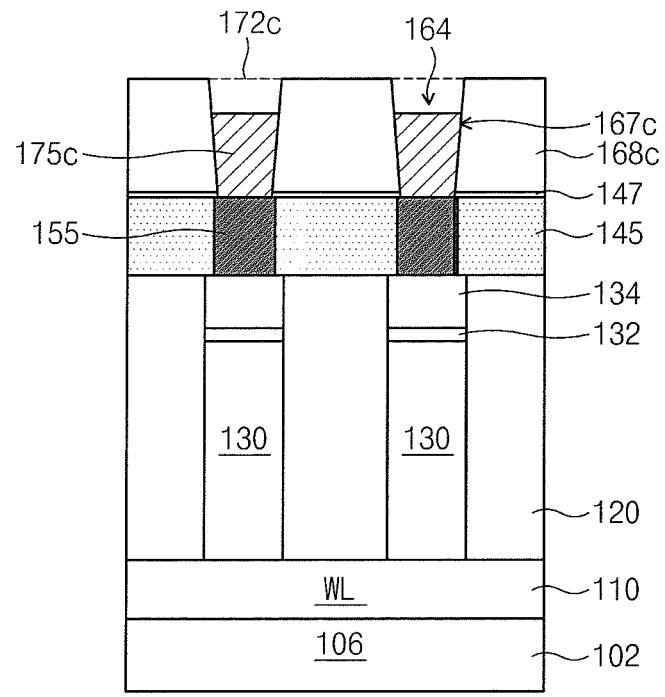
Figure 24C:
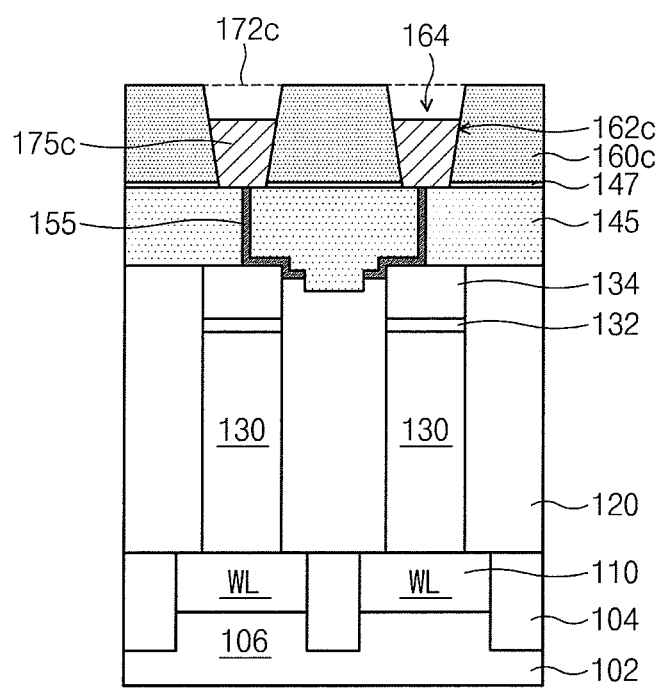

Referring to FIGS. 24A, 24B, and 24C, a planarized phase change material pattern 172c may be formed by, for example, the planarization process to be separated in the Y and Y directions. Afterwards, a phase change layer 175c may be formed by, for example, recessing the phase change material pattern 172c. Since the first and second trenches 162c and 167c or the second trench 167c tapers down, a contact area with the phase change layer 175c and the bottom electrode 155 may be minimized to reduce current applied to the bottom electrode 155. Thus, power consumption may be reduced.

Figure 25A:
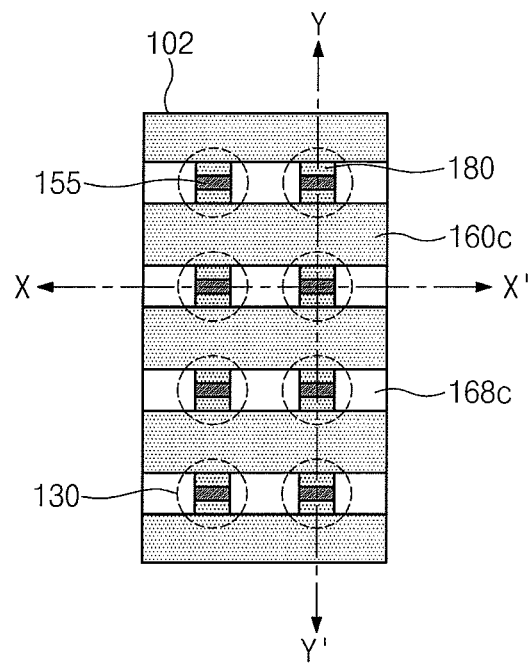
Figure 25B:
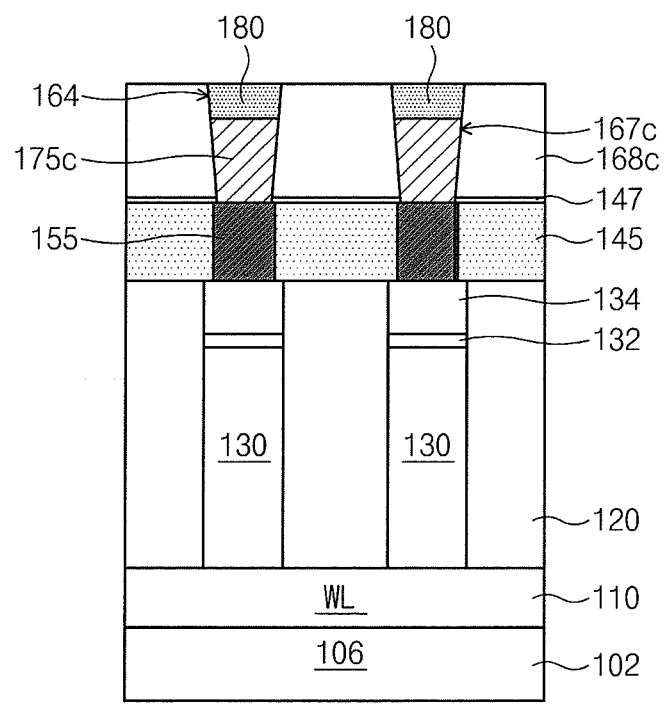
Figure 25C:
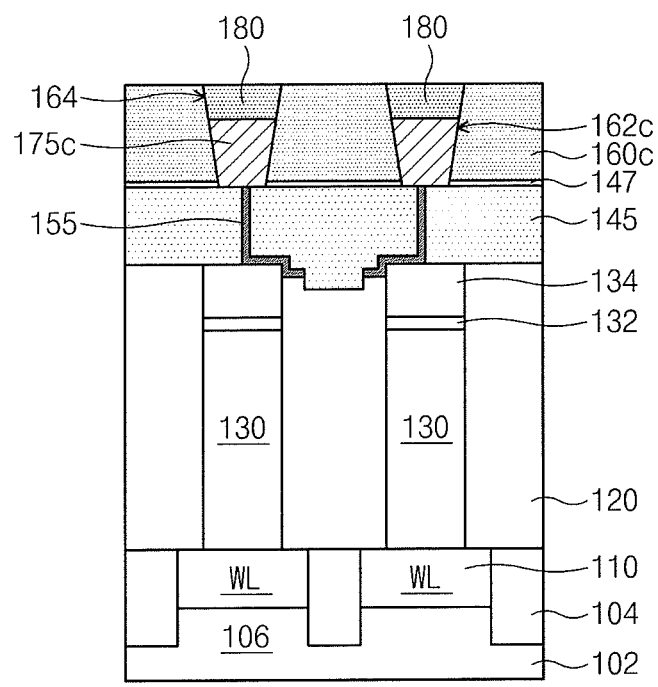

Referring to FIGS. 25A, 25B, and 25C, a top electrode 180 may be formed at a recessed region 164 in a self-aligned fashion. According to this modified embodiment, a cell including a phase change layer 175c having reduced contact area with the bottom electrode 155 may be formed.

FIGS. 26A to 33A are top plan views illustrating a method for fabricating a phase change memory device according to another embodiment of the inventive concept. FIGS. 26B to 33B are cross-sectional views taken along the lines X-X' in FIGS. 26A to 33A, respectively. FIGS. 26C to 33C are cross-sectional views taken along the lines Y-Y' in FIGS. 26A to 33A, respectively.

Figure 26A:
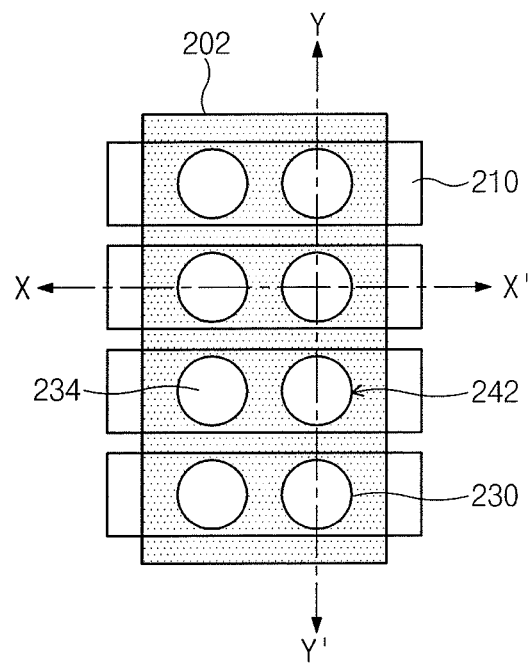
Figure 26B:
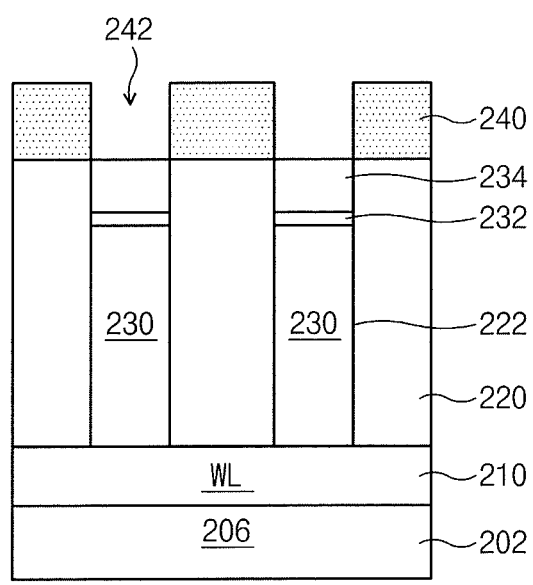
Figure 26C:
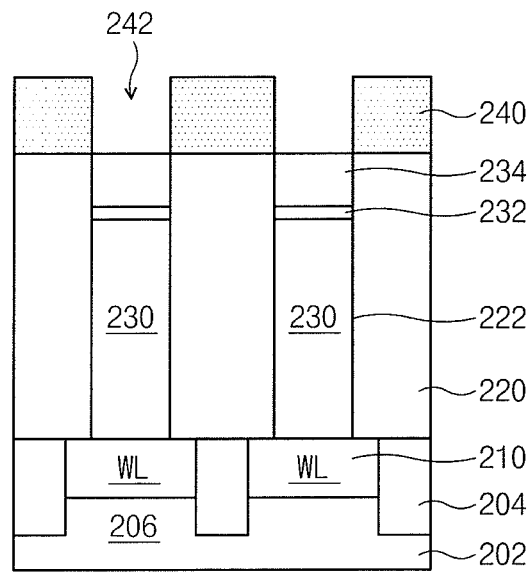

Referring to FIGS. 26A, 26B, and 26C, a semiconductor substrate 202 may be provided. A wordline 210 may be formed at an active region 206 of the semiconductor substrate 202 to extend in an X direction. The active region 206 may be defined by a device isolation layer 204. A first interlayer dielectric 220 may be formed on the semiconductor substrate 202, and a diode 230 may be formed to be electrically connected to a wordline 210 through the first interlayer dielectric 220. The diode 230 may be formed by stacking, for example, P-type and N-type semiconductor layers in a through-hole 222 formed to expose the wordline 210 through the first interlayer dielectric 220. A contact plug 234 may be formed on the diode 230. A silicide layer 232 may be further formed between the diode 230 and the contact plug 234. A first insulating layer 240 having a first opening 242 formed to expose the contact plug 234 may be formed by, for example, depositing and patterning an insulating material, such as SiN, on the first interlayer dielectric 220.

Figure 27A:
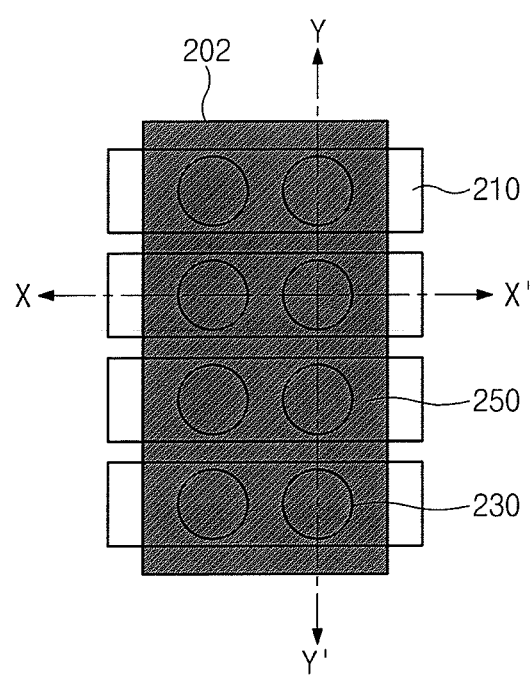
Figure 27B:
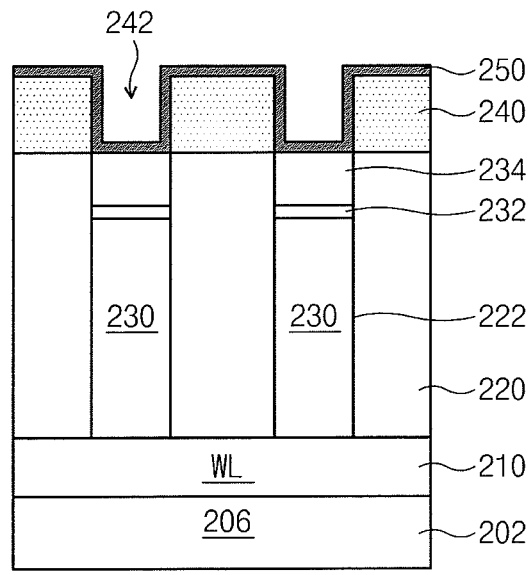
Figure 27C:
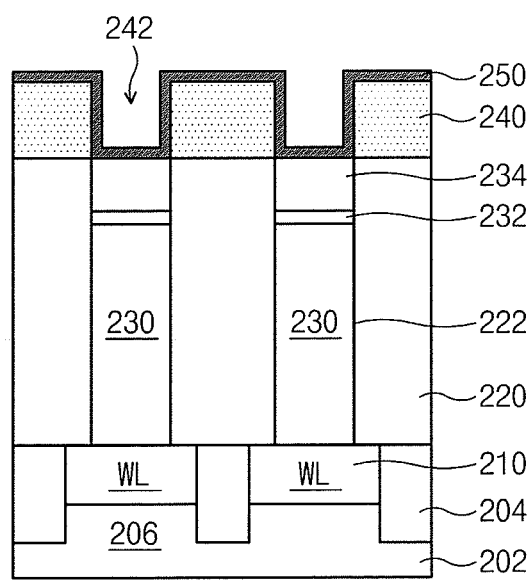

Referring to FIGS. 27A, 27B, and 27C, a conductive layer 250 may be formed by depositing a conductive material on the semiconductor substrate 202. For example, TiN or TiSiN may be conformally deposited along a profile of the first insulating layer 240. The conductive layer 250 may have, for example, a U-shape that is in contact with the contact plug 234 within the first opening 242.

Figure 28A:
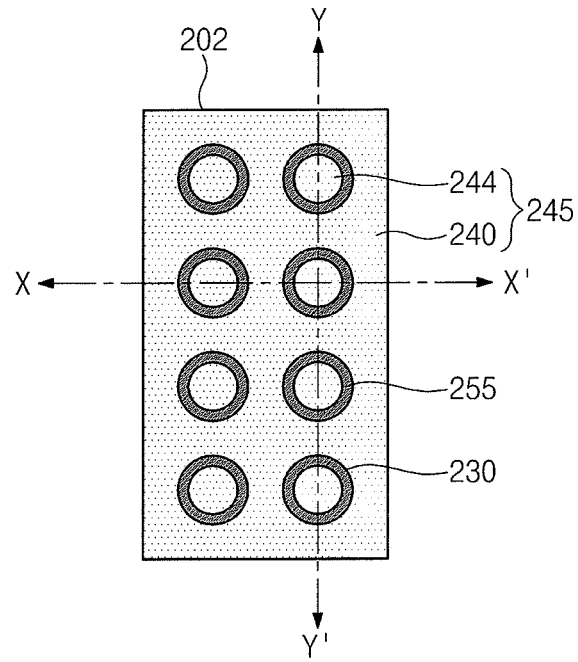
Figure 28B:
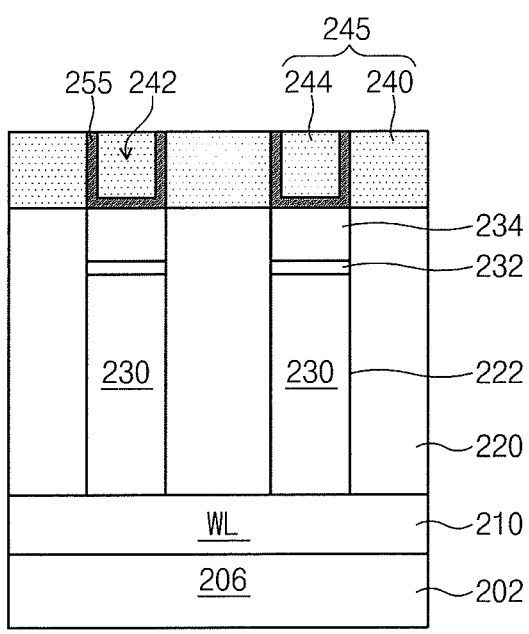
Figure 28C:
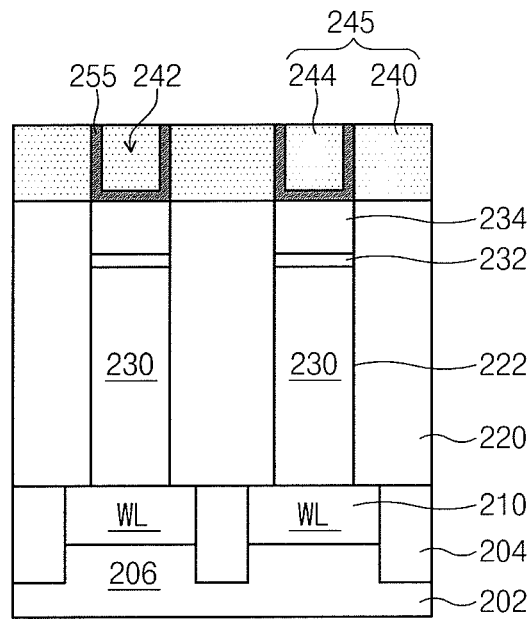

Referring to FIGS. 28A, 28B, and 28C, the first opening 242 may be filled with a second insulating layer 244. The second insulating layer 244 may be formed by depositing, for example, the same or similar insulating material, such as SiN, to a height enough to fill up the first opening 242. Afterwards, the conductive layer 250 may be isolated by means of, for example, a planarization process (e.g., CMP or etch-back process) to be formed as a bottom electrode 255. Although the bottom electrode 255 has a circular shape viewed from the top as shown in FIG. 28A, the inventive concept is not intended to be limited thereto and the bottom electrode 255 may have any shape such as, for example, an elliptical shape or a polygonal shape. The first insulating layer 240 and the second insulating layer 244 may constitute a second interlayer dielectric 245 separating and insulating bottom electrodes 255 from each other.

Figure 29A:
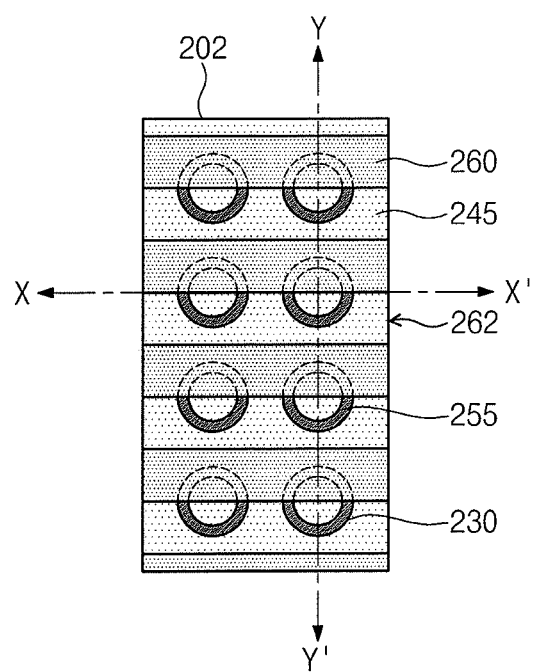
Figure 29B:
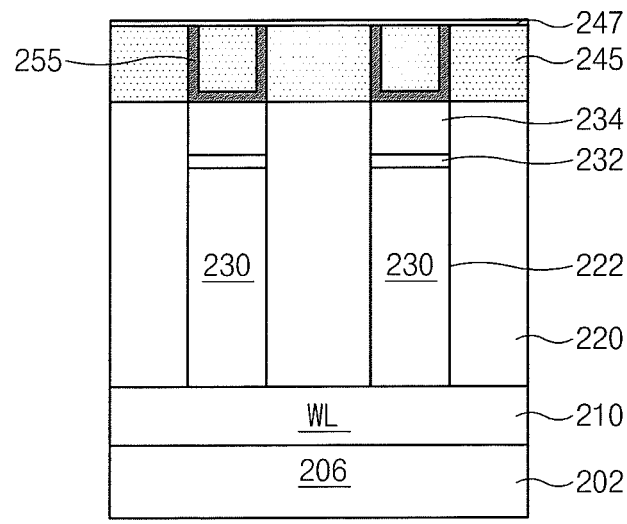
Figure 29C:
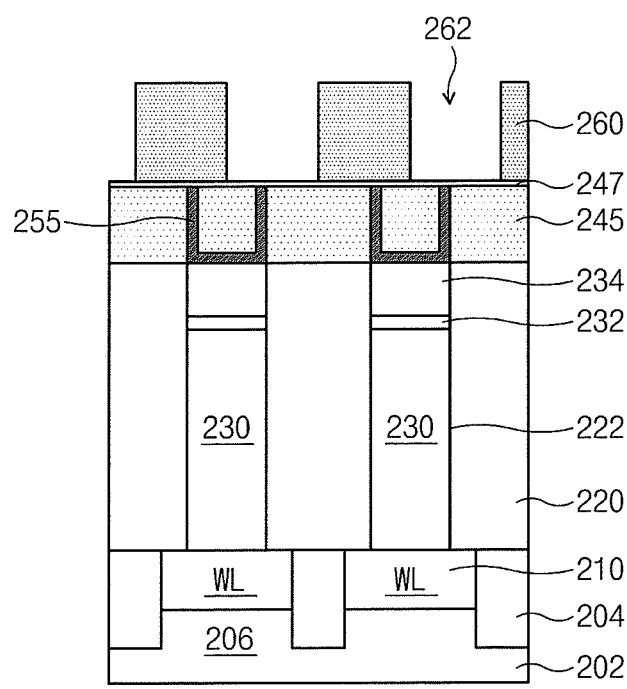

Referring to FIGS. 29A, 29B, and 29C, an etch-stop layer 247 may be formed on the second interlayer dielectric 245 by, for example, depositing and patterning an insulating material such as SiN. The first mold layer 260 may be formed of, except SiN, an insulating material such as, for example, SiOx, SiON, SiCN, $Si_3N_4$, SiC, C, TiO, ZrOx, MgOx, HfOx, AlOx or a combination thereof. As shown in FIG. 29A, a first trench 262 of the first mold layer 260, e.g., an isolation mold layer may extend in an X direction to pass through a part of (e.g., about half of) the bottom electrode 255. Thus, an exposed portion of the bottom electrode 255 may have, for example, an arc shape.

Figure 30B:
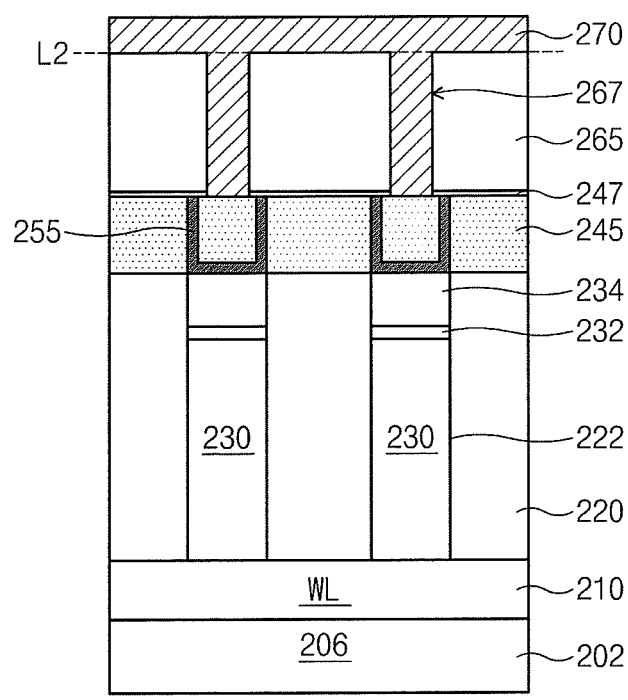
Figure 30C:
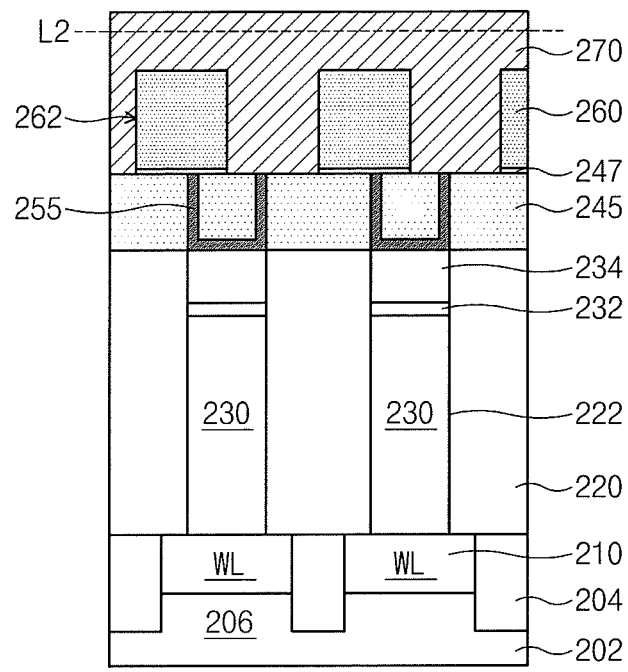

Referring to FIGS. 30A, 30B, and 30C, a second mold layer 265 may be formed. As an example, a second mold layer 265 having a second trench 267 may be formed by depositing and patterning an insulating material such as HDP $SiO_2$. The second mold layer 265 may be formed to have a greater height than the first mold layer 260. The second mold layer 265 may be formed of, except HDP $SiO_2$, an insulating material such as, for example, ALD $SiO_2$, TEOS (Tetra Ethyl Ortho Silicate) $SiO_2$, USG (Undoped Silicon Glass) $SiO_2$, PSG (P doped Silicon Glass) $SiO_2$, SOG (Silicon On Glass) $SiO_2$, PE (Plasma Enhanced) CVD $SiO_2$, PE (Plasma Enhanced) SiON, PE (Plasma Enhanced) SiN, FOX (Flowable oxide), PEOx (Polyethylene Oxide) or a combination thereof. A portion of an etch-stop layer 247 may be removed during an etching process for forming the second trench 267. Thus, the second trench 267 of the second mold layer 265, e.g., a GST mold layer may extend in a Y direction to cross the isolation mold layer 260 and expose the arc-shaped bottom electrode 255, as shown in FIG. 30A. Of the etch-stop layer 247, a portion exposed by the first trench 262 may also be etched to be removed.

A phase change material layer 270 may be formed on the mold layers 260 and 265 by depositing a phase change material such as GST to have a height enough to fill up the first trench 262 and the second trench 267. The phase change material layer 270 may be planarized to a height L2 at which the GST mold layer 267 is exposed, being removed.

Figure 31A:
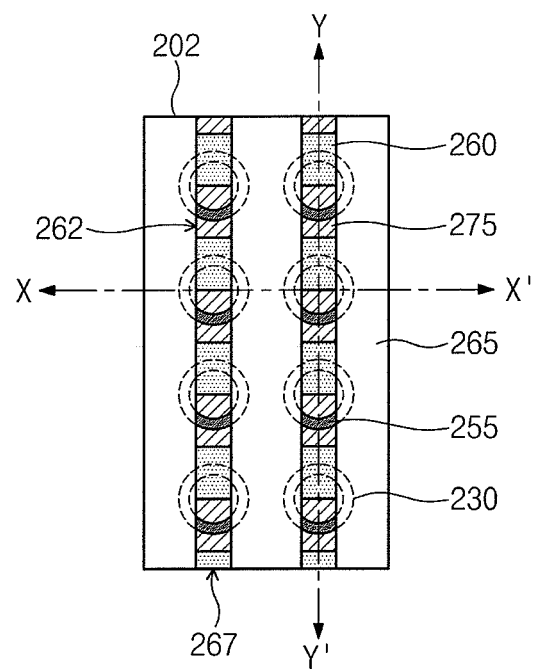
Figure 31B:
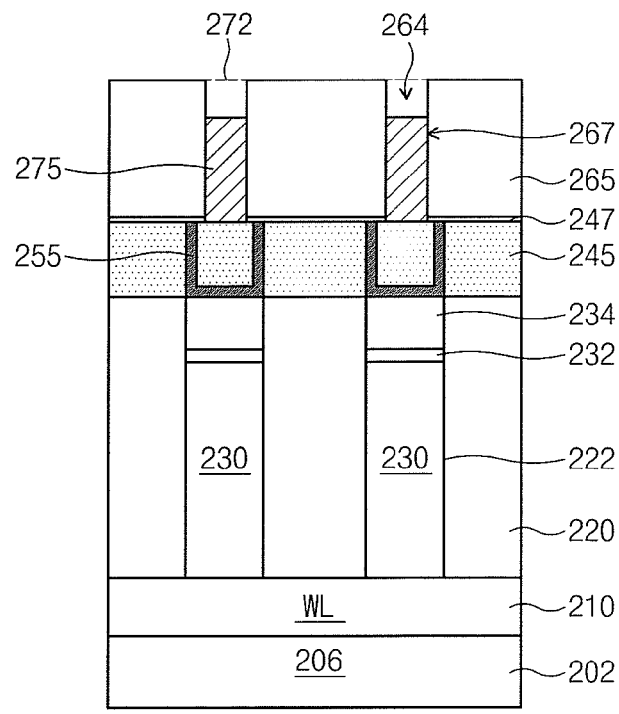
Figure 31C:
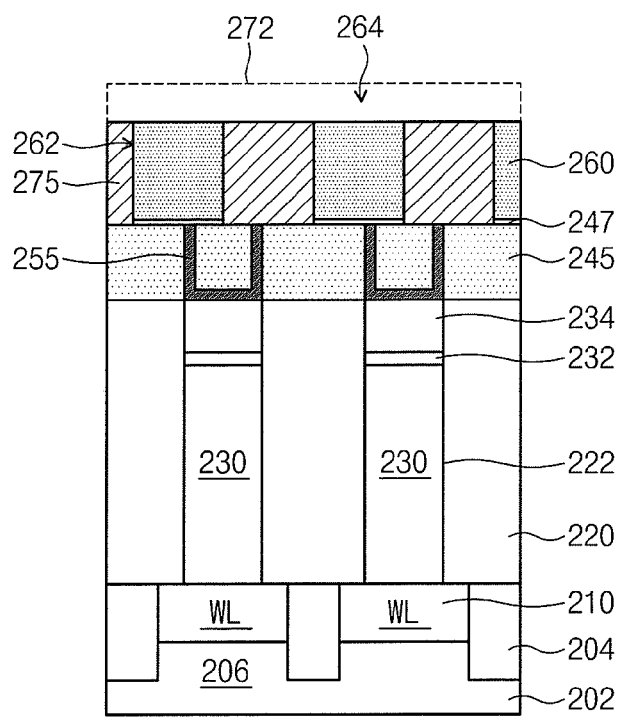

Referring to FIGS. 31A, 31B, and 31C, a phase change material layer 272 planarized by, for example, the planarization process may be formed. The phase change material layer 272 may, for example, be separated in the X direction but continuously extend in the Y direction. A phase change layer 275 separated in the X and Y directions may be formed by, for example, recessing the phase change material pattern 272. An island-shaped phase change layer 275 may be formed to be limited within the first and second trenches 262 and 267 by, for example, removing a phase change material pattern 272 until the isolation mold layer 260 is exposed. The phase change material pattern 272 may be removed by means of, for example, a CMP or etch-back process. The phase change layer 275 may be recessed in the second trench 267, and a recessed region 264 extending in the Y direction may remain at the second trench 267. The phase change layer 275 is connected to the arc-shaped bottom electrode 255 to minimize a contact area therebetween. As another example, the volume of the phase change layer 275 may be reduced by forming a spacer on an inner wall of at least one of the first and second trenches 262 and 267, which is identical or similar to the description in FIGS. 16B and 16C. As further another example, the first and second trenches 262 and 267 may be formed to have a wide top and a narrow bottom surface and thus the phase change layer 275 may taper down, which is identical or similar to the description in FIGS. 25B and 25C. As yet another example, the phase change layer 275 may be formed in, for example, a U-shape to decrease in volume, which is identical or similar to the description in FIGS. 21B and 21C.

Figure 32A:
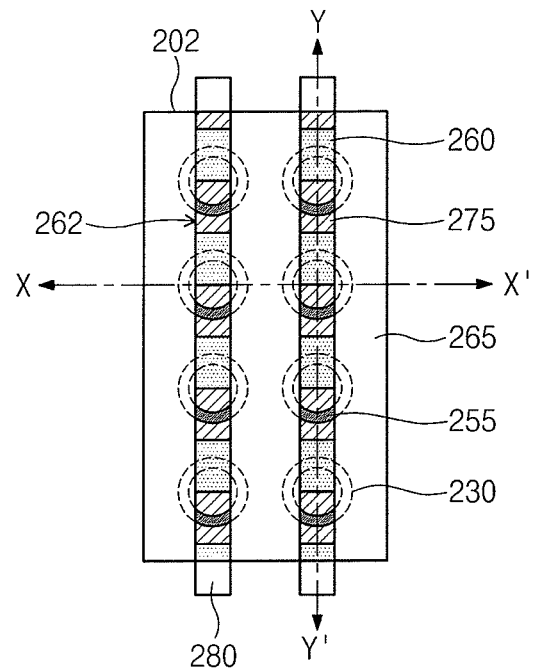
Figure 32B:
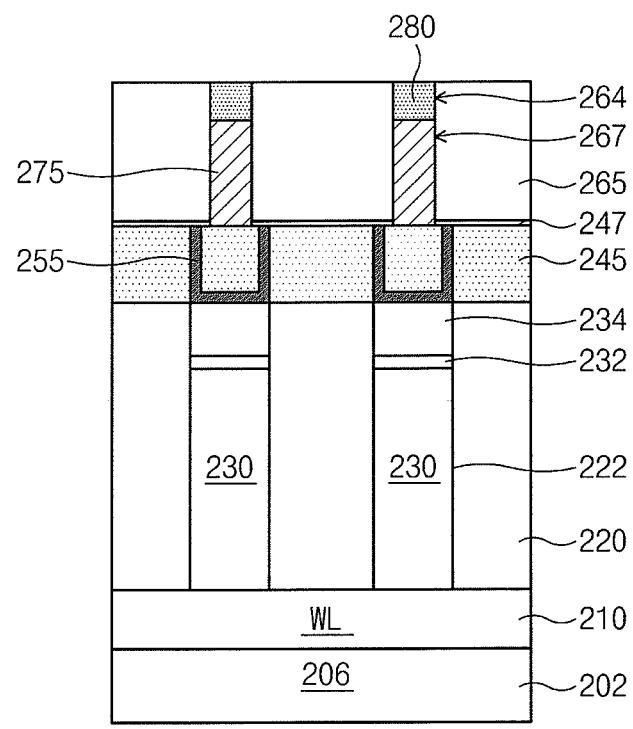
Figure 32C:
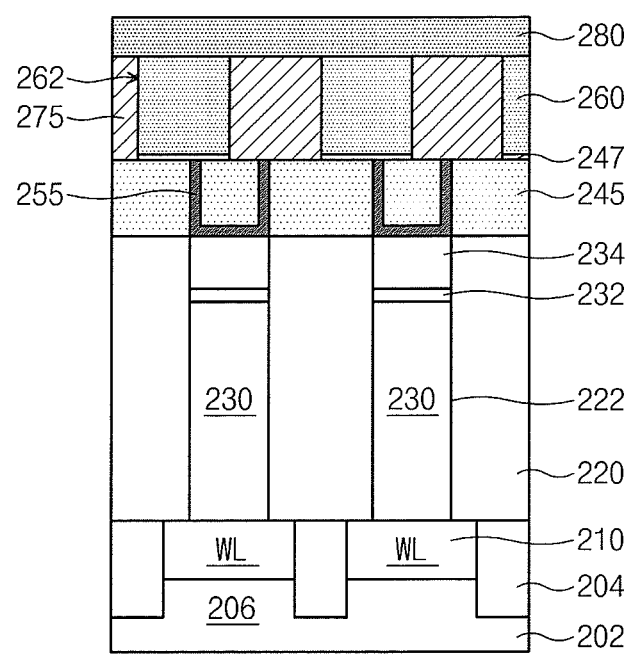

Referring to FIGS. 32A, 32B, and 32C, a top electrode 280 may be formed on the mold layer 265 to fill the recessed region 264 by, for example, depositing and planarizing a conductive material such as TiN. The top electrode 280 may be formed, for example, in the shape of line which is separated in the X direction but continuously extends in the Y direction.

Figure 33A:
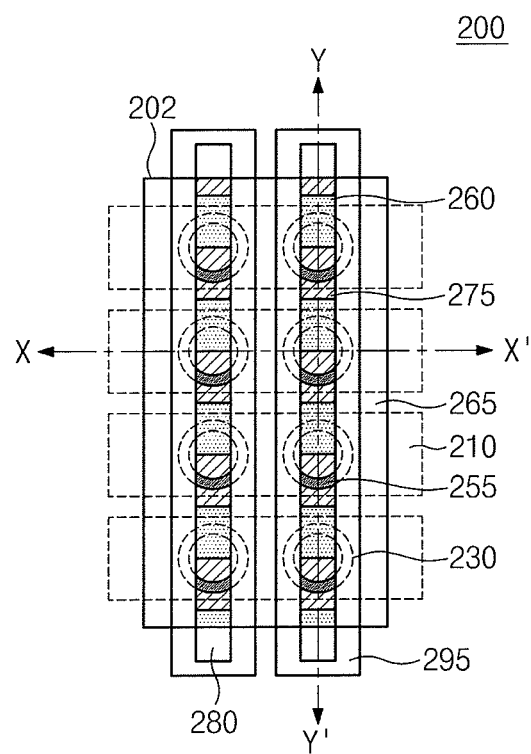
Figure 33B:
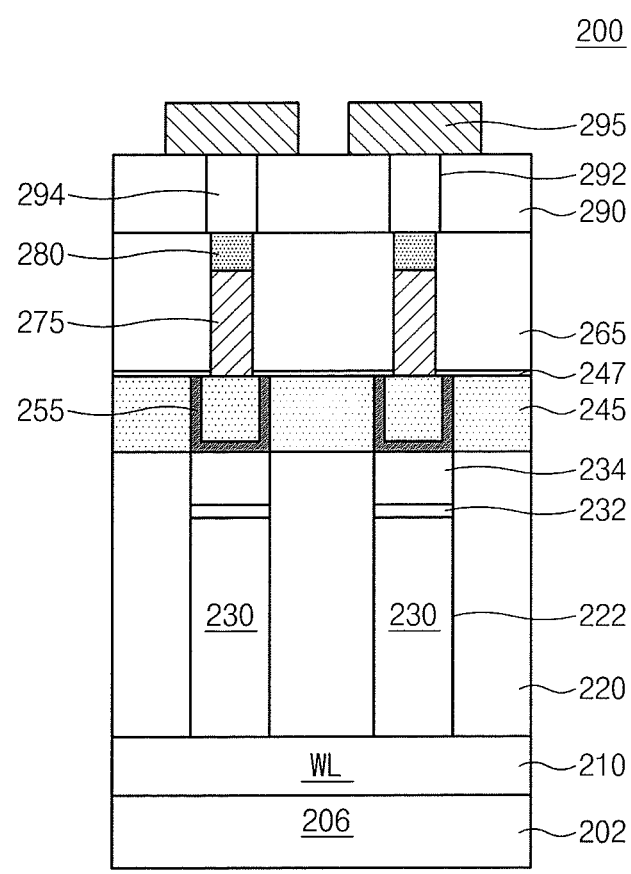
Figure 33C:
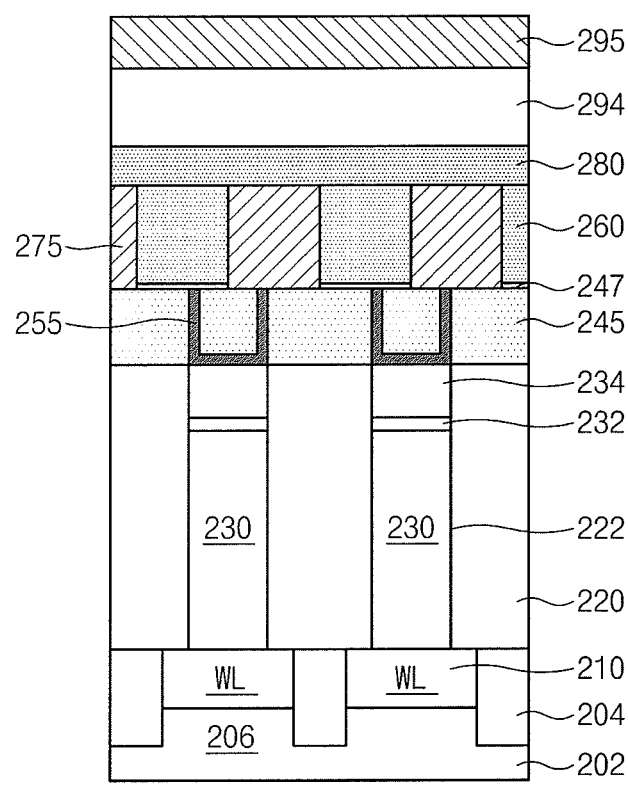

Referring to FIGS. 33A, 33B, and 33C, a bitline 295 electrically connected to the top electrode 280 may be formed at a cell structure formed through the series of processes to form a phase change memory device 200. For example, a third interlayer dielectric 290 is formed of an insulating material such as $SiO_2$ on mold layers 260 and 268, a via hole 292 is formed to expose the top electrode 280 through the third interlayer dielectric 290, a top electrode contact 294 is formed by filling the via hole 292 with a conductive material such as tungsten (W), and a metal is deposited and patterned on the third interlayer dielectric 190 to form a bitline 295 connected to the top electrode contact 294.

Figure 35A:
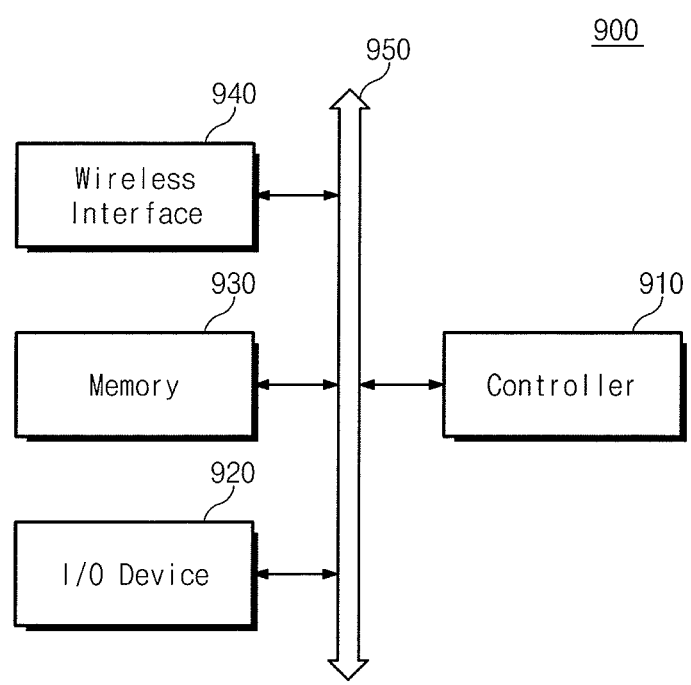
FIG. 35A is a block diagram of a system provided with a phase change memory device according to an embodiment of the inventive concept.

FIG. 35A is a block diagram of a system 900 provided with a phase change memory device according to an embodiment of the inventive concept.

Referring to FIG. 35A, the system 900 may be used in wireless communication devices, e.g., personal digital assistants (PDAs), laptop computers, personal computers, web tablets, wireless phones, cell phones, digital music players or all devices capable of transmitting and/or receiving information in wireless environments.

The system 900 may includes a controller 910, an input/output (I/O) device such as a keypad, a keyboard, and a display, a memory 930, and a wireless interface 940, which are connected to each other through a bus 950. The controller 910 may include at least one microprocessor, a digital signal processor, a microcontroller, or other similar devices. The memory 930 may be used to store a command executed by the controller 910. Also the memory 930 may be used to store user data. The memory 930 may further include other types of memories, random-accessible nonvolatile memories, and various other types of memories.

The system 900 may use the wireless interface 940 to transmit or receive data to or from a wireless communication network using an RF signal. For example, wireless interface 900 may include an antenna, a wireless transceiver, etc.

The system 900 may be used as a communication interface protocol such as, for example, a next-generation communication system, e.g., CDMA (Code Division Multiple Access), GSM (Global System for Mobile communication), NADC (North 20 American Digital Cellular), TDMA (Time Division Multiple Access), ETDMA (Extended TDMA), third-generation WCDMA (Wideband CDMA), CDMA-2000, etc. A phase change memory device according to an embodiment of the inventive concept may be applied to a memory card, which will be described below with reference to FIG. 35B.

Figure 35B:
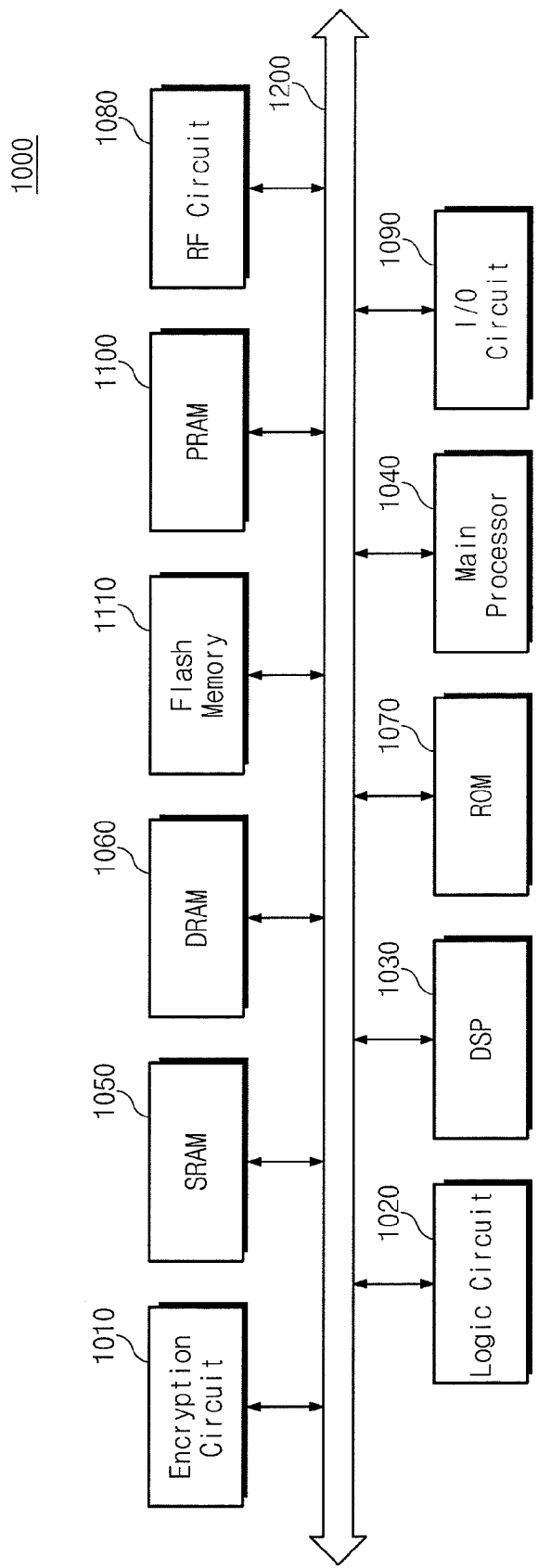
FIG. 35B is a block diagram illustrating an exemplary structure of a memory card to which a phase change memory device according to an embodiment of the inventive concept is applied.

Referring to FIG. 35B, a memory card 1000 according to an embodiment of the inventive concept may include an encryption circuit 1010, a logic circuit 1020, a digital signal process (DSP) 1030 that is a special purpose microprocessor, and a main processor 1040. Also the memory card 1000 may include a phase change memory device 1100 according to various embodiments of the inventive concept and other various types of memories, e.g., an SRAM 1050, a DRAM 1060, a ROM 1070, and a flash memory 1110. In addition, the memory card 1000 may include an RF (radio frequency/microwave) circuit 1080 and an input/output (I/O) circuit 1090. Function blocks 1020-1110 included in the memory card 1000 may be connected to each other through a system bus 1200. The memory card 1000 may operate in compliance with the control of an external host, and the PRAM 1100 according to an embodiment of the inventive concept may function to store data or output stored data in compliance with the control of a host.

As explained so far, a bottom electrode, a mold layer, and a phase change layer are formed in the shape of line. Thus, although misalignment occurs, area reduction of the bottom electrode can minimized to increase a misalignment margin and decrease dispersion of operating current. The volume of the phase change layer can be minimized to improve endurance characteristics. Since an insulating layer surrounding the bottom electrode and the phase change layer is formed of, for example, SiN, AlOx or the like which has relatively superior thermal conductivity, disturbance between cells can be minimized to achieve a phase change memory device having superior electrical characteristics. In addition, since a phase change layer can be formed below a limit of a photolithography, it can be readily applied to next-generation semiconductor products which continue to decrease in design rule.

While the inventive concept has been described with reference to exemplary embodiments, it is readily apparent apparent to those skilled in the art that various changes and modifications may be made without departing from the spirit and scope of the inventive concept which is defined by the metes and bounds of the appended claims.

What is claimed is:

1. A method for fabricating a phase change memory device, comprising:
    forming a plurality of bottom electrodes on a substrate, wherein the bottom electrodes are formed of a refractory metal, wherein the forming of the bottom electrodes comprises:
    patterning a conductive layer on a plurality of contact plugs connected to a plurality of diodes to form a spacer electrode having an L-shape or a step shape which contacts a portion of the contact plugs; and
    performing a trim pattern process on the spacer electrode to form the plurality of bottom electrodes having a linear plane defined on the diodes and an L-shape or a stepped shaped section connected to about half a top surface of the contact plugs;

forming a first mold layer on the substrate to extend in a first direction where the bottom electrodes are exposed;

forming a second mold layer on the substrate, the second mold layer extending in a second direction orthogonal to the first direction to expose parts of the bottom electrodes;

forming a phase change material layer on the first and second mold layers to be connected to the parts of the bottom electrodes;

dividing the phase change material layer into a plurality of phase change layers respectively connected to the parts of the bottom electrodes; and forming a plurality of top electrodes on the phase change layers.

2. The method as set forth in claim 1, wherein the forming of the first mold layer comprises:

forming a first insulating material layer on the substrate; and patterning the first insulating material layer to form a first trench extending in the first direction to expose the bottom electrodes, wherein the first trench exposes the plurality of bottom electrodes arranged in the first direction.

3. The method as set forth in claim 2, wherein the forming of the first insulating material layer comprises:

depositing silicon oxide (SiOx), silicon nitride (SiN), silicon oxynitride (SiON), silicon carbon nitride (SiCN), silicon carbide (SiC), carbon (C), titanium oxide (TiO), zirconium oxide (ZrOx), magnesium oxide (MgOx), hafnium oxide (HfOx), aluminum oxide (AlO$_x$) or a combination thereof on the substrate.

4. The method as set forth in claim 2, wherein the forming of the second mold layer comprises:

forming a second insulating material layer on the substrate; and patterning the second insulating material layer to form a second trench extending in the second direction to expose the parts of the bottom electrodes, wherein the second trench passes through the first mold layer and exposes the parts of the plurality of bottom electrodes arranged in the second direction.

5. The method as set forth in claim 4, wherein the forming of the second insulating material layer comprises:

depositing atomic layer deposition (ALD) SiO$_2$, TEOS (Tetra Ethyl Ortho Silicate) SiO$_2$, USG (Undoped Silicon Glass) SiO$_2$, PSG (P doped Silicon Glass) SiO$_2$, HDP (High Density Plasma) SiO$_2$, SOG (Silicon On Glass) SiO$_2$, PE (Plasma Enhanced) CVD SiO$_2$, PE (Plasma Enhanced) SiON, PE (Plasma Enhanced) SiN, FOx (Flowable oxide), PEOx (Polyethylene Oxide) or a combination thereof on the substrate where the first mold layer is formed.

6. The method as set forth in claim 4, wherein the second mold layer has a greater height than a height of the first mold layer.

7. The method as set forth in claim 4, wherein the forming of the phase change material layer comprises:

depositing a phase change material on the first and second mold layers to fill the first and second trenches with the phase change material, wherein the phase change material layer has a continuous shape on the first and second mold layer without separation.

8. The method as set forth in claim 7, wherein the forming of the phase change material layers comprises:

forming the phase change material layer having a continuous shape as a plurality of separated first phase change material patterns to respectively correspond to the bottom electrodes; and partially removing the first phase change material patterns to form the phase change layers in a recessed shape in the first and second trenches, wherein the forming of the first phase change material patterns comprises:

planarizing the phase change material layer and the second mold layer down to a top surface of the first mold layer to divide the phase change material layer into the first phase change material patterns.

9. The method as set forth in claim 8, wherein the forming of the top electrodes comprises:

depositing a conductive material layer on the first mold layer and the planarized second mold layer; and patterning the conductive material layer to form the top electrodes on the recessed phase change layers in a self-aligned fashion.

10. The method as set forth in claim 7, wherein the forming of the phase change layers comprises:

planarizing the phase change material layer having a continuous shape to form a plurality of first phase change material patterns which are separated in the first direction but has a shape of line continuously extending in the second direction; and partially removing the first phase change material patterns to be divided into a plurality of first phase change material patterns corresponding to the bottom electrodes in one-to-one correspondence and to form a plurality of phase change layers recessed in the second trench.

11. The method as set forth in claim 10, wherein the forming of the first phase change material patterns comprises:

planarizing the phase change material down to a top surface of the second mold layer without exposure of the first mold layer to divide the phase change material layer into the first phase change material patterns.

12. The method as set forth in claim 11, wherein the forming of the top electrodes comprises:

depositing a conductive material layer on the first and second mold layers; and patterning the conductive material layer to form the top electrodes on the recessed phase change layers in a self-aligned fashion, wherein the top electrodes are formed in the shape of line connected to the plurality of phase change layers arranged in the second direction.

13. The method as set forth in claim 4, further comprising before forming the first mold layer:

forming an etch-stop layer on the substrate, wherein when the second trench is formed, of the etch-stop layer, portions formed at lower portions of the first and second trenches are removed to expose the parts of the bottom electrodes through the first and second trenches.

14. The method as set forth in claim 4, further comprising:

forming a spacer on an inner wall of at least one of the first and second trenches.

15. The method as set forth in claim 4, wherein at least one of the first and second trenches is formed to have a wide top and a narrow bottom surface.

16. A method for fabricating a phase change memory device, comprising:
  forming a plurality of bottom electrodes on a substrate, wherein the bottom electrodes are formed of a refractory metal, wherein the forming of the bottom electrodes comprises:
    patterning a conductive layer on a plurality of contact plugs connected to a plurality of diodes to form a spacer electrode having an L-shape or a step shape which contacts a portion of the contact plugs; and
    performing a trim pattern process on the spacer electrode to form the plurality of bottom electrodes having a linear plane defined on the diodes and an L-shape or a stepped shaped section connected to about half a top surface of the contact plugs;
  forming an isolation mold layer on the substrate to extend in parallel with the bottom electrodes;
  forming a plurality of trenches to pass through the isolation mold layer and selectively expose parts of the bottom electrodes;
  forming a phase change material pattern to fill the trenches, the phase change material pattern extending in the first direction to be connected to the parts of the bottom electrodes;
  dividing the phase change material pattern to form a plurality of phase change layers respectively in direct physical contact with the parts of the bottom electrodes exposed by the isolation mold layer; and
  forming a plurality of top electrodes on the phase change layers in a self-aligned fashion.

17. The method as set forth in claim 16, wherein the forming of the trenches comprises:
  forming a phase change mold layer on the substrate to pass through the isolation mold layer and extend in a second direction orthogonal to the first direction; and
  patterning the phase change mold layer to form the trenches extending in the second direction.

18. The method as set forth in claim 17, wherein the forming of the phase change layers comprises:
  depositing a phase change material layer on the isolation mold layer and the phase change mold layer to fill the trench; and
  planarizing the phase change material layer such that each of the phase change layers has a recessed shape to be lower than at least one of the isolation mold layer and the phase change mold layer.

19. The method as set forth in claim 18, wherein the forming of the top electrodes comprises:
  planarizing the phase change material layer to form the phase change layers;
  recessing the phase change layers to form recessed regions at the trenches; and
  forming the top electrodes at the recessed regions,
  wherein the top electrodes are formed in one of the shape of an island corresponding to the phase change layers in one-to-one correspondence or in the shape of a plurality of lines extending in the second direction.

20. A method for fabricating a phase change memory device, comprising:
  forming a first interlayer dielectric on a semiconductor substrate having a plurality of wordlines formed thereon;
  forming a plurality of through holes in the first interlayer dielectric exposing the word lines;
  forming diodes on each of the word lines and contact plugs on each of the diodes in each of the through holes of the first interlayer dielectric;
  forming a first insulating layer having a first opening on the first interlayer dielectric to expose the contact plugs;
  sequentially forming a conductive layer and a second insulating layer on the first insulating layer;
  patterning the conductive layer to form a spacer electrode having an L-shape or a step shape which contacts a portion of the contact plugs;
  performing a trim pattern process on a the spacer electrode to form a plurality of bottom electrodes having a linear plane defined on the diodes and an L-shape or a stepped shaped section connected to about half a top surface of the contact plugs and forming a plurality of openings between the bottom electrodes exposing the first insulating layer;
  filling the openings between the bottom electrodes with an insulating material to form a third insulating layer between the plurality of bottom electrodes;
  forming an etch stop layer on the first, second and third insulating layers and the bottom electrodes;
  forming a first mold layer in between the bottom electrodes in the shape of a line and including a first trench formed therein and extending in a first direction;
  forming a second mold layer on the semiconductor substrate crossing the first mold layer and including a second trench formed therein which exposes the bottom electrodes and extending in a second direction orthogonal to the first direction;
  conformally forming phase change material layers along profiles of the first trench and the second trench;
  depositing a gap-fill insulating layer on the phase change material layers;
  planarizing the phase change material layers and the gap-fill insulating layer to form a plurality of planarized phase change material patterns;
  recessing the phase change material patterns to form phase change layers having a U-shape and recessed regions at the first and second trenches; and
  forming top electrodes at the recessed regions in a self-aligned fashion with respect to the phase change layers having a U-shape.

21. The method as set forth in claim 1, wherein the bottom electrodes comprise a material selected from the group consisting of titanium nitride (TiN), titanium silicon nitride (TiSiN), titanium aluminum nitride (TiAlN), tantalum silicon nitride (TaSiN), tantalum aluminum nitride (TaAlN), tantalum nitride (TaN), tungsten silicide (WSi), tungsten nitride (WN), titanium tungsten (TiW), molybdenum nitride (MoN), niobium nitride (NbN), titanium boron nitride (TiBN), zirconium silicon nitride (ZrSiN), tungsten silicon nitride (WSiN), tungsten boron nitride (WBN), zirconium aluminum nitride (ZrAlN), molybdenum aluminum nitride (MoAlN), titanium aluminum (TiAl), titanium oxynitride (TiON), titanium aluminum oxynitride (TiAlON), tungsten oxynitride (WON), tantalum oxynitride (TaON) or a combination thereof.

22. The method as set forth in claim 1, wherein an uppermost surface of the top electrodes is substantially level with an uppermost surface of the first mold layer and the second mold layer.

* * * * *